United States Patent
Imada

(10) Patent No.: US 11,367,816 B2
(45) Date of Patent: Jun. 21, 2022

(54) SURFACE EMITTING LIGHT SOURCE

(71) Applicant: NICHIA CORPORATION, Anan (JP)

(72) Inventor: Mamoru Imada, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/944,117

(22) Filed: Jul. 30, 2020

(65) Prior Publication Data
US 2021/0320087 A1    Oct. 14, 2021

(30) Foreign Application Priority Data

Nov. 29, 2019 (JP) .............................. JP2019-216833

(51) Int. Cl.
*H01L 33/58* (2010.01)
*H01L 25/075* (2006.01)
*H01L 33/60* (2010.01)
*H01L 33/62* (2010.01)

(52) U.S. Cl.
CPC .......... *H01L 33/58* (2013.01); *H01L 25/0753* (2013.01); *H01L 33/60* (2013.01); *H01L 33/62* (2013.01); *H01L 2933/0058* (2013.01); *H01L 2933/0066* (2013.01)

(58) Field of Classification Search
CPC ..... H01L 25/0753; H01L 33/58; H01L 33/60; H01L 2933/0058
See application file for complete search history.

(56) References Cited

U.S. PATENT DOCUMENTS

| | | | |
|---|---|---|---|
| 2006/0152931 A1* | 7/2006 | Holman | G02B 27/0994 362/297 |
| 2006/0158899 A1 | 7/2006 | Ayabe et al. | |
| 2011/0038150 A1* | 2/2011 | Woodgate | G02B 19/0066 362/235 |
| 2012/0069575 A1 | 3/2012 | Koh et al. | |
| 2014/0160733 A1 | 6/2014 | Ono et al. | |
| 2019/0294004 A1 | 9/2019 | Hashimoto | |

(Continued)

FOREIGN PATENT DOCUMENTS

| | | |
|---|---|---|
| JP | H10-82915 A | 3/1998 |
| JP | 2006222413 A | 8/2006 |

(Continued)

*Primary Examiner* — Feifei Yeung Lopez
(74) *Attorney, Agent, or Firm* — Hunton Andrews Kurth LLP

(57) ABSTRACT

A surface-emitting light source includes a plurality of light-emitting regions each of which includes light sources, wherein each of the plurality of light-emitting regions can be turned on individually. Each of the light-emitting regions is adjacent to each other and includes a light-guide portion that is provided in adjacent light-emitting regions and covers the light sources, and a light-reflective member disposed below the light-guide portion. The light-reflective member has a first wall portion disposed at the outer periphery of each of the light-emitting regions. The first wall portion includes one or more unit first wall portions each of which corresponds to a respective one of the light sources located at the outer periphery of each of the light-emitting regions. The unit first wall portion located at the two adjacent light-emitting regions has a central portion having a height smaller than a height of both end portions.

12 Claims, 72 Drawing Sheets

(56) References Cited

U.S. PATENT DOCUMENTS

2019/0294005 A1 9/2019 Imada et al.
2020/0049877 A1 2/2020 Watanabe et al.

FOREIGN PATENT DOCUMENTS

| JP | 2009176437 A | 8/2009 |
|----|--------------|--------|
| JP | 2018055847 A | 4/2018 |
| JP | 2018101521 A | 6/2018 |
| JP | 2019012681 A | 1/2019 |
| JP | 2019175846 A | 10/2019 |
| JP | 2019175847 A | 10/2019 |
| WO | 2013011752 A1 | 1/2013 |

* cited by examiner

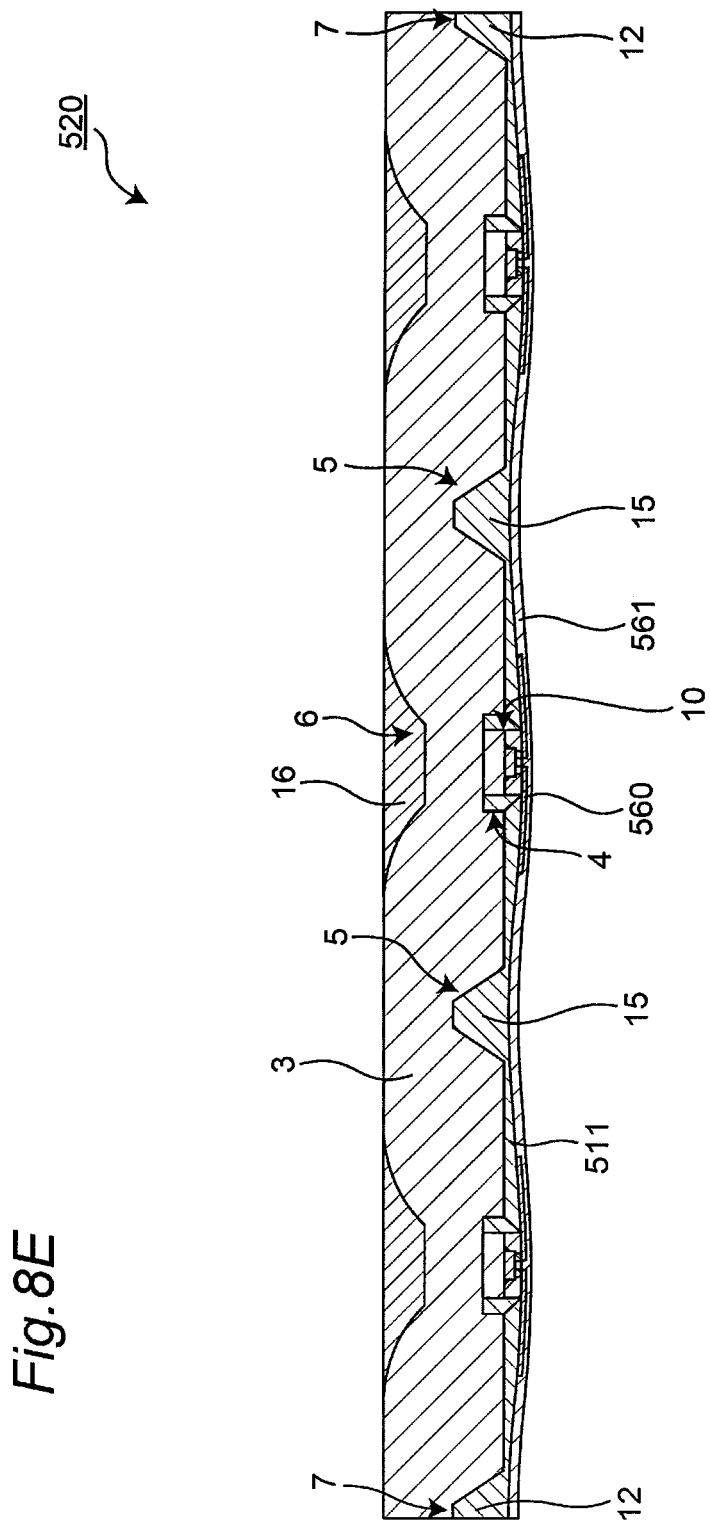

SURFACE EMITTING LIGHT SOURCE

CROSS-REFERENCE TO RELATED APPLICATION

This application claims priority to Japanese Patent Application No. 2019-216833, filed on Nov. 29, 2019, the disclosure of which is hereby incorporated by reference in its entirety.

BACKGROUND

The present disclosure relates to a surface-emitting light source.

A direct-type surface-emitting light source having a structure in which a plurality of light-emitting elements are arranged is known as a backlight light source for displays of personal computers, tablet devices, and the like. Among direct-type surface-emitting light sources, a surface-emitting light source has been developed in which a light-emitting surface is divided into a plurality of light-emitting regions and turning on/off of each light-emitting region is individually controlled (see, for example, Japanese Unexamined Patent Application Publication No. 2018-101521).

SUMMARY

The planer light source device of Japanese Unexamined Patent Application Publication No. 2018-101521 includes light-emitting regions each of which includes a light source at the center, and grooves each of which is formed at outer edges of the light-emitting region on a lower surface of the light guide plate. Inside the groove, for example, a reflective layer is formed. With such a groove, contrast ratio due to light leakage between the light-emitting regions may not be decreased. However, due to total reflection at the upper surface of the light guide plate, some components of the light may enter into adjacent light-emitting regions. Light that is incident on the light-emitting region in which the light source is turned off, is reflected repeatedly inside the region and is emitted to outside the light-emitting region. The light emitted to outside the light-emitting region includes the light reflected at the groove that surrounds the turned-off light source. The reflected light may cause sudden luminance change in an image, resulting in unclear display on the screen.

An object of certain embodiments of the present disclosure is to provide a surface-emitting light source in which sudden luminance change caused by the light leaking from the lighting region to the adjacent non-lighting regions can be prevented.

In order to achieve the above object, a surface-emitting light source according to an embodiment of the present disclosure includes a plurality of light-emitting regions each of which includes a plurality of light sources, wherein each of the plurality of light-emitting regions can be turned on individually. Each of the light-emitting regions is adjacent to each other and includes a light-guide portion that covers the plurality of light sources, and a light-reflective member disposed below the light-guide portion. The light-reflective member has a first wall portion disposed at an outer periphery of each of the plurality of light-emitting regions. The first wall portion comprising one or more unit first wall portions each of which corresponds to a respective one of the plurality of light sources located at the outer periphery of each of the plurality of light-emitting regions. The unit first wall portion located at two adjacent light-emitting regions has a central portion having a height smaller than a height of both end portions.

The surface-emitting light source according to certain embodiments of the present disclosure, in which sudden luminance change caused by the light leaking from the lighting region to the adjacent non-lighting region can be reduced.

BRIEF DESCRIPTION OF THE DRAWINGS

FIG. 8E is a schematic cross-sectional view of light-emitting regions of a surface-emitting light source according to an embodiment.

DETAILED DESCRIPTION OF EMBODIMENTS

Figure 1:
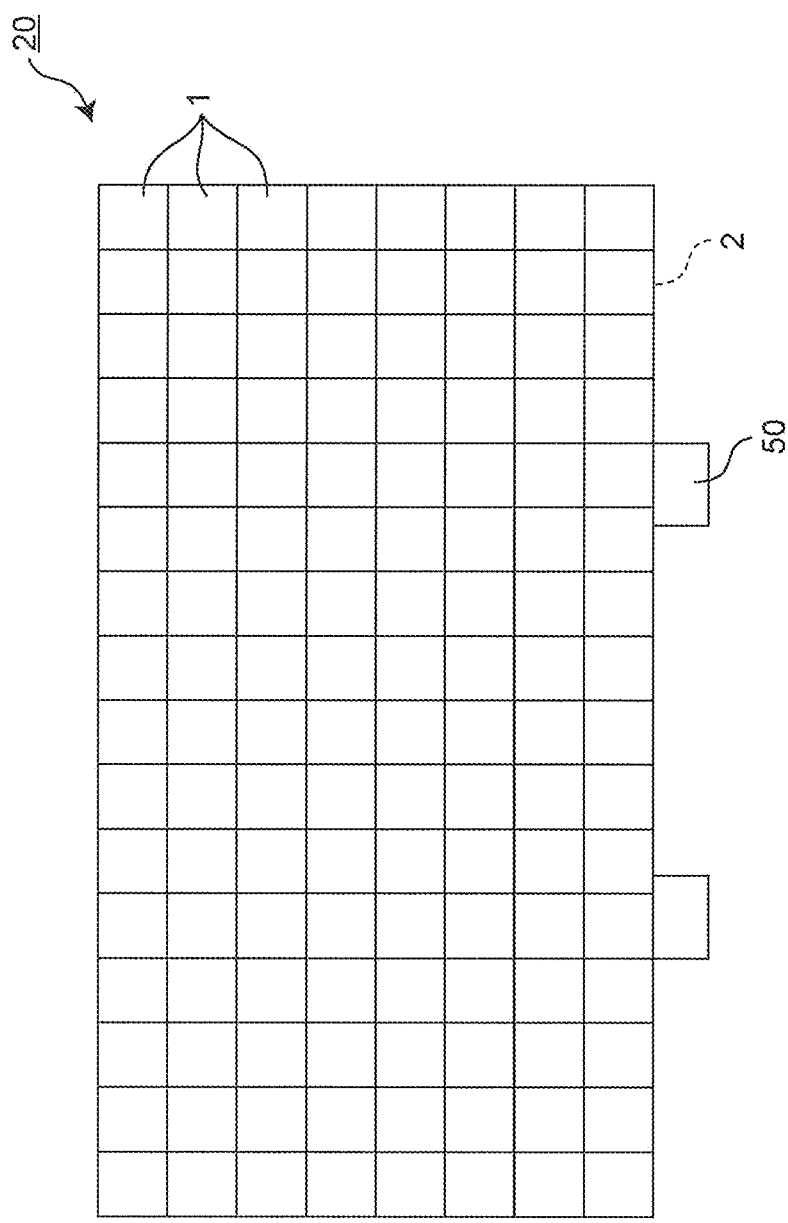
FIG. 1 is a schematic view of a surface-emitting light source according to an embodiment of the present disclosure.

Certain embodiments and examples of the present disclosure will be described below with reference to the drawings. The surface-emitting light source described below is intended to embody the technical concept of the present disclosure and is not intended to limit the present disclosure to the embodiments below unless specifically stated otherwise.

In the drawings, the same reference numeral may represent a member having the same functions. Embodiments and examples may be described separately for convenience of descriptions of key points and easiness of understanding; however, components shown in different embodiments and examples may be partially replaced or combined. In the embodiments and the examples below, the descriptions common to the previous descriptions are not repeated and only different points are described. In particular, the same effects to be obtained by the same configurations will not be described for each embodiment and example. Sizes, positional relationships, or the like of components illustrated in the drawings may be exaggerated in order to clarify the descriptions.

A surface-emitting light source according to the present embodiment includes a plurality of light-emitting regions each of which includes a plurality of light sources, wherein each of the plurality of light-emitting regions can be turned on individually. Each of the light-emitting regions is adjacent to each other and includes a light-guide portion that covers the plurality of light sources, and a light-reflective member below the light-guide portion. The light-reflective member has a first wall portion disposed at the outer periphery of each of the plurality of light-emitting regions. The first wall portion comprises a plurality of unit first wall portions each of which corresponds to a respective one of the plurality of light sources located at the outer periphery of each light-emitting region. The unit first wall portion may have a central portion having a height smaller than a height of both end portions.

In the surface-emitting light source according to the present embodiment, wall portions are divided into unit wall portions in association with the light sources located at the outer periphery of the light-emitting region. The central portion of the unit wall portion is close to the light source disposed at the outer periphery of the light-emitting region and intensely receives light emitted from the light source. With the central portion having a height smaller than the height of both end portions of the unit wall portion, the sufficient amount of front light from the lighting region can be obtained compared with the case in which the height of the wall portion is uniformly small. This structure can also reduce unevenness in luminance of the light leakage form the lighting region to the adjacent light-emitting region.

The surface-emitting light source and a method of manufacturing the surface-emitting light source according to the present embodiment will be described below with reference to the drawings.

Embodiment

Surface-Emitting Light Source

As shown in FIG. 1, a surface-emitting light source 20 according to the present embodiment includes a plurality of light-emitting regions 1 adjacent to each other and disposed on a wiring board 2 in a matrix shape of n rows and m columns. The wiring board 2 includes terminals 50 to be connected to a power supply and wirings to be connected to light-emitting elements 34 in the light-emitting regions 1. The surface-emitting light source 20 is turned on by using electric power supplied from the power supply via the terminals 50 and wirings of the wiring board 2. In the surface-emitting light source 20, a surface opposite to the surface on which the wiring board 2 is provided serves as a light-emitting surface. A flexible board may preferably be used for the wiring board 2.

For example, a diffusion sheet and a prism sheet are disposed on the light-emitting surface of the surface-emitting light source 20, and, for example, an adhesive layer or a non-adhesive layer and a back chassis are disposed on the wiring board 2, so that a backlight unit is obtained.

Configurations of the light-emitting regions 1 in the surface-emitting light source 20 according to the present embodiment will be described in detail below with reference to FIGS. 2 to 6D. In the drawings, reference numerals representing a member having the same structures may be omitted. In particular, in FIG. 2, in order to facilitate understanding of the drawings, reference numerals for a first wall portion, a unit first wall portion, a second wall portion, and a unit second wall portion are attached in a third unit mounting region 1C, a fourth unit mounting region 1D, a fifth unit mounting region 1G, and a sixth unit wall portion 1H. However, the reference numerals for the above wall portions may be attached in other unit mounting regions in the same manner.

Light-Emitting Region

Figure 2:
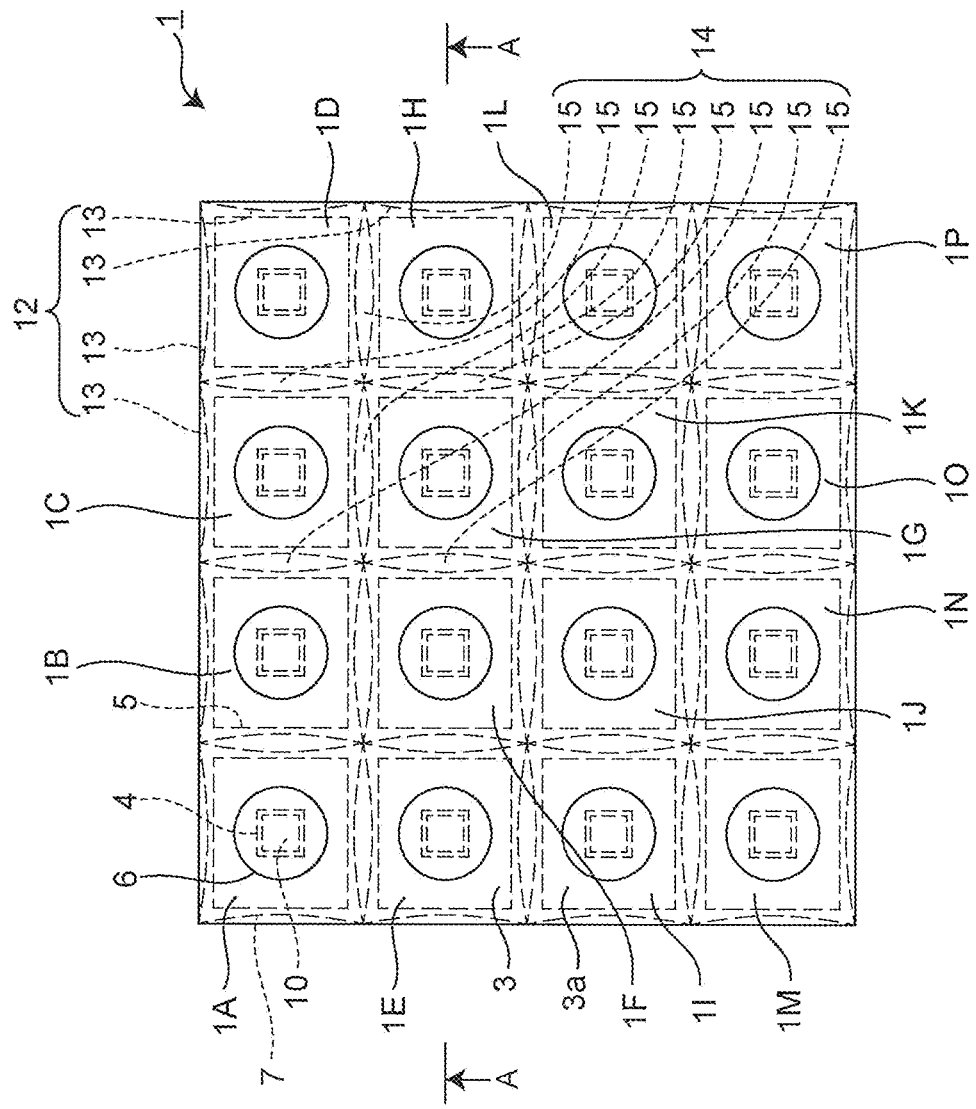
FIG. 2 is a schematic top view of a light-emitting region in the surface-emitting light source shown in FIG. 1.
Figure 3:
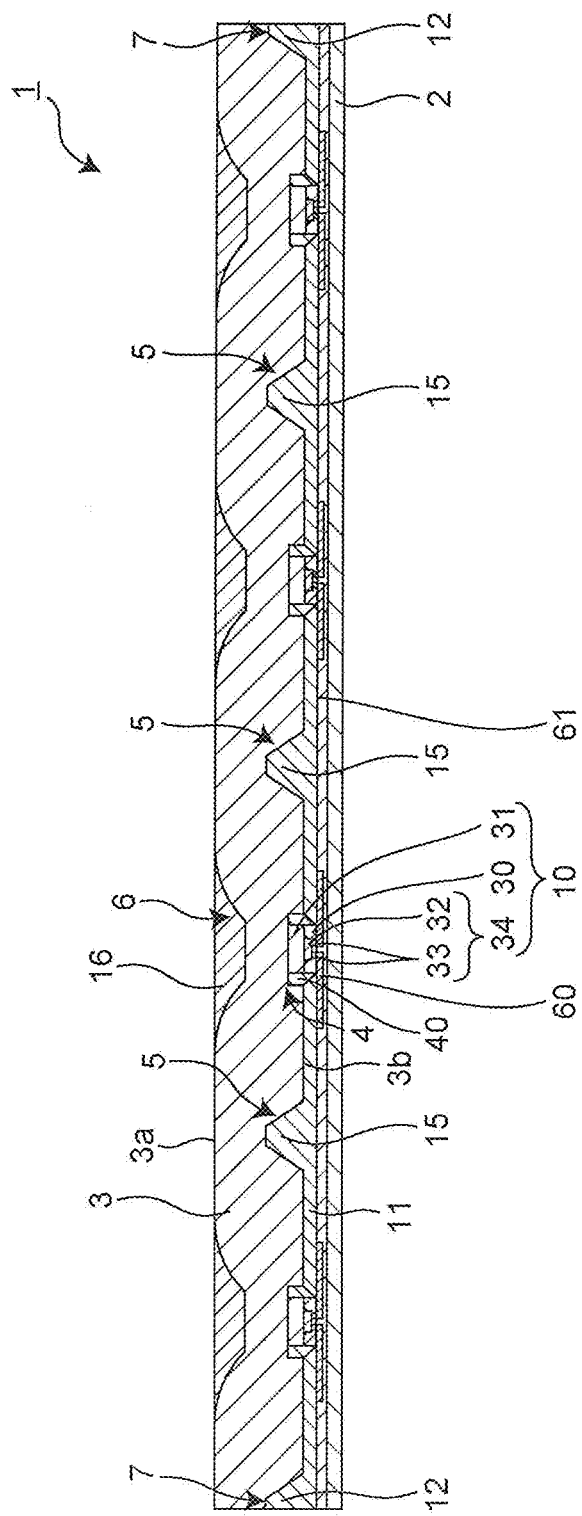
FIG. 3 is a schematic cross-sectional view of the light-emitting region taken along a line A-A of FIG. 2.
Figure 6A:
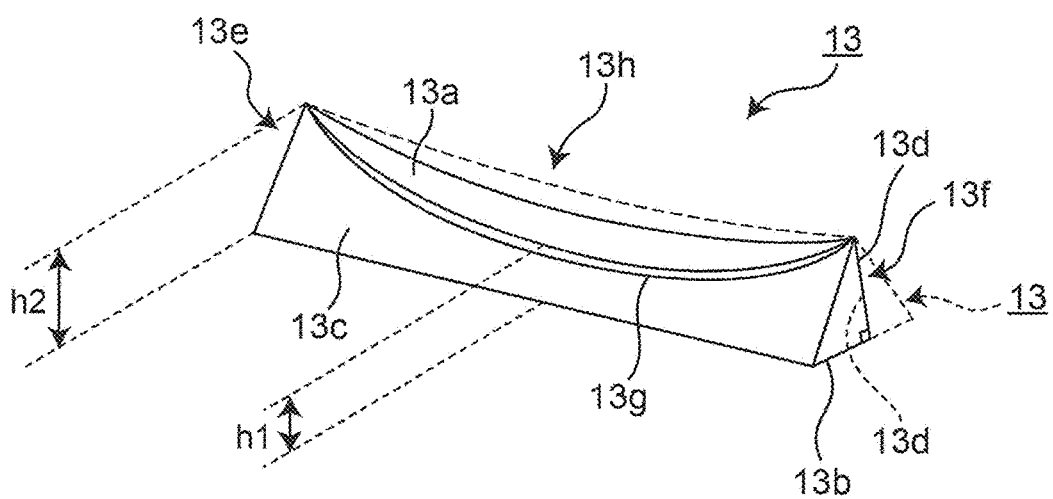
FIG. 6A is a schematic perspective view of a unit first wall portion in the light-emitting region shown in FIG. 2.

As shown in FIG. 2, the light-emitting region 1 according to the present embodiment includes a first unit mounting region 1A to a sixteenth unit mounting region 1P disposed in a matrix of four rows and four columns. Each of the first unit mounting region 1A to the sixteenth unit mounting region 1P has a rectangular shape in a top view. Each of the unit mounting regions includes a light source 10 at the center. Therefore, each of the light-emitting regions includes 16 light sources 10. The 16 light sources 10 in each light-emitting region are collectively controlled for turning on and off, so that each light-emitting region can be individually turned on. As shown in FIGS. 2 and 3, each light-emitting region further includes a light-guide portion 3 to cover the 16 light sources 10, and a light-reflective member 11 disposed on a lower surface 3b of the light-guide portion 3. The light-reflective member 11 includes a first wall portion 12 disposed along an outer periphery of the light-emitting region and a second wall portion 14 located between the light sources 10 each in a respective one of the unit mounting regions. The first wall portion 12 may include a plurality of unit first wall portions 13 each of which includes a central portion 13$h$ having a height smaller than the height of both end portions 13$e$ and 13$f$ as shown in FIG. 6A.

For the surface-emitting light source 20 of the present embodiment, an example of a light-emitting region having 16 unit mounting regions is described. However, in the present disclosure, the number of unit mounting regions in a light-emitting region is not limited to 16 and may be set to one or more.

Light-Guide Portion

As shown in FIGS. 2 and 3, the light-guide portion 3 is a thin plate-like member having an upper surface 3$a$ and a lower surface 3$b$ opposite to the upper surface 3$a$. Examples of materials for the light-guide portion 3 include thermoplastic resins such as acrylic resins, polycarbonates, cyclic polyolefins, polyethylene terephthalate, and polyesters, thermosetting resins such as epoxies and silicones, and glass.

In the surface-emitting light source 20 according to the present embodiment, the light-guide portion 3 is separated for each light-emitting region 1, and two light-emitting regions 1 adjacent to each other have respective light-guide portions 3 disposed in contact with each other. However, a structure of the light-guide portion 3 is not limited to this. The light-guide portion may be formed of a light guide plate that covers a plurality of light-emitting regions 1, or may be formed of a single light guide plate that covers all of the light-emitting regions 1 in the surface-emitting light source 20.

The lower surface 3$b$ of the light-guide portion 3 includes 16 first recesses 4 each disposed at the center of a respective one of the unit mounting regions 1A to 1P, fourth recesses 7 surrounding the 16 first recesses 4 and disposed along the outer periphery of the light-emitting region 1, and second recesses 5 to identify the 16 unit mounting regions 1A to 1P.

The fourth recess 7 is formed to dispose the first wall portion 12 of the light-reflective member 11. This allows the fourth recess 7 to have a shape corresponding to the shape of the first wall portion 12 of the light-reflective member 11, which will be described below.

The second recess 5 is formed to dispose the second wall portion 14 of the light-reflective member 11. This allows the second recess 5 to have a shape corresponding to the shape of the second wall portion 14 of the light-reflective member 11, which will be described below. The second recess 5 is formed along each of the sides of the unit mounting region, disposed across the unit mounting regions adjacent to each other, and communicates with the fourth recess 7.

Figure 5:
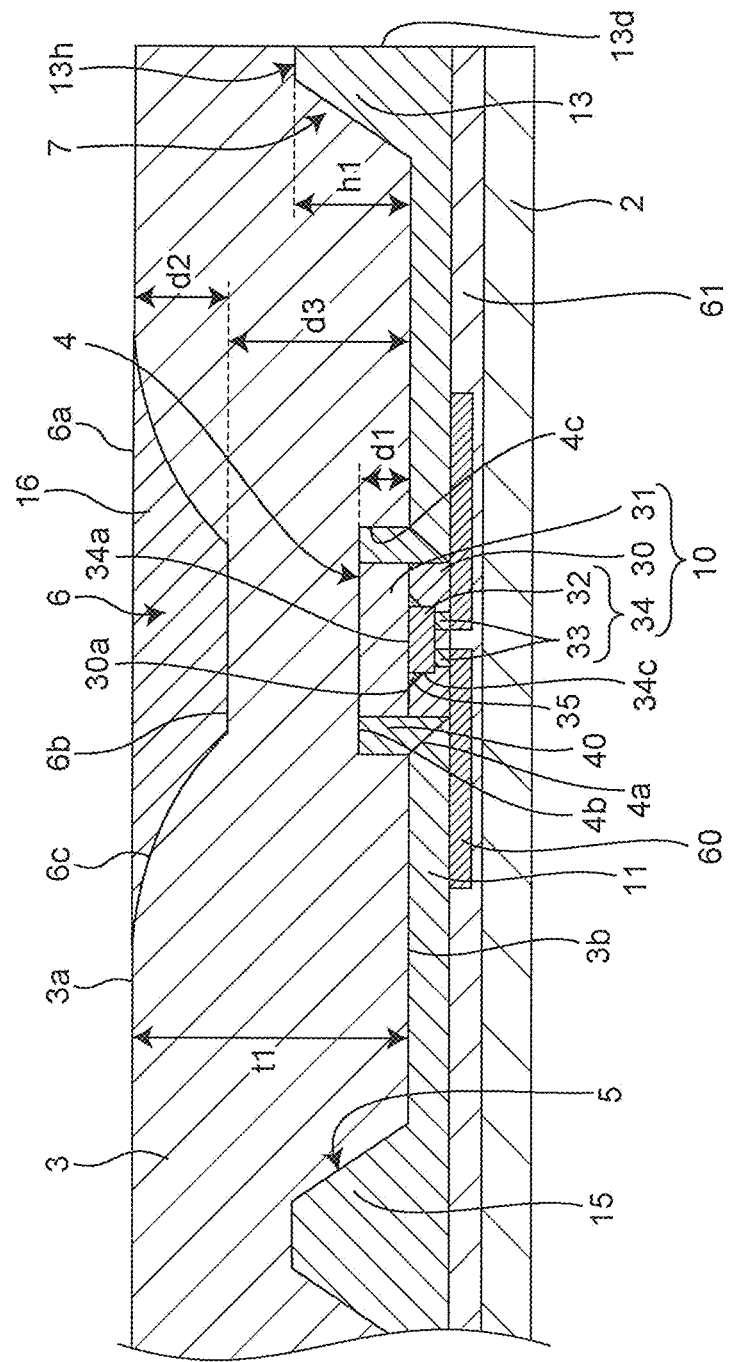
FIG. 5 is a schematic enlarged view of a portion of the cross-sectional view shown in FIG. 3.

The first recess 4 is formed to dispose the light source 10. As shown in FIG. 5, the first recess 4 has a rectangular parallelepiped shape that includes an opening 4$a$ having a rectangular shape, a bottom surface 4$b$ having a rectangular shape parallel to the lower surface 3$b$ of the light-guide portion 3, and lateral surfaces 4$c$.

The upper surface 3$a$ of the light-guide portion 3 includes four third recesses 6 each of which faces a respective one of the first recesses 4. The third recess 6 includes an opening 6$a$ having a circular shape, a bottom portion 6$b$ having a planer circular shape, and a lateral surface 6$c$. As shown in FIG. 5, the opening 6$a$ has a larger radius than the radius of the bottom portion 6$b$. That is, the third recess 6 is tapered from the opening 6$a$ toward the bottom portion 6$b$. Further, as shown in a top view of FIG. 2, the opening 6$a$ of the third recess 6 has an outer shape surrounding the outer shape of the bottom surface 4$b$ of the first recess 4. The sum of the depth $d_2$ of the third recess 6 and the depth $d_1$ of the first recess 4 is smaller than the thickness $t_1$ of the light-guide portion 3, and the third recess 6 does not communicate with the first recess 4.

In the third recess 6, a light-reflective layer 16 is disposed. With the light-reflective layer 16 disposed in the third recess 6, an irradiation direction of light emitted directly upward from the light source 10 can be expanded along the outer shape of the third recess 6 in which the opening 6$a$ is larger than the bottom portion 6$b$. This allows an irradiation region of each light source 10 to be expanded, so that unevenness in irradiation intensity on the display irradiated with light emitted from the light-emitting region 1 can be reduced. That is, the shape of the third recess 6, the light-shielding property of the light-reflective layer 16, the thickness of the light-guide portion 3, and the like are set such that uniform irradiation intensity on the display irradiated with light emitted from the light-emitting region 1 can be obtained.

Figure 4:
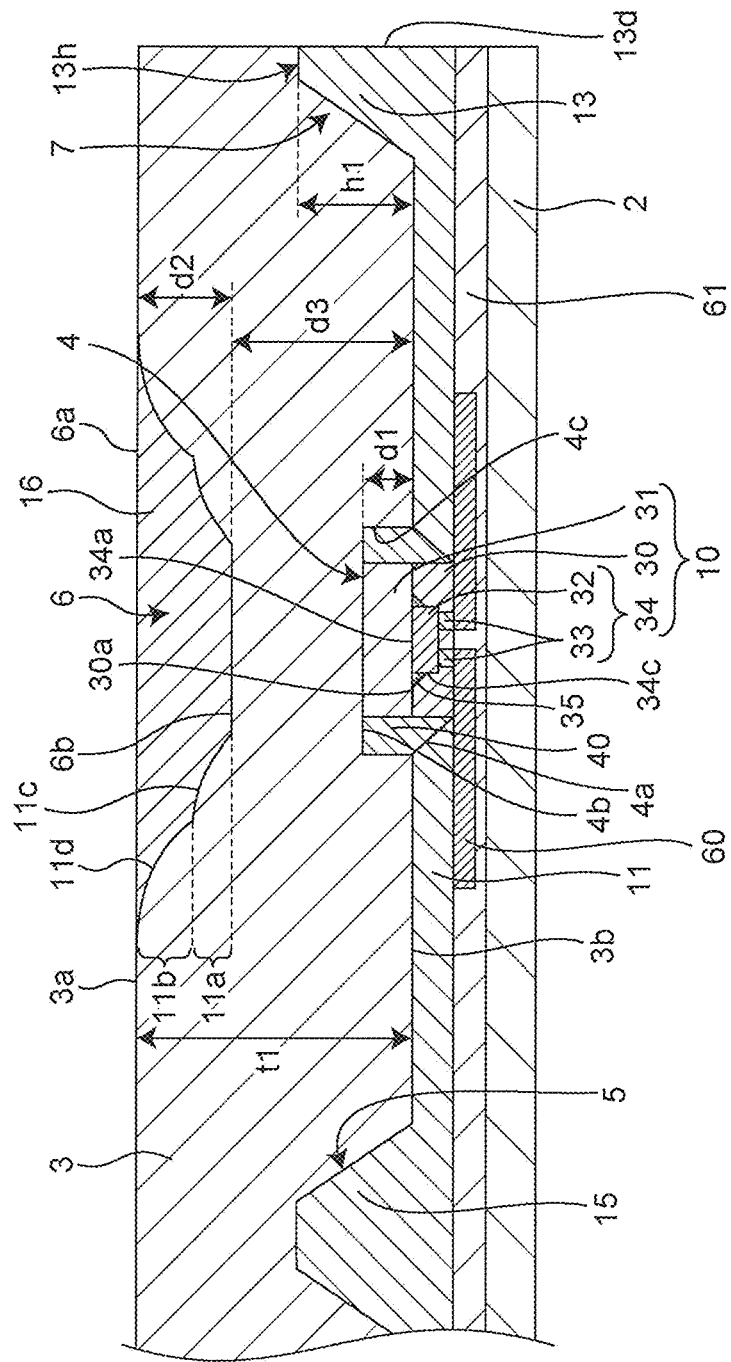
FIG. 4 is a schematic cross-sectional view of a light-emitting region of a surface-emitting light source according to an embodiment.

The structure of the third recess is not limited to the example described above. The light-guide portion 3 may include the third recess having another shape. For example, as shown in FIG. 4, the third recess 6 may include, for example, a first portion 11$a$ having a truncated cone shape and a second portion 11$b$ having a truncated cone shape. The first portion 11$a$ has a bottom surface in the truncated cone shape in contact with the upper surface of the second portion 11$b$ in the truncated cone shape. In the configuration shown as an example in FIG. 4, the third recess 6 includes the first portion 11$a$ having a first lateral surface 11$c$ and the second portion 11$b$ having a second lateral surface 11$d$. The first lateral surface 11$c$ and the second lateral surface 11$d$ have curved shapes in a cross-sectional view. In the third recess 6, the light-reflective layer 16 is located at the first portion 11$a$ that is closer to the light source 10.

Light Source

The light source 10 has an outer shape of substantially rectangular parallelepiped and emits light mainly from the upper surface. As shown in FIG. 5, the light source 10 includes a light-emitting element 34, a second light-reflective member 30, and a light-transmissive member 31. The light-emitting element 34 includes a semiconductor layered body 32 and a pair of electrodes 33 to supply electricity to the semiconductor layered body 32. The second light-reflective member 30 is disposed to cover lateral surfaces 34$c$ of the light-emitting element 34. The light-transmissive member 31 is disposed to cover an upper surface 34$a$ of the light-emitting element 34 and an upper surface of the second light-reflective member 30. Hence, the light-transmissive member 31 has the outer shape larger than the outer shape of the light-emitting element 34 in a top view. A light-transmissive adhesive material 35 may be disposed between at least a portion of the lateral surfaces 34$c$ of the light-emitting element 34 and the second light-reflective member 30. With the light-transmissive adhesive material 35, the light emitted laterally from the semiconductor layered body 32 is incident on the light-transmissive adhesive material 35, reflected at a boundary of the light-transmissive adhesive material 35 and the second light-reflective member 30, and travels to the light-transmissive member 31. Thus, when the light-transmissive member 31 has the outer shape larger than the outer shape of the light-emitting element 34 in a top view, and the light-transmissive adhesive material 35 is disposed between the lateral surfaces 34$c$ of the light-emitting element 34 and the second light-reflective member 30, the light emitted laterally from the semiconductor layered body 32 can be efficiently used. The light-emitting element 34 is fixed to a lower surface of the light-transmissive member 31 using the light-transmissive adhesive material 35.

The pair of electrodes 33 each are connected to a corresponding one of wiring layers 60. The electrodes 33 and the wirings of the wiring board 2 are connected via the wiring layers 60. The wiring layers 60 extend between the light-reflective member 11 and an insulating member 61, which will be described below.

The light-transmissive member 31 of the light source 10 is provided in the first recess 4 and bonded to the first recess 4 using a bonding material 40.

Light-Emitting Element

A semiconductor light-emitting element capable of emitting light having an appropriate wavelength can be selected as the light-emitting element 34. For example, a light-emitting diode or the like may be selected as the light-emitting element 34. In an example, a light-emitting element that emits blue light may be used for the light-emitting element 34. However, without being limited to the above light-emitting element, a light-emitting element that emits light other than blue light may be used for the light-emitting element 34. In the case in which the surface-emitting light source includes a plurality of light-emitting elements 34 disposed at predetermined intervals, the light-emitting elements may emit light having the same color or different colors.

An example of the semiconductor layered body of the light-emitting element 34 capable of emitting blue light may include a nitride semiconductor ($In_xAl_yGa_{1-x-y}N$, $0 \leq x$, $0 \leq y$, and $x+y \leq 1$). In this case, the light-emitting element of the nitride semiconductor includes, for example, a sapphire substrate and a nitride semiconductor layered structure on the sapphire substrate. The nitride semiconductor layered structure includes an n-type nitride semiconductor layer, a p-type nitride semiconductor layer, and a light-emitting layer that is sandwiched between the n-type nitride semiconductor layer and the p-type nitride semiconductor layer. The n-type nitride semiconductor layer and the p-type nitride semiconductor layer are electrically connected to respective electrodes 33, namely, an n-side electrode and a p-side electrode.

The light-emitting element 34 may have any shape such as square or rectangle in a plan view. The light-emitting element 34 may also include a polygonal shape such as triangle or hexagon. For example, the light-emitting element 34 may have a size of 50 μm or more and 1000 μm or less, preferably 100 μm or more and 750 μm or less, in a longitudinal/lateral direction in a plan view. The light-emitting element 34 may have a height of 50 μm or more and 500 μm or less, preferably 100 μm or more and 400 μm or less.

The light-transmissive member 31 of the light source 10 has a substantially plate-like shape. The light-transmissive member 31 may contain a wavelength conversion member. The wavelength conversion member absorbs at least a portion of light emitted from the light-emitting element 34 and emits light having a wavelength different from the wavelength of the light emitted from the light-emitting element 34. For example, the wavelength conversion member converts the wavelength of a portion of blue light emitted from the light-emitting element 34 and emits yellow light. This allows the blue light passing through the light-transmissive member 31 and yellow light emitted from the wavelength conversion member in the light-transmissive member 31 to be mixed, so that white light can be obtained.

Light-Transmissive Member

Examples of a material for the light-transmissive member 31 include silicone resins, modified silicone resins, epoxy resins, modified epoxy resins, urea resins, phenolic resins, acrylic resins, urethane resins, fluorocarbon resins, or a resin containing two or more of these resins. The light-transmissive member 31 is preferably made of a material having a refractive index lower than a refractive index of the material for the light-guide portion 3 from a perspective of efficiently guiding the light into the light-guide portion 3. A material having a refractive index different from the refractive index of the base material for the light-transmissive member 31 may be dispersed in the light-transmissive member 31 such that light can be diffused in the light-transmissive member 31. For example, particles of titanium dioxide, silicon oxide, and the like may be dispersed in the material for the light-transmissive member 31.

The light-transmissive member 31 may contain a wavelength conversion member. The wavelength conversion member absorbs at least a portion of light emitted from the light-emitting element 34 and emits light having a wavelength different from the wavelength of the light emitted from the light-emitting element 34. For example, the wavelength conversion member converts the wavelength of a portion of blue light emitted from the light-emitting element 34 and emits yellow light. This structure the blue light passing through the light-transmissive member 31 and yellow light emitted from the wavelength conversion member in the light-transmissive member 31 to be mixed, so that white light can be obtained.

Wavelength Conversion Member

A phosphor can be used for the wavelength conversion member. A known substance can be used for the phosphor. Examples of the phosphor include fluoride phosphors such as KSF phosphors, nitride phosphors such as CASN, YAG phosphors, and β-SiAlON phosphors. KSF phosphors and CASN are examples of wavelength conversion substances to convert blue light into red light. YAG phosphors are examples of wavelength conversion substances to convert blue light into yellow light. β-SiAlON phosphors are examples of wavelength conversion substances to convert blue light into green light. For the phosphor, quantum-dot phosphors may be used.

It is not required that the light-transmissive members 31 contain the same phosphor in a plurality of unit mounting regions in the surface-emitting light source. The phosphors dispersed in the light-transmissive member 31 may be different among the plurality of unit mounting regions. Among the plurality of unit mounting regions, a light-transmissive member containing a wavelength conversion member that converts incident blue light into yellow light may be disposed in some of the unit mounting region, and a light-transmissive member containing a wavelength conversion member that converts incident blue light into green light may be disposed in some of the unit mounting region, and further, a light-transmissive member containing a wavelength conversion member that converts incident blue light into red light may be disposed in the remaining unit mounting regions.

Light-Reflective Member

As shown in FIG. 3, the light-reflective member 11 is disposed on the lower surface 3b of the light-guide portion 3 to cover the lower surface 3b of the light-guide portion 3 and lateral surfaces of the second light-reflective member 30 of the light source 10. Examples of materials for the light-reflective member 11 include a resin material containing light-reflective fillers dispersed in the resin material.

Examples of base materials of resin materials for the light-reflective member 11 include silicone resins, phenolic resins, epoxy resins, BT resins, and polyphthalamide (PPA). For the light reflective filler, metal particles, or particles of inorganic or organic materials having a refractive index higher than the refractive index of the base material can be used. Examples of light-reflective fillers include particles of titanium dioxide, silicon oxide, zirconium dioxide, potassium titanate, aluminum oxide, aluminum nitride, boron nitride, mullite, niobium oxide, and barium sulfate, and particles of rare-earth oxide such as yttrium oxide and gadolinium oxide. The light-reflective member 11 is preferably white in color.

In the surface-emitting light source 20 according to the present embodiment, the light-reflective member 11 is disposed for each light-emitting region 1. However, the light-reflective member 11 may be appropriately disposed, for example, a light-reflective member 11 may be disposed over the plurality of light-emitting regions, or a single light-reflective member 11 may be disposed to cover all of the light-emitting regions in the surface-emitting light source 20. The light-reflective member 11 according to the present embodiment is disposed in contact with the lower surface 3b of the light-guide portion 3. However, the light-reflective member 11 may be disposed below the light-guide portion 3. For example, other members such as bonding materials and light-transmissive members or a gap may be disposed between the light-reflective member 11 and the light-guide portion 3.

The light-reflective member 11 has a flat lower surface. The insulating member 61 is disposed on the lower surface of the light-reflective member 11 and the lower surfaces of the wiring layers 60 except the region in which the wiring layers 60 and the wiring of the wiring board 2 are connected.

As shown in FIG. 2, the light-reflective member 11 includes the first wall portion 12 disposed within the fourth recess 7 of the light-guide portion 3 and the second wall portion 14 disposed within the second recess 5 of the light-guide portion 3.

The first wall portion 12 includes unit first wall portions 13 each of which corresponds to a respective one of the light sources located at the outer periphery of the light-emitting region 1. The unit first wall portion 13 is disposed along a side located at the outer periphery of the light-emitting region 1 among the sides of the unit mounting region in which the light source is disposed.

In the present embodiment, 16 unit mounting regions 1A to 1P are arranged within a single light-emitting region 1 in a matrix shape of four rows and four columns. The unit first wall portions 13 are disposed along sides located at the outer periphery of the light-emitting region 1 among the sides of the unit mounting regions 1A to 1E, 1H, 1I, and 1L to 1P. Hence, the first wall portion 12 in a single light-emitting region 1 includes 16 unit first wall portions 13. The 16 unit first wall portions 13 are continuously integrated to form the first wall portion 12.

Next, each of the unit first wall portions 13 will be described in detail with reference to FIG. 6A.

The unit first wall portion 13 has a shape of substantially right-angle triangular prism in which a portion of the right-angle triangular prism is removed. Specifically, the unit first wall portion 13 has a substantially right-angle triangular prism shape having two orthogonal rectangular surfaces with a depression formed on a side opposite to one of the above surfaces. In the unit first wall portion 13, the rectangular surface opposite to the side with the recess is referred to as a bottom surface 13b, and a surface formed by the recess (the inner surface of the recess) is referred to as an upper surface 13a. In the unit first wall portion 13, the extending direction of a lateral surface having a right-angle triangle shape is referred to as the short direction. The depression is formed along the longitudinal direction of the unit first wall portion 13 from an end portion 13e to another end portion 13f.

The unit first wall portion 13 is disposed with the longitudinal direction aligned to a side of the unit mounting region. Also, the unit first wall portion 13 is disposed with a lateral surface 13d, which is located in a longitudinal direction and is orthogonal to the bottom surface 13b, facing outside of the light-emitting region 1. In the surface-emitting light source 20 in which the plurality of light-emitting regions 1 are disposed in a matrix, the lateral surfaces 13d of the unit first wall portions 13 in two adjacent light-emitting regions are in contact with each other.

The unit first wall portion 13 has a central portion 13h having a height smaller than the height of both end portions 13e and 13f. Here, the central portion 13h is close to the light source 10 disposed at the center of the unit mounting region in which the unit first wall portion 13 is disposed. The central portion 13h is strongly irradiated with the light emitted from the light source.

As described above, the unit first wall portion 13 is formed to have different heights for a purpose of reducing unevenness in luminance of the light leakage from the lighting region to the adjacent non-lighting region. To achieve the purpose, the surface of the unit first wall portion 13, particularly near the upper surface 13a of the unit first wall portion 13, preferably does not have corners and steps. Corners and steps formed on the surface of the unit first wall portion 13 may block propagation of light and may cause unevenness in luminance of the light leakage from the lighting region. Hence, the height of the unit first wall portion 13 changes smoothly from both end portions 13e and 13f to the central portion 13h, and the upper surface 13a of the unit first wall portion 13 is formed into a smooth surface.

In order to form a smooth surface close to the upper surface 13a of the unit first wall portion 13, a curved surface 13g is formed between the upper surface 13a and a lateral surface 13c of the unit first wall portion 13.

Figure 6B:
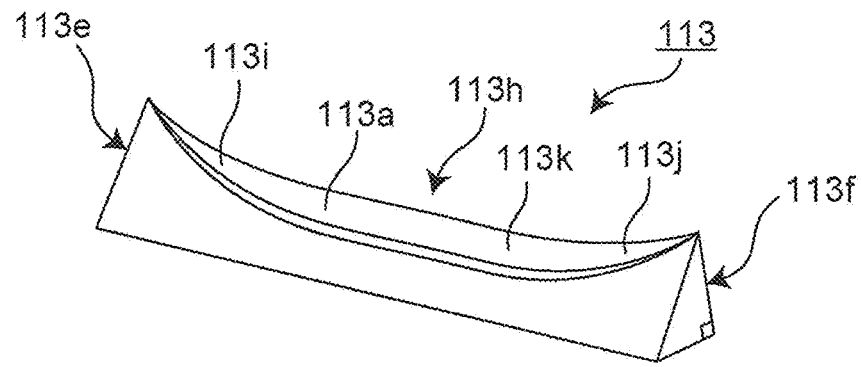
FIG. 6B is a modification of the unit first wall portion shown in FIG. 6A.
Figure 6C:
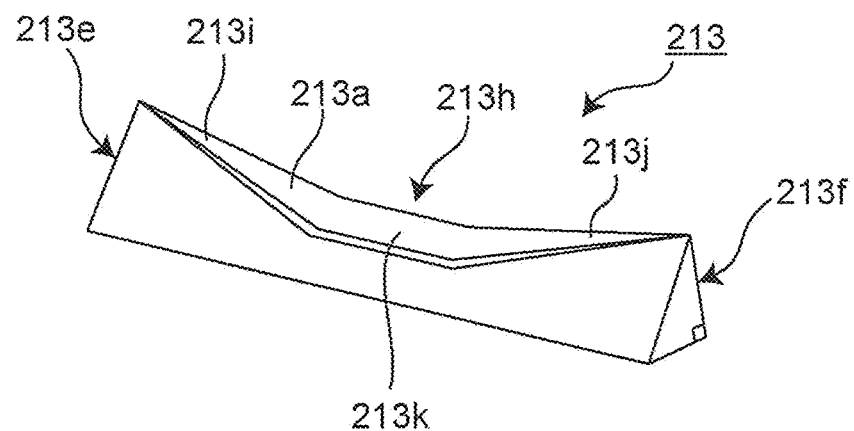
FIG. 6C is a modification of the unit first wall portion shown in FIG. 6A.
Figure 6D:
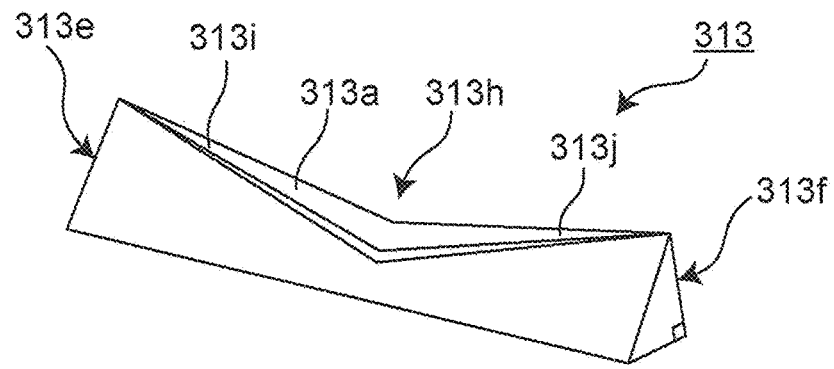
FIG. 6D is a modification of the unit first wall portion shown in FIG. 6A.

The upper surface 13a of the unit first wall portion 13 according to the present embodiment is formed into a smooth curved surface as shown in FIG. 6A. However, as shown in FIG. 6B, the upper surface of the unit first wall portion may be formed of two smooth curved surfaces 113i and 113j continuous from both end portions 113e and 113f and a flat surface 113k located at the central portion 113h and connecting the two smooth curved surfaces 113i and 113j. Alternatively, as shown in FIG. 6C, the upper surface of the unit first wall portion may be formed of two flat surfaces 213i and 213j continuous from both end portions 213e and 213f and a flat surface 213k located at the central portion 213h and connecting the two flat surfaces 213i and 213j. Alternatively, as shown in FIG. 6D, the upper surface of the unit first wall portion may be formed of two flat surfaces 313i and 313j continuous from both end portions 313e and 313f and connecting each other at the central portion 313h. In the unit first wall portion having the upper surface in any of the above shapes, the central portion has a height smaller than the height of both end portions, and a curved surface is formed between the upper surface and the lateral surface.

The first wall portion 12 comprising the unit first wall portion 13 having the above shape is disposed in the fourth recess 7 of the light-guide portion 3. The fourth recess 7 has a shape corresponding to the shape of the first wall portion 12. Hence, in the surface-emitting light source 20 in which the plurality of light-emitting regions 1 are disposed in a matrix, the fourth recesses 7 of two adjacent light-emitting regions communicate with each other.

Next, the relationships between the height of the unit first wall portion 13, the depth d1 of the first recess 4 and the depth d2 of the third recess 6 of the light-guide portion 3, and the thickness t1 of the light-guide portion 3 will be described with reference to FIGS. 5 and 6A.

The central portion 13$h$ of the unit first wall portion 13 has a height h1 larger than the depth d1 of the first recess 4. Further, the sum of the height h1 of the central portion 13$h$ of the unit first wall portion 13 and the depth d2 of the third recess 6 is smaller than the thickness t1 of the light-guide portion 3. That is, the height h1 of the central portion 13$h$ of the unit first wall portion 13 is smaller than the distance d3 from the lower surface 3$b$ of the light-guide portion 3 to the bottom portion 6$b$ of the third recess 6 (d3=t1−d2, where t1 is the thickness of the light-guide portion 3 and d2 is the depth of the third recess 6). This structure allows the light emitted from the light source 10 to be expanded within the light-guide portion 3.

Further, the height h2 of each of both end portions 13$e$ and 13$f$ of the unit first wall portion 13 is equal to or smaller than half of the thickness t1 of the light-guide portion 3 and equal to or more than twice the height h1 of the central portion 13$h$.

Next, a second wall portion 14 will be described.

As shown in FIG. 2, the second wall portion 14 may include unit second wall portions 15 that correspond to a respective one of the light sources 10. Each of the unit second wall portions 15 is disposed along a respective one of the sides other than the sides located at outer periphery of the light-emitting region 1 among the sides of the unit mounting regions 1A to 1P in each of which a respective one of 16 light sources 10 is disposed. Hence, in the present embodiment, the second wall portion 14 includes 24 unit second wall portions 15. The unit second wall portions 15 are continuously integrated to form the second wall portion 14. The second wall portion 14 and the first wall portion 12 may be continuously integrated.

Next, the unit second wall portion 15 will be described in detail with reference to FIG. 6A.

The unit second wall portion 15 has a shape in which one unit first wall portion 13 indicated by a solid line in FIG. 6A and another unit first wall portion 13 indicated by a dashed line in FIG. 6A are integrated with the lateral surfaces 13$d$, which are orthogonal to each of the bottom surfaces 13$b$, being in contact with each other. The shape is identical to the shape of the two unit first wall portions 13 with the lateral surfaces 13$d$ in contact with each other between the two adjacent light-emitting regions.

The second wall portion 14 comprising the unit second wall portion 15 having the above shape is disposed within the second recess 5 of the light-guide portion 3. The second recess 5 has a shape corresponding to the shape of the second wall portion 14. Hence, the shape of the second recess 5 is identical to the shape of the two fourth recesses 7 communicating with each other between the two adjacent light-emitting regions.

It is noted that a shape of the unit second wall portion 15 is not limited to these shapes and for example, the unit second wall portion 15 may have a uniform height. However, with the unit second wall portion 15 having a shape in which two unit first wall portions 13 are integrated, the light-emitting region 1 includes the unit mounting regions each of which has the same configuration, so that mass-production can be facilitated.

The surface-emitting light source 20 may comprise the light-emitting regions 1 that are disposed and bonded in a matrix shape of n rows and m columns.

Method of Manufacturing Surface-Emitting Light Source

Next, a method of manufacturing the surface-emitting light source according to the present embodiment will be described below.

Providing Light-Guide Portion

Figure 7A:
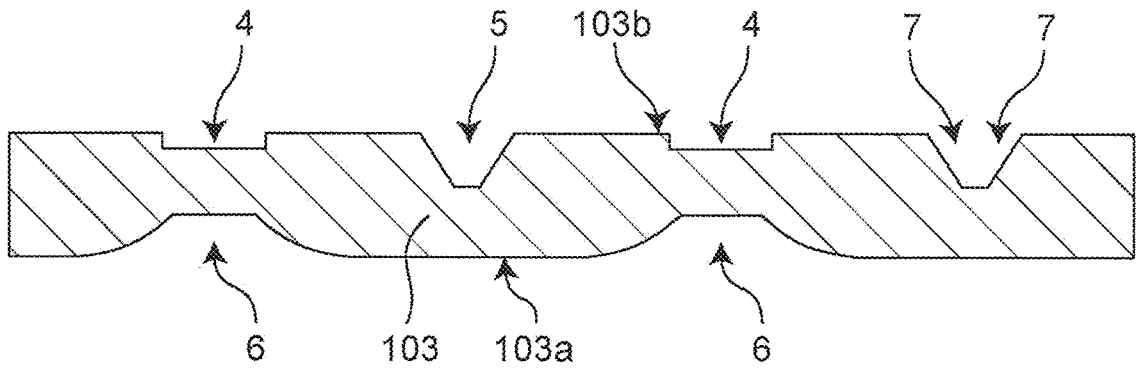
FIG. 7A is a schematic partial enlarged cross-sectional view of a method of manufacturing a surface-emitting light source according to the embodiment.

First, as shown in FIG. 7A, a light guide plate 103 having a lower surface 103$b$ and an upper surface 103$a$ is provided. The lower surface 103$b$ includes a plurality of first recesses 4 disposed in a matrix shape, fourth recesses 7 that surrounds the 16 first recesses 4 and are disposed along the outer periphery of the light-emitting region 1, and second recesses 5 each of which identifies a unit mounting region in which a respective one of the first recesses 4 is disposed, in the light-emitting region 1. The upper surface 103$a$ includes a plurality of third recesses 6 each of which is disposed opposite to a respective one of the first recesses 4. The fourth recess 7 may be integrally formed with the fourth recess 7 in the adjacent light-emitting region.

The fourth recess 7 is formed into a shape identical to the shape of the first wall portion 12 such that the first wall portion 12 is provided in the fourth recess 7. Also, as described above, the upper surface 13$a$ of the unit first wall portion 13 may be formed into a smooth curved surface, smooth curved surfaces and a flat surface, or a plurality of flat surfaces. Hence, the shape of the fourth recess 7, particularly the shape of the bottom surface of the fourth recess 7, is appropriately formed in accordance with the shape of the desired unit first wall portion 13.

The second recess 5 is formed such that the second wall portion 14 is provided in the second recess 5. The unit second wall portion 15 according to the embodiment has a shape that is identical to the shape of two unit first wall portions 13 integrated. Hence, the shape of the second recess 5 is identical to the shape of the two fourth recesses 7 of the two adjacent light-emitting regions integrated. With the second recess 5 having the shape identical to the shape of the integrated first recesses 7, formation of recesses is simplified, so that mass-production can be facilitated.

The light guide plate 103 may be provided by molding, for example, injection molding, transfer molding, or thermal transfer. Also, the first recesses 4, the second recesses 5, the third recesses 6, and the fourth recesses 7 of the light guide plate 103 may be formed at once using a metal mold in forming the light guide plate 103. This allows for reducing misalignment during forming. Alternatively, the light guide plate 103 may be provided by machining a plate without the first recesses 4, the second recesses 5, or the third recesses 6. Alternatively, the light guide plate 103 may be provided by purchasing the light guide plate 103 having the first recesses 4, the second recesses 5, the third recesses 6, and the fourth recesses 7.

Disposing Light-Reflective Layer

Next, a light-reflective layer 16 is disposed in the third recess 6. For the light-reflective layer 16, for example, a light-reflective material such as a resin material in which light-reflective fillers are dispersed can be used. The light-reflective layer 16 may be formed using, for example, transfer molding, potting, printing, or spraying. The step of disposing the light-reflective layer 16 may be performed after any step after the step of providing the light-guide portion.

Mounting Light Source in First Recess

Figure 7B:
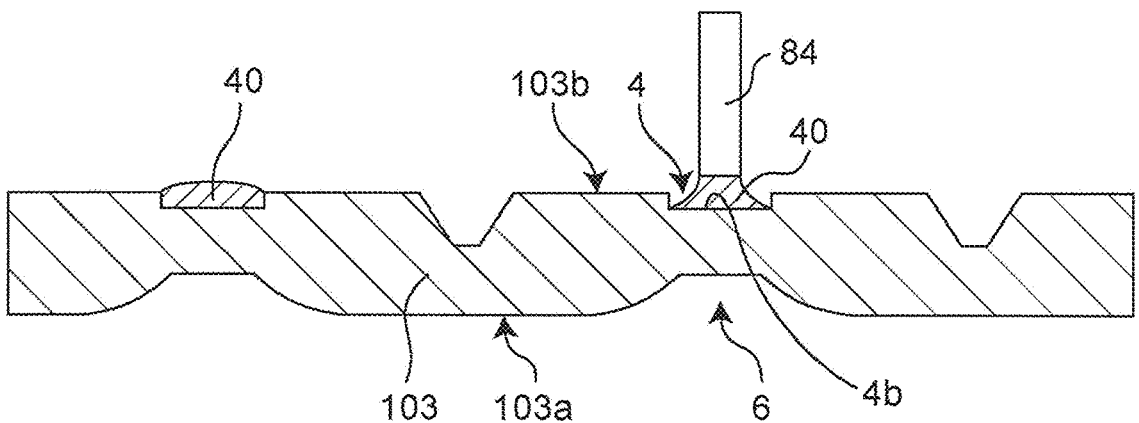
FIG. 7B is a schematic partial enlarged plan view of a method of manufacturing a surface-emitting light source according to the embodiment.

In this step, the light source 10 is mounted on the bottom surface 4b of the first recess 4 such that each of lateral surfaces 4c of the first recess 4 at least faces a corresponding one of lateral surfaces of the light source 10. As shown in FIG. 7B, a liquid bonding material 40 is disposed on the bottom surface 4b of the first recess 4. The bonding material 40 may be applied by potting, transfer, printing, and the like. FIG. 7B shows an example of disposing the bonding material 40 by potting using a dispenser nozzle 84. The bonding material 40 may be applied to the light source 10. For example, the bonding material 40 may be applied by a method in which the light source 10 is picked up using a suction member such as a suction collet, and the light-emitting surface of the light source 10 is immersed in a liquid bonding material 40.

Figure 7C:
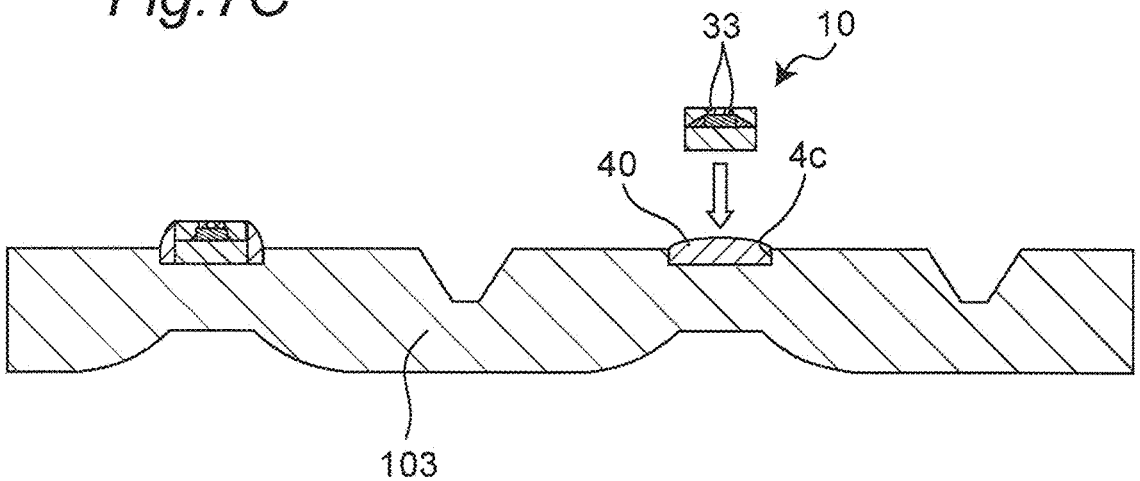
FIG. 7C is a schematic partial enlarged plan view of a method of manufacturing a surface-emitting light source according to the embodiment.

Next, as shown in FIG. 7C, the light source 10 is mounted on the bonding material 40 in the first recess 4 with the electrodes 33 facing upward. Also, at least a portion of each of the lateral surfaces of the light source 10 faces a corresponding one of the lateral surfaces 4c of the first recess 4. That is, a portion of the light source 10 is embedded in the bonding material 40. After that, the light source 10 and the light guide plate 103 are bonded by curing the bonding material 40.

Figure 7D:
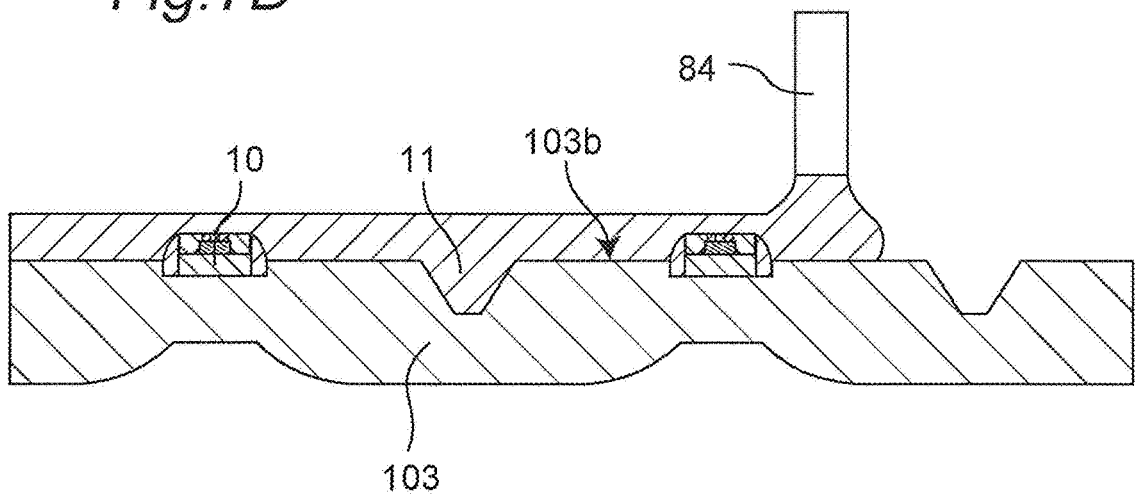
FIG. 7D is a schematic partial enlarged cross-sectional view of a method of manufacturing a surface-emitting light source according to the embodiment.

Disposing Light-Reflective Member to Cover Lower Surface of Light Source and Lower Surface of Light Guide Plate Next, as shown in FIG. 7D, the light-reflective member 11 is disposed to cover the lower surface 103b of the light guide plate 103 and the plurality of light sources 10. The light-reflective member 11 may be disposed using, for example, transfer molding, potting, printing, or spraying. FIG. 7D shows an example of disposing a thick light-reflective member 11 using the dispenser nozzle 84 such that the electrodes 33 of the light sources 10 are covered. The light-reflective member 11 may be disposed such that the electrodes 33 are not embedded, that is, at least a portion of the electrodes 33 is exposed.

Removing a Portion of Light-Reflective Member

Figure 7E:
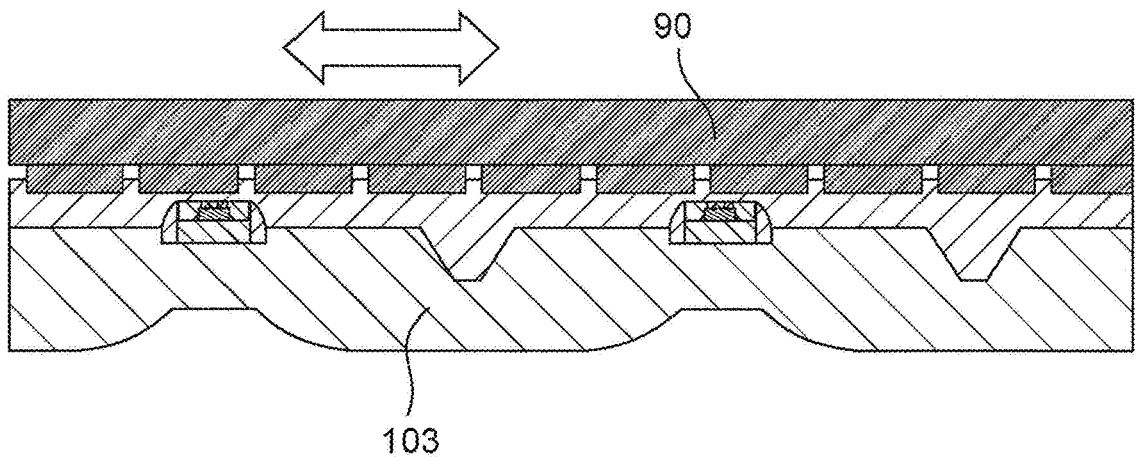
FIG. 7E is a schematic partial enlarged cross-sectional view of a method of manufacturing a surface-emitting light source according to the embodiment.
Figure 7F:
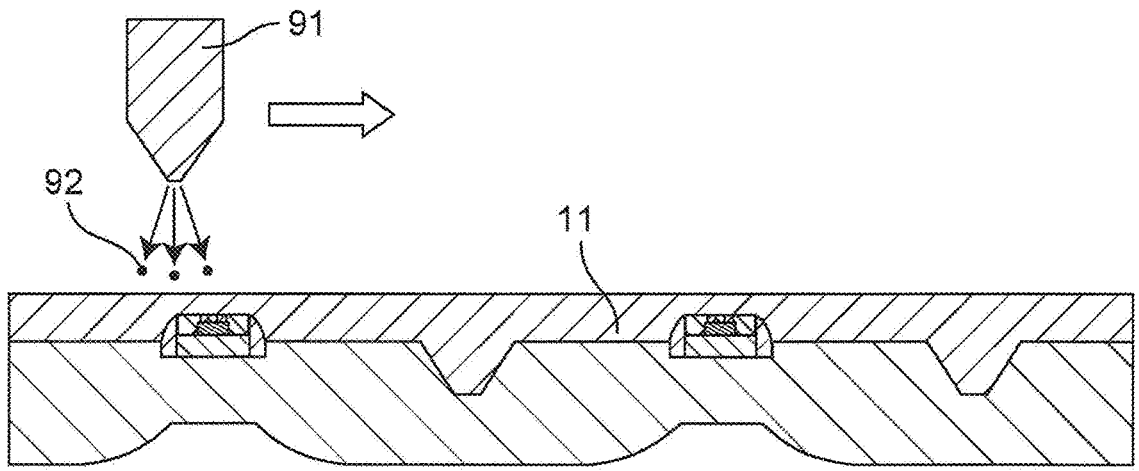
FIG. 7F is a schematic partial enlarged cross-sectional view of a method of manufacturing a surface-emitting light source according to the embodiment.
Figure 7G:
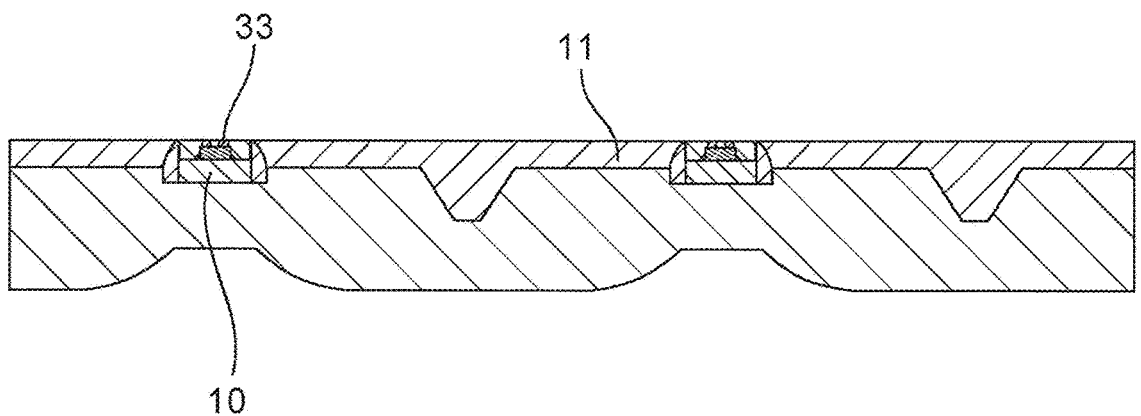
FIG. 7G is a schematic partial enlarged cross-sectional view of a method of manufacturing a surface-emitting light source according to the embodiment.

Next, as shown in FIG. 7E, the whole surface of the light-reflective member 11 is removed. This allows the electrodes 33 of the light sources 10 to be exposed from the light-reflective member 11 as shown in FIG. 7G. Methods of grinding include surface grinding of the light-reflective member 11 using a grinding member 90 such as a grindstone. Alternatively, as shown in FIG. 7F, a portion of the light-reflective member 11 may be removed by discharging hard particles 92 from a blast nozzle 91.

In the case in which the light source 10 includes wiring layers to be connected to the electrodes 33, the light-reflective member 11 may be removed so as to expose the wiring layers. In any case, the light-reflective member 11 is removed to expose an electrically-conductive member such that power can be supplied to the light source 10. If the light-reflective member 11 is disposed such that the electrode 33 is not embedded, the above step may be omitted.

Forming Metal Film to Electrically Connect Light Sources

Figure 7H:
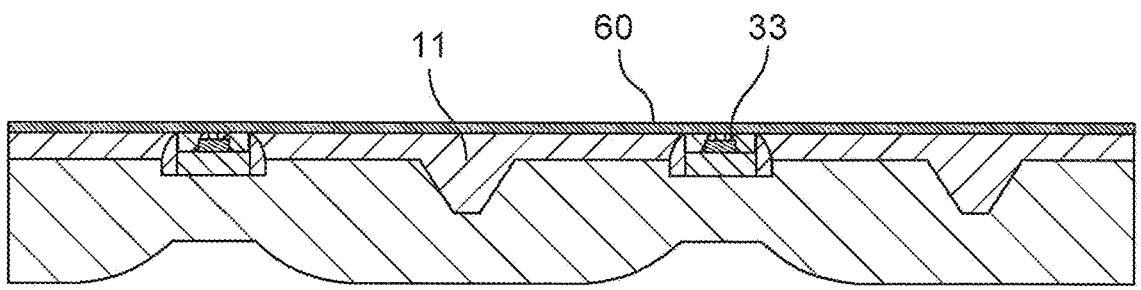
FIG. 7H is a schematic partial enlarged cross-sectional view of a method of manufacturing a surface-emitting light source according to the embodiment.

Next, as shown in FIG. 7H, the wiring layer 60 is formed on the electrodes 33 of the light source 10 and the substantially whole surface of the light-reflective member 11. The wiring layer 60 may have, for example, a layered structure in which Cu/Ni/Au are layered in this order from the light guide plate 103. Methods of forming the wiring layer 60 include sputtering, plating, and the like. The wiring layer 60 may preferably be formed by sputtering.

Figure 7I:
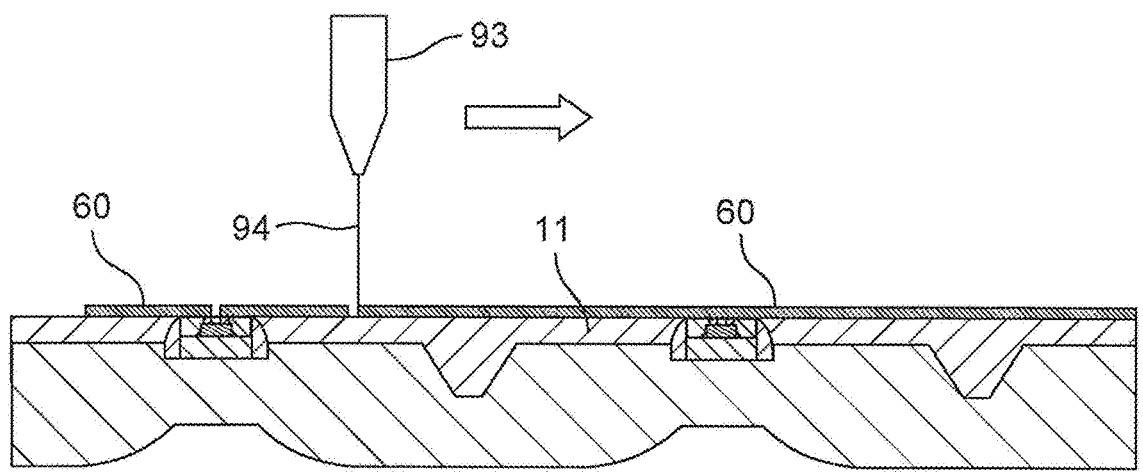
FIG. 7I is a schematic partial enlarged cross-sectional view of a method of manufacturing a surface-emitting light source according to the embodiment.

Next, as shown in FIG. 7I, patterning is performed using laser abrasion by irradiating the wiring layer 60 with a laser beam 94 from a laser beam source 93 to remove the irradiated region of the wiring layer 60. This allows separate wiring layers 60 to be obtained. Each of the wiring layers 60 is electrically connected to a corresponding one of the electrodes 33 of the light source 10.

Disposing Insulating Member

Figure 7J:
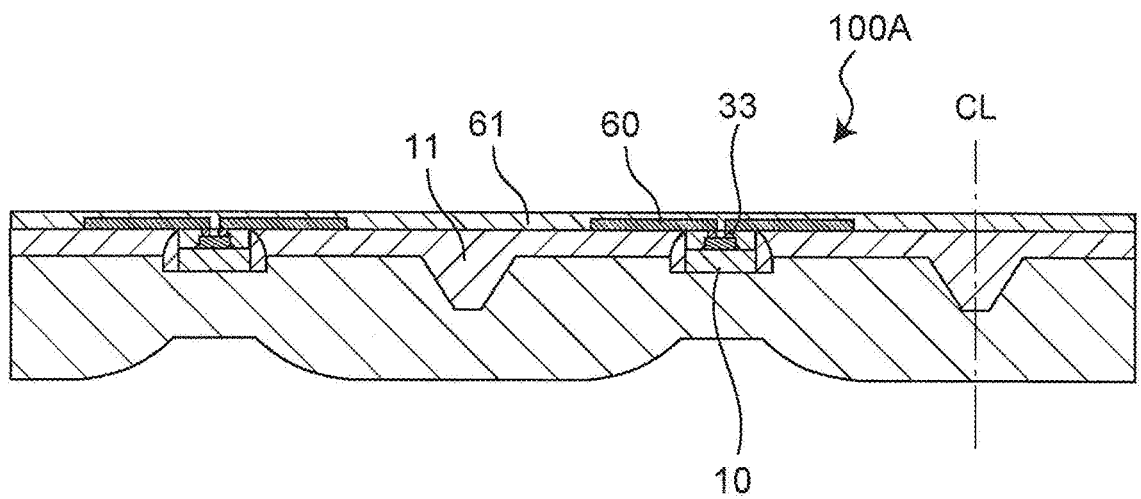
FIG. 7J is a schematic partial enlarged cross-sectional view of a method of manufacturing a surface-emitting light source according to the embodiment.

Next, as shown in FIG. 7J, the insulating member 61 is disposed on the light-reflective member 11 and the wiring layers 60. The insulating member 61 is disposed using, for example, printing, potting, or spraying. The insulating member 61 is disposed in a region except the region in which the wiring layers 60 and the wiring of the wiring board 2 are connected.

Accordingly, a region assembly 100A can be obtained.

Cutting Region Assembly

Next, the region assembly 100A is cut along the predetermined cutting position CL shown in FIG. 7J and divided into light-emitting regions 1 that include 16 light sources.

Accordingly, light-emitting modules can be obtained.

Disposing Light-Emitting Module on Wiring Board

Finally, the obtained light-emitting modules are arranged on the wiring board 2 and connected to the wiring of the wiring board 2. For example, a flexible board can be used for the wiring board 2. Each of the light sources disposed in a respective one of the light-emitting regions 1 has wiring such that the light-emitting region is individually turned on. Alternatively, the wiring may be such that 16 light sources in a single light-emitting module are individually turned on.

Other Embodiments

Next, surface-emitting light sources according to other embodiments will be described below with reference to FIGS. 8A to 8E.

Figure 8A:
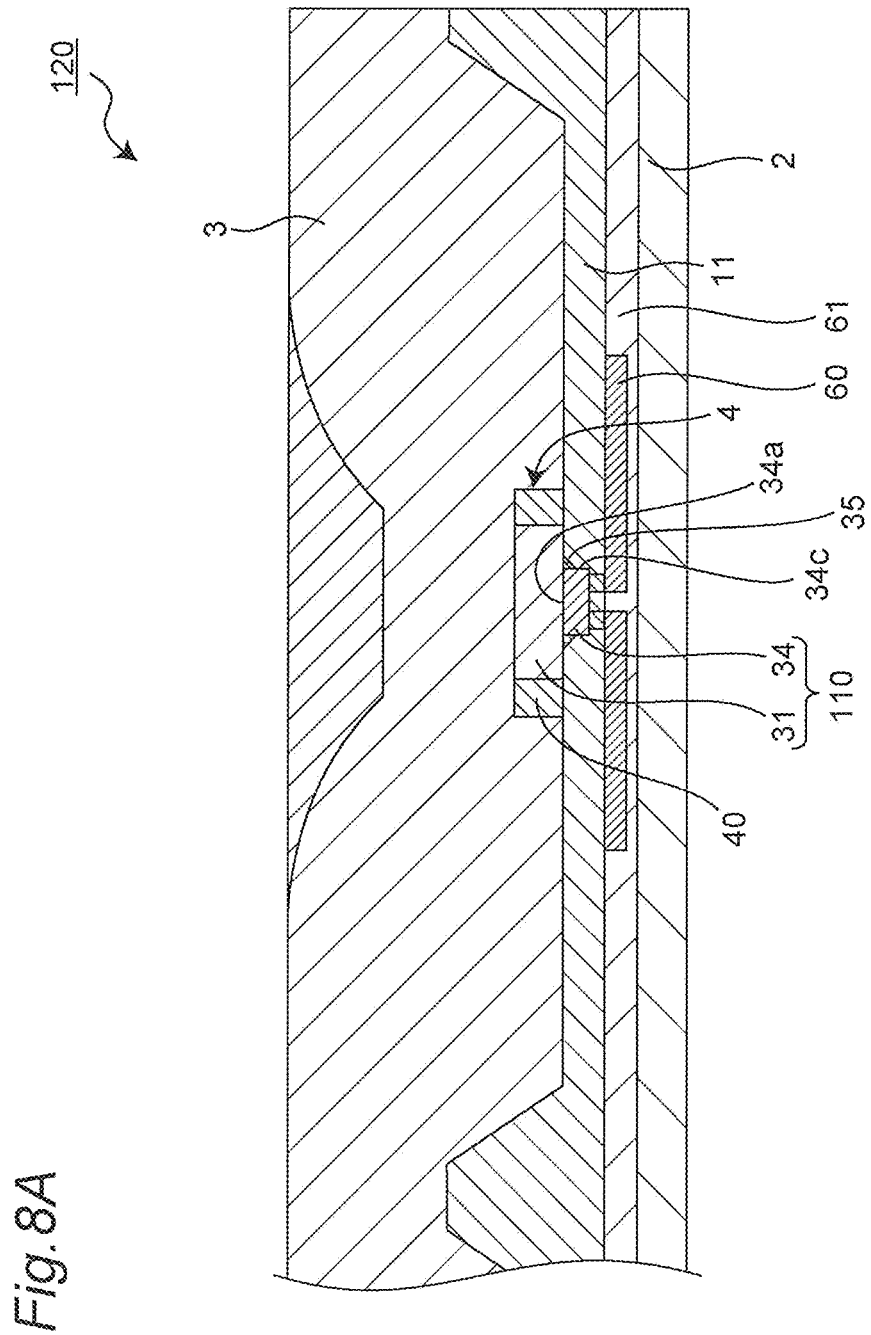
FIG. 8A is a schematic cross-sectional view of a light-emitting region of a surface-emitting light source according to an embodiment.

A surface-emitting light source 120 shown in FIG. 8A is different from the surface-emitting light source 20 shown in FIG. 5 in that the light-reflective member 11, which is disposed on the lower surface 3b of the light-guide portion 3, covers lateral surfaces of a semiconductor layered body 32 of the light source 110 and lateral surfaces of electrodes 33.

The light source 110 in the surface-emitting light source 120 shown in FIG. 8A includes a light-emitting element 34 and a light-transmissive member 31 disposed on an upper surface 34a of the light-emitting element 34. In this case, on lateral surfaces 34c of the light-emitting element 34, a light-transmissive adhesive material 35 may be disposed to cover at least a portion of the lateral surfaces 34c.

Figure 8B:
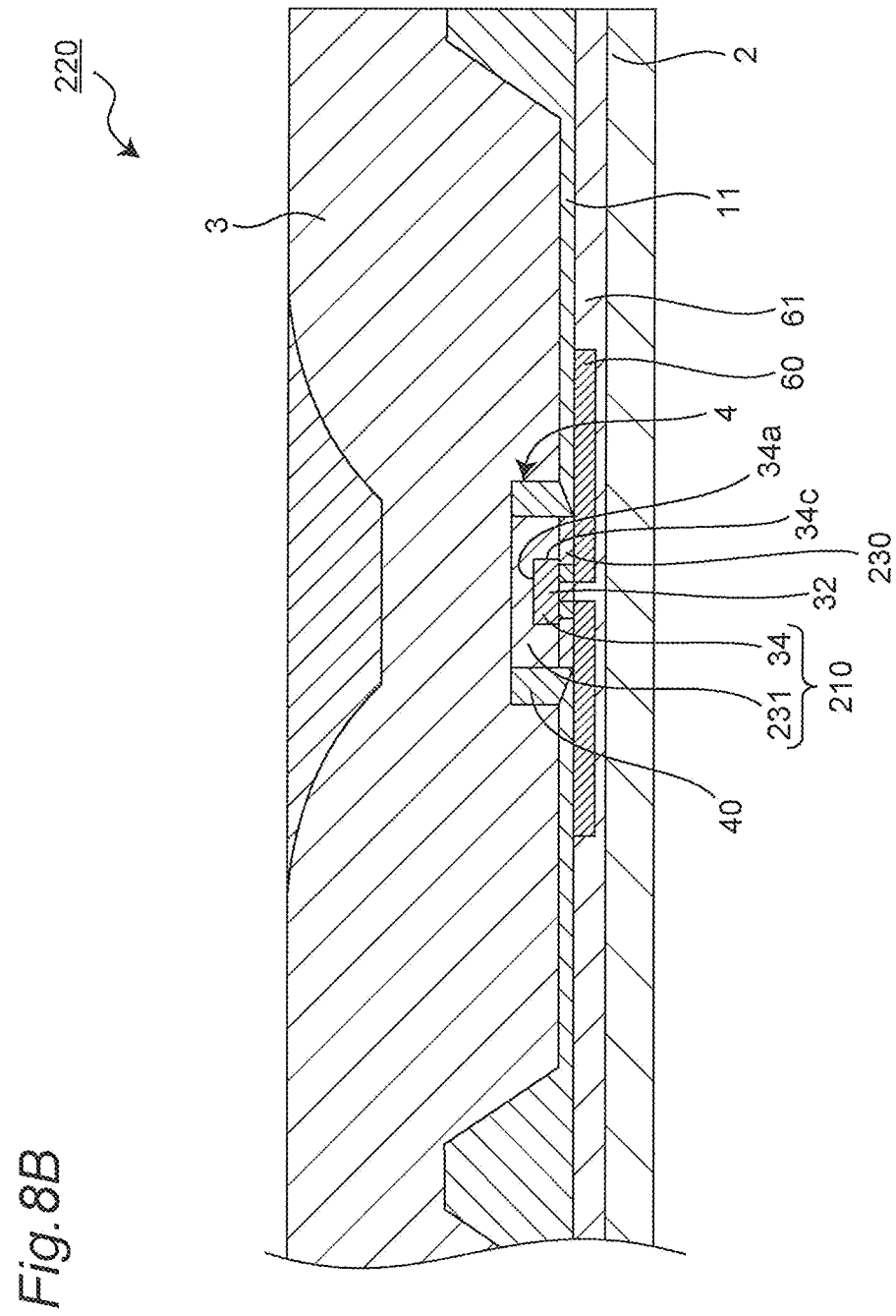
FIG. 8B is a schematic cross-sectional view of a light-emitting region of a surface-emitting light source according to an embodiment.

The surface-emitting light source 220 shown in FIG. 8B is different from the surface-emitting light source 20 shown in FIG. 5 in that a light-transmissive member 231 of a light source 210 covers at least a portion of the lateral surfaces 34c in addition to the upper surface 34a of the light-emitting element 34.

The light-transmissive member 231 preferably covers, among the lateral surfaces 34c of the light-emitting element 34, lateral surfaces of the semiconductor layered body 32. Among the lateral surfaces 34c of the light-emitting element 34, portions that are not covered with the light-transmissive member 231 are covered with a second light-reflective member 230. The light-transmissive member 231 and a portion of the light-emitting element 34 covered with the light-transmissive member 231 are provided in the first recess 4 of the light-guide portion 3. Another portion of the light-emitting element 34 that is located outside the first recess 4 is covered with the light-reflective member 11.

As described above, the light-transmissive member 231 is disposed on the upper surface 34a and at least a portion of the lateral surface 34c of the light-emitting element 34. This structure allows light emitted from the light source 210 to be expanded within the light-guide portion 3 via the light-transmissive member.

Figure 8C:
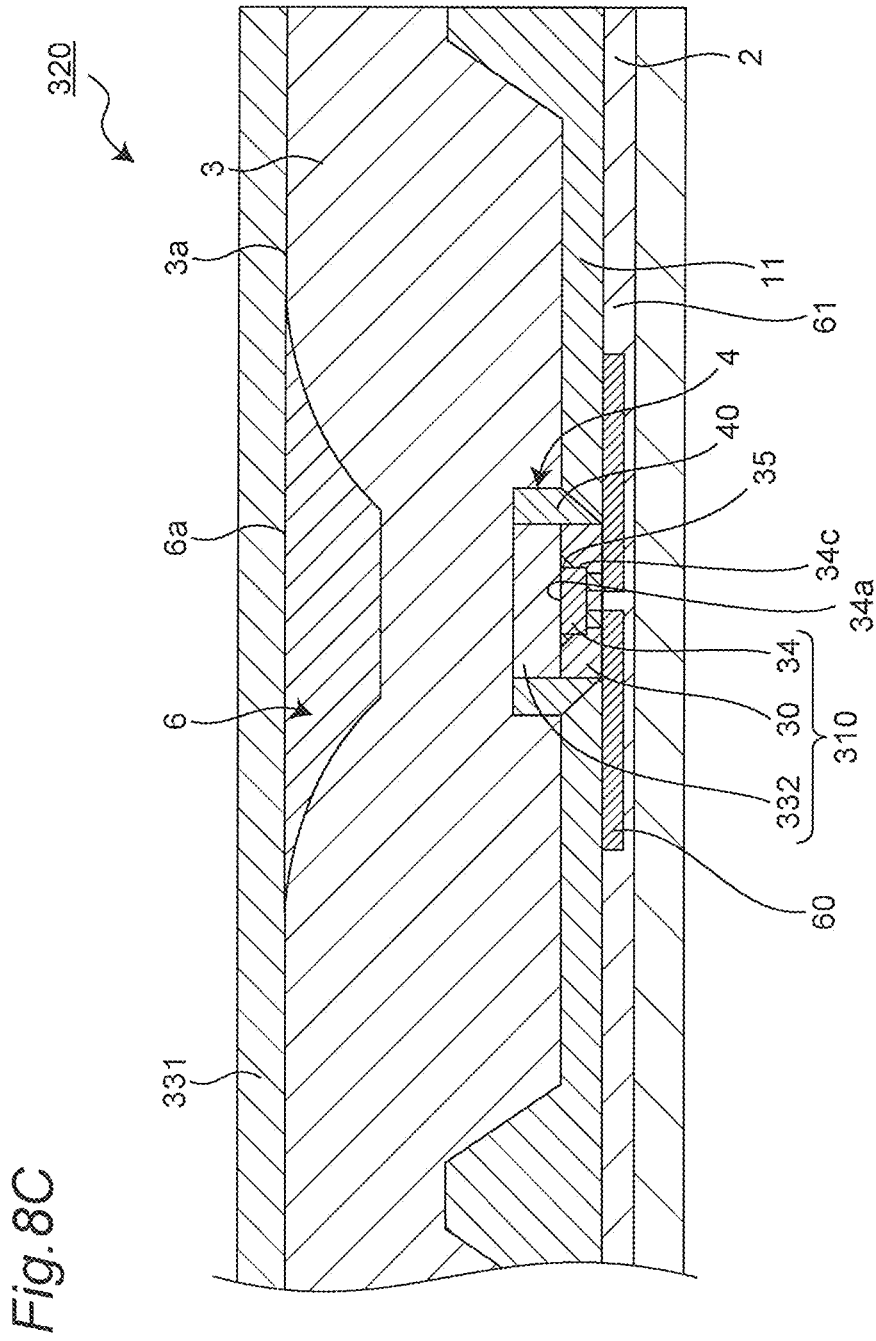
FIG. 8C is a schematic cross-sectional view of a light-emitting region of a surface-emitting light source according to an embodiment.

A surface-emitting light source 320 shown in FIG. 8C is different from the surface-emitting light source 20 shown in FIG. 5 in that a light-transmissive member 332 is disposed on the upper surface 34a of the light-emitting element 34, and a wavelength conversion member 331 is disposed on the upper surface 3a of the light-guide portion 3.

The light-transmissive member 332 is disposed to cover the upper surface 34a of the light-emitting element 34 and an upper surface of the second light-reflective member 30. The light-transmissive member 332 is provided in the first recess 4 of the light-guide portion 3. A portion of the lateral surfaces of a light source 310 that is located outside the first recess 4 is covered with the light-reflective member 11. A light-transmissive adhesive material 35 may be disposed between at least a portion of the lateral surfaces 34c of the light-emitting element 34 and the second light-reflective member 30.

The light-transmissive member 332 does not contain a wavelength conversion member. A material having a refractive index different from the refractive index of the base material for the light-transmissive member 332 may be dispersed in the light-transmissive member 332 such that light can be diffused in the light-transmissive member 332. For example, particles of titanium dioxide, silicon oxide, and the like may be dispersed in the base material for the light-transmissive member 332.

In the surface-emitting light source 20 according to the embodiment shown in FIG. 5, one light-emitting module constitutes one light-emitting region and a plurality of light-emitting modules are disposed in a matrix of n rows and m columns. However, in a surface-emitting light source shown in FIG. 8D, one light-emitting module includes a plurality of light-emitting regions 1.

Figure 8D:
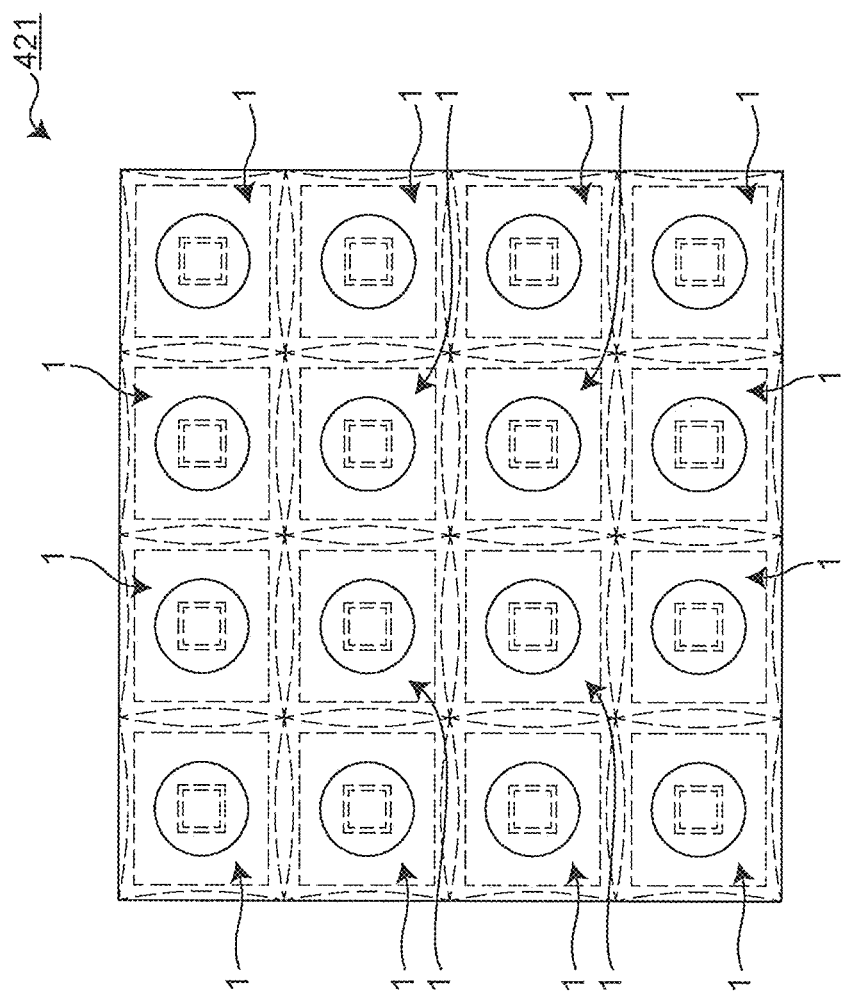
FIG. 8D is a schematic top view of light-emitting modules of a surface-emitting light source according to an embodiment.

For example, as shown in FIG. 8D, a light-emitting module 421 includes 16 light-emitting regions 1 disposed in a matrix of four rows and four columns. The surface-emitting light source includes one or more light-emitting modules 421.

The light-emitting module 421 having the above structure includes a plurality of light-emitting regions 1, lighting can be controlled for each unit mounting region by electrically connecting the light-emitting regions 1 in the light-emitting module 421 in parallel to each other.

A surface-emitting light source 520 shown in FIG. 8E is different from the surface-emitting light source 20 according to the embodiment in that the light-reflective member has a lower surface that is not flat and has irregularities on the whole of the lower surface. As shown in FIG. 8E, in the surface-emitting light source 520, a lower surface of a light-reflective member 511 is formed to have projections close to the light sources 10 and depressions at a region below the first wall portion 12 and the second wall portion 14. The lower surface of the light-reflective member 511 is smooth from the projection toward the depression.

Wiring layers 560 and an insulating member 561 are disposed across the lower surface of the light-reflective member 511 having the projections and depressions. A lower surface of an insulating member 561 is a smooth surface having projections at a region below the light sources 10 and depressions at a region below the first wall portion 12 and the second wall portion 14.

In the surface-emitting light source 20 shown in FIG. 5, each of the light-emitting regions 1 has the plurality of unit mounting regions; however, the configuration is not limited to this. For example, a single light-emitting region may include a single unit mounting region.

In the surface-emitting light source 20 according to the embodiment, the unit mounting regions each having a rectangular shape are arranged; however, the shape of the unit mounting region is not limited to a rectangular shape. The unit mounting region may have a shape of, for example, other polygonal shape or a circle according to the application purpose of the surface-emitting light source.

In the surface-emitting light source 20 according to the embodiment, the unit first wall portions having a height at the central portion smaller than in both end portions are disposed along all sides of each light-emitting region; however, the layout of the unit first wall portions is not limited to this. The unit first wall portion may be disposed only along a pair of sides facing to each other in each light-emitting region.

This structure is particularly effective for the surface-emitting light source having unit mounting regions in a rectangular shape. In the surface-emitting light source having rectangular unit mounting regions, the first wall portion extending in the short direction is located farther from the light source than the first wall portion extending in the longitudinal direction, so that irradiation of the first wall portion extending in the short direction with light emitted from the light source is decreased. Accordingly, the amount of light leakage to the adjacent non-lighting region via the first wall portion extending in the short direction is small. Hence, in the light-emitting region having the unit mounting regions in a rectangular shape, it may be acceptable that the central portion is smaller than both end portions in only the unit first wall portion constituting the first wall portion extending in the longitudinal direction.

Also, in the surface-emitting light source 20 according to the embodiment, a plurality of light-emitting regions 1 are bonded to a single wiring board 2; however, a plurality of the wiring boards to each of which a plurality of light-emitting regions 1 are bonded may be arranged to constitute a backlight device for a liquid-crystal display device. In this structure, for example, the plurality of wiring boards can be disposed on a frame or the like, and each of the plurality of wiring boards is connected to an external power supply using a connector or the like.

Other embodiments will be described below as reference embodiments. In particular, the reference embodiments described below shows certain designs of surface-emitting light sources and light-emitting modules according to the above embodiment.

First Reference Embodiment

FIGS. 13A to 13I illustrate a backlight 1020 for a liquid crystal display according to a first reference embodiment of the present disclosure (also referred to as an object of the present reference embodiment).

In a reference drawing of a schematic front view shown in gray, the gray portion is a light-emitting surface 1070 constituted of a light-transmissive body.

Figure 13A:
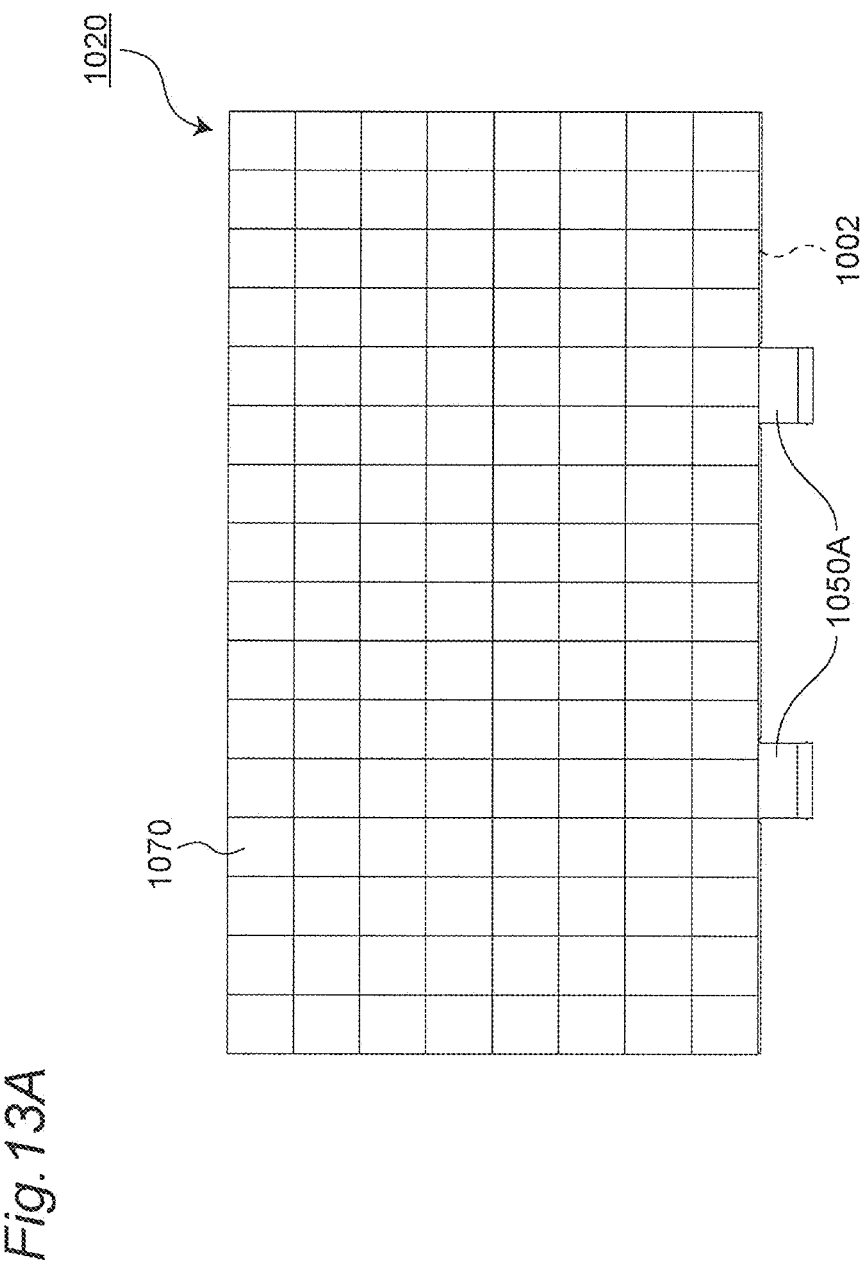
FIG. 13A is a schematic front view of a first reference embodiment according to the present disclosure.
Figure 13B:
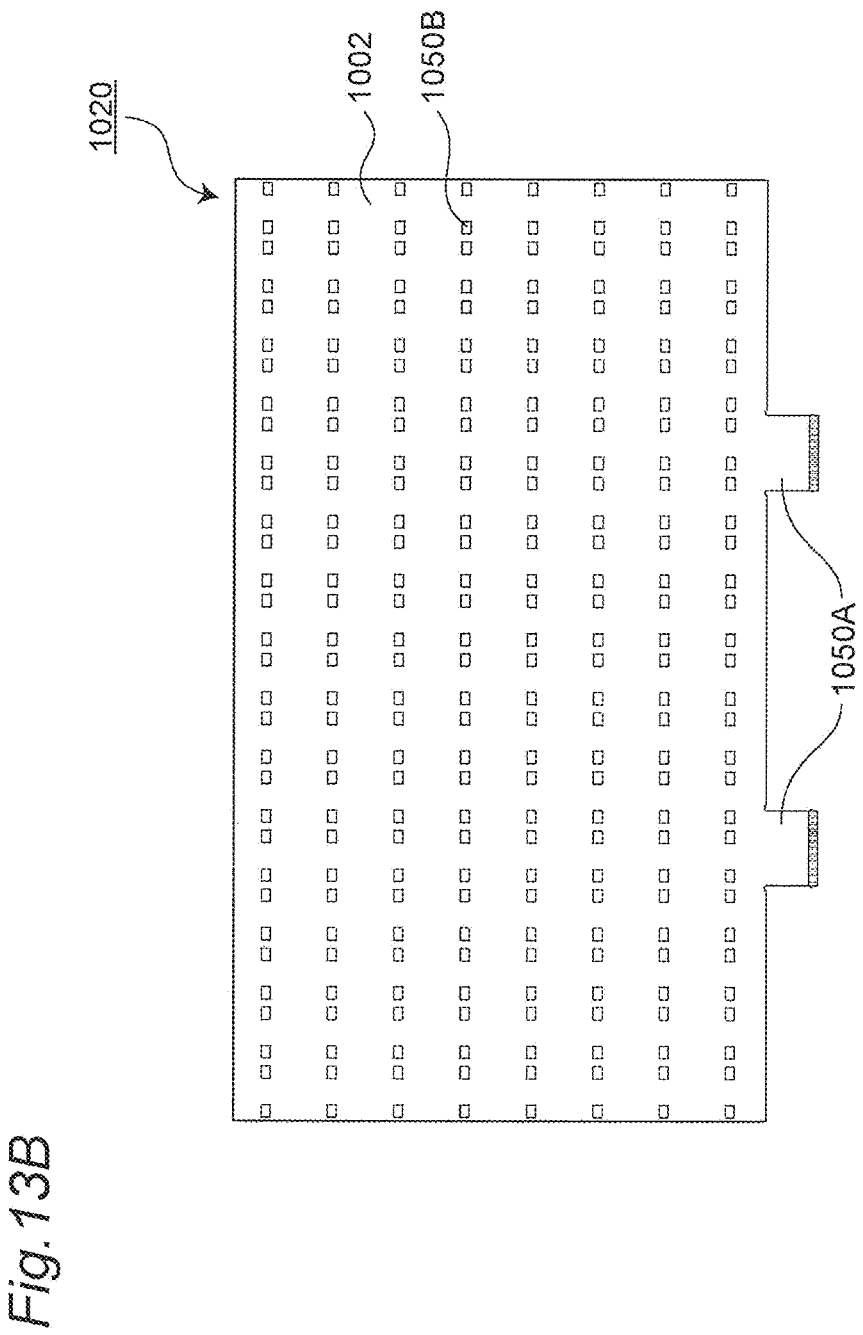
FIG. 13B is a schematic back view of the first reference embodiment according to the present disclosure.
Figure 13C:
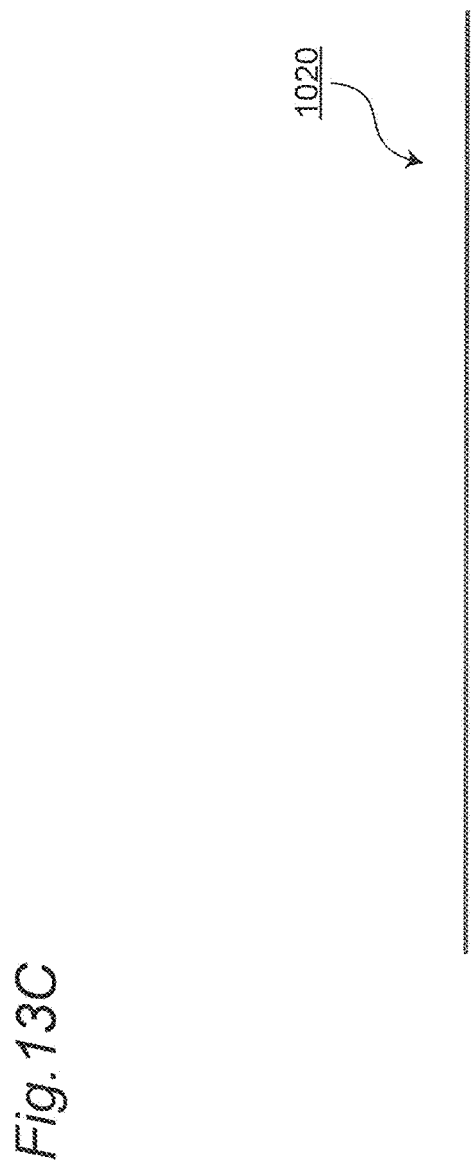
FIG. 13C is a schematic plan view of the first reference embodiment according to the present disclosure.
Figure 13D:
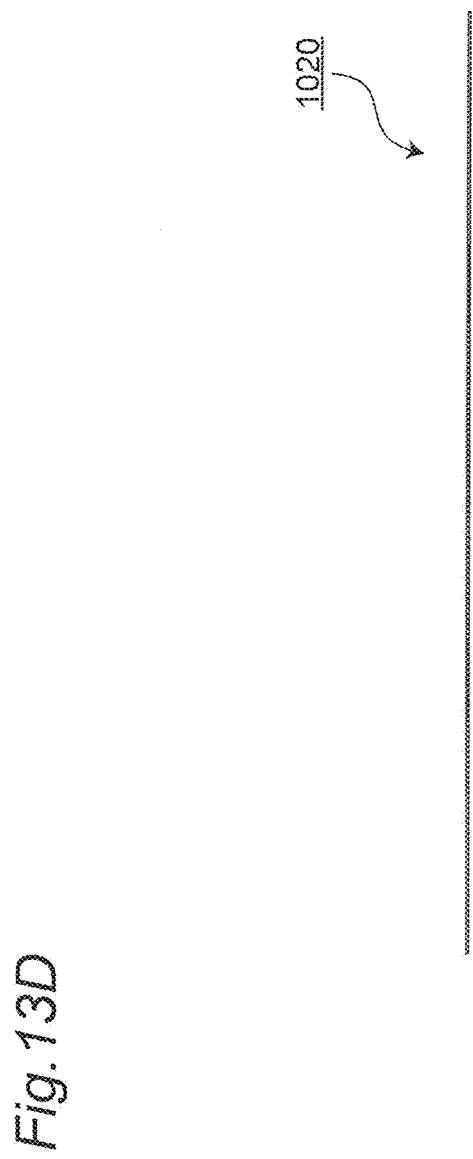
FIG. 13D is a schematic bottom view of the first reference embodiment according to the present disclosure.
Figure 13E:
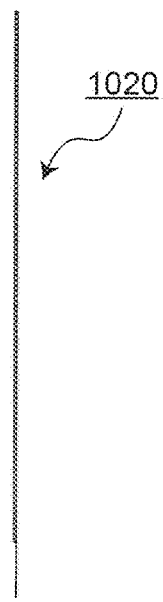
FIG. 13E is a schematic right-side view of the first reference embodiment according to the present disclosure.
Figure 13F:
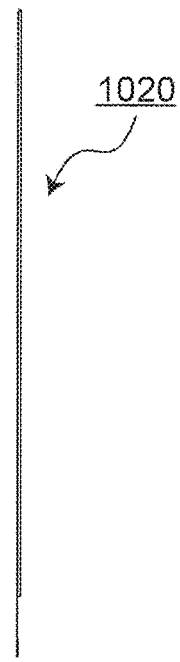
FIG. 13F is a schematic left-side view of the first reference embodiment according to the present disclosure.
Figure 13G:
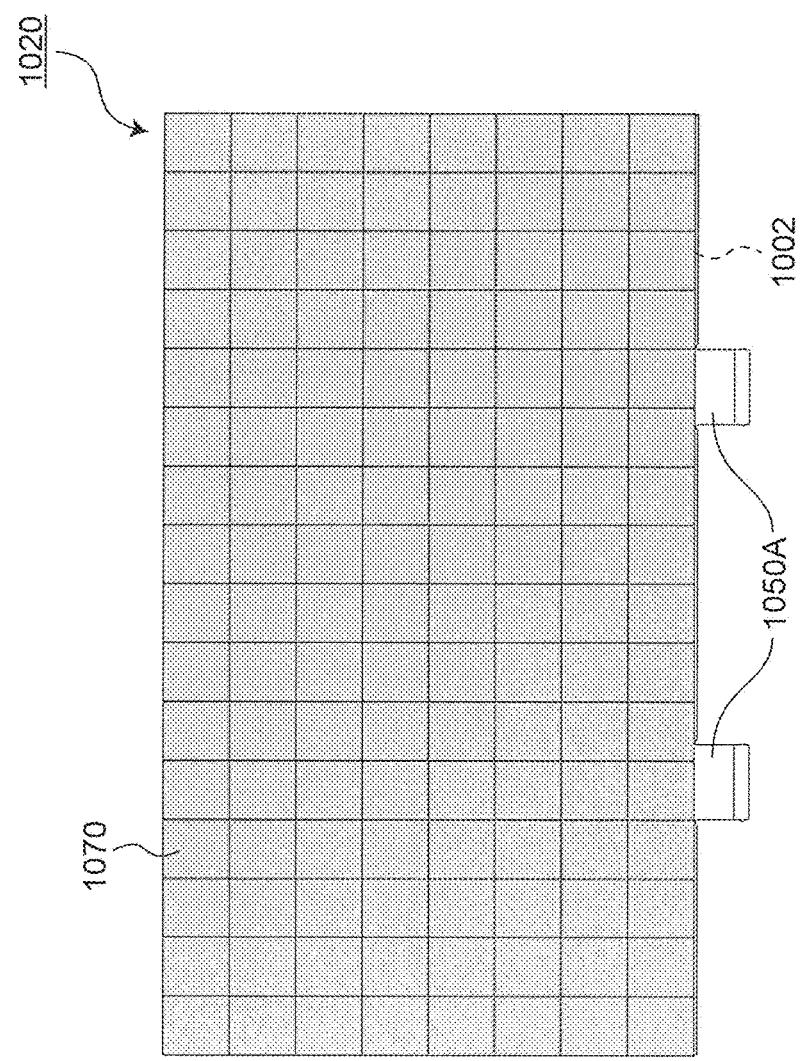
FIG. 13G is a reference drawing of a schematic front view of the first reference embodiment according to the present disclosure, shown in gray.
Figure 13H:
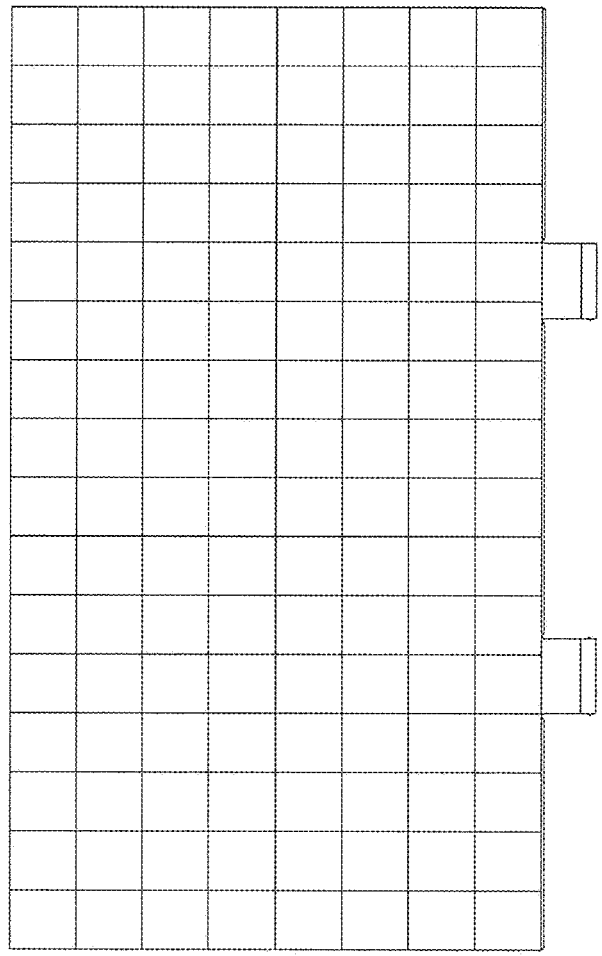
FIG. 13H is a schematic front view shown in FIG. 13A with the reference numerals removed.
Figure 13L:
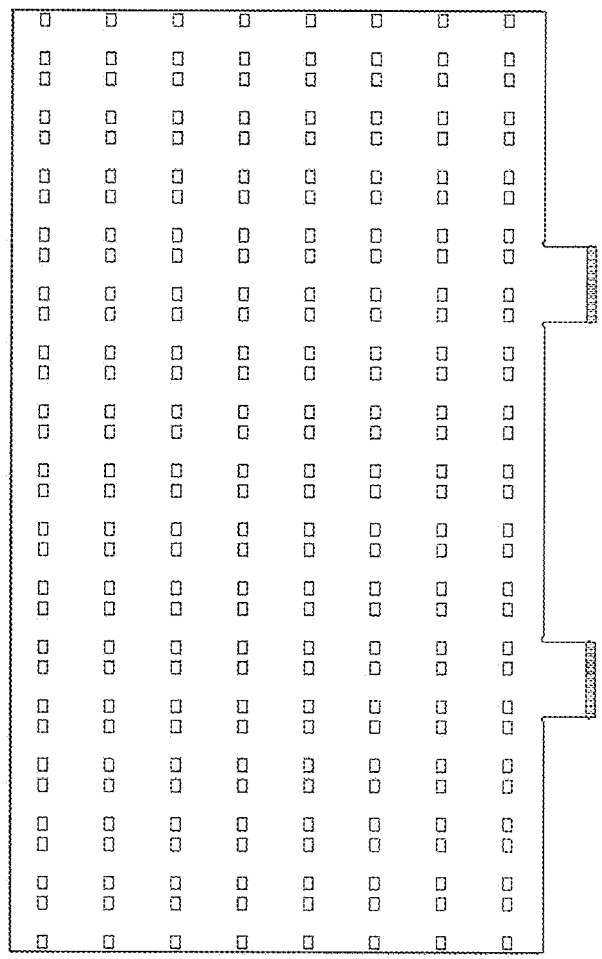
FIG. 13I is a schematic back view shown in FIG. 13B with the reference numerals removed.

The backlight 1020 for a liquid crystal display according to the first reference embodiment corresponds to a surface-emitting light source 20 of the embodiment. Electrode terminal portions 1050A of the first reference embodiment, for example shown in FIGS. 13A, 13B, and 13G correspond to terminals 50 of the embodiment. A flexible printed board 1002 of the first reference embodiment, for example shown in FIGS. 13A, 13B, and 13G, corresponds to a wiring board 2 of the embodiment. Electrode terminal portions 1050B, for example shown in FIG. 13B, are formed on a back surface of the flexible printed board 1002 according to the first reference embodiment.

Figure 14A:
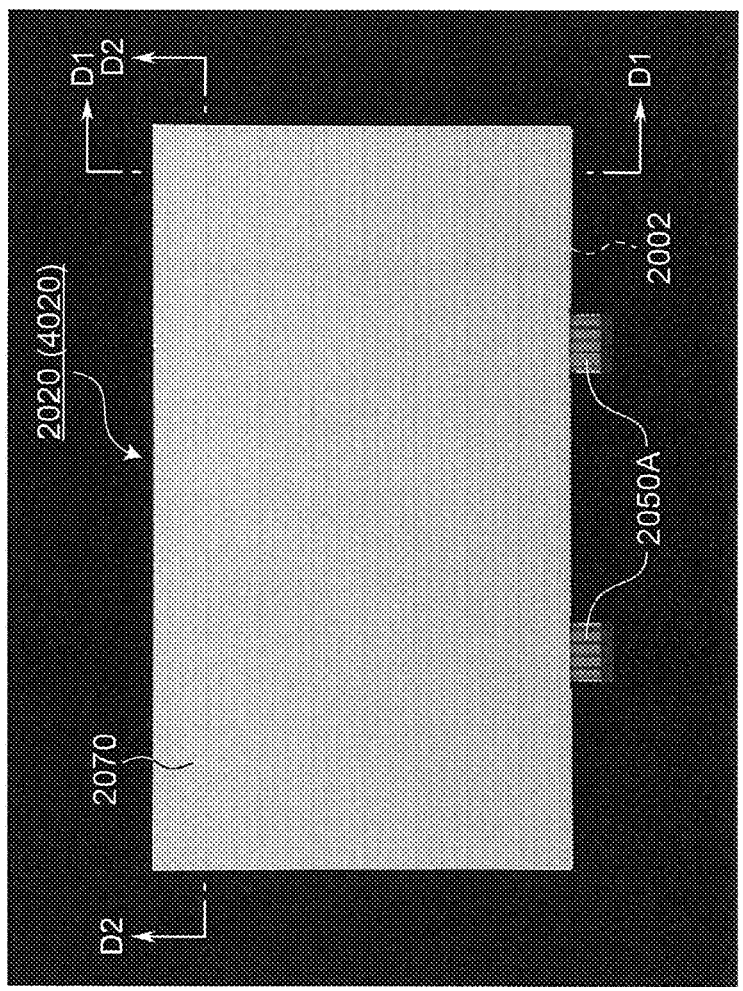
FIG. 14A is a schematic front view of a second reference embodiment on a colored photograph according to the present disclosure.
Figure 14B:
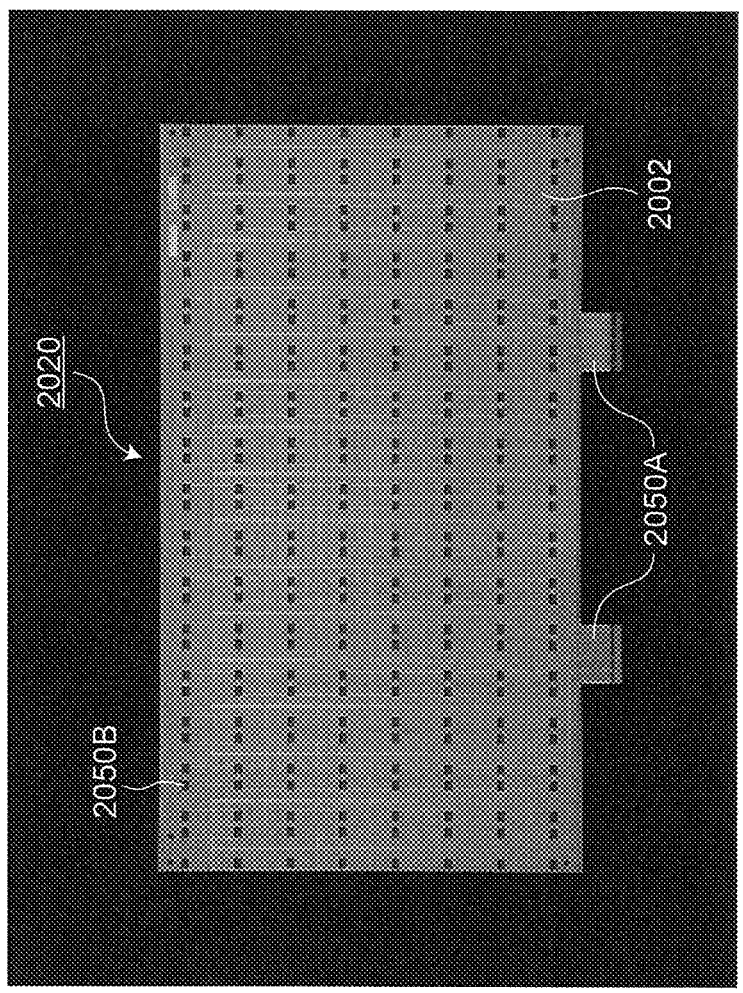
FIG. 14B is a schematic back view of the second reference embodiment on a colored photograph according to the present disclosure.
Figure 14C:
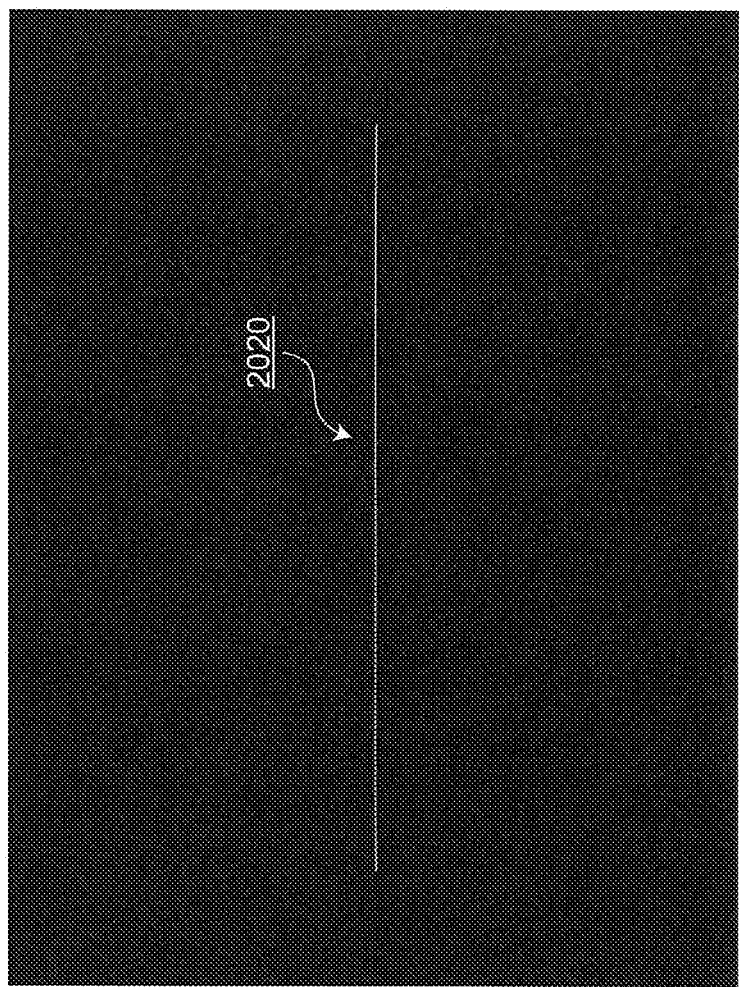
FIG. 14C is a schematic plan view of the second reference embodiment on a colored photograph according to the present disclosure.
Figure 14D:
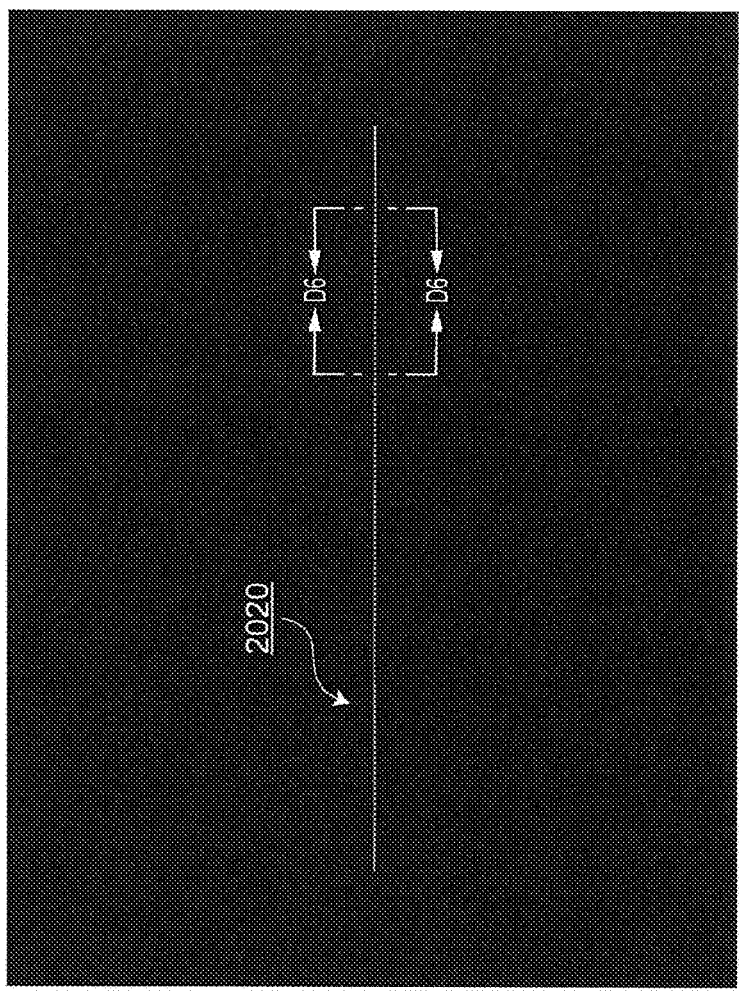
FIG. 14D is a schematic bottom view of the second reference embodiment on a colored photograph according to the present disclosure.
Figure 14E:
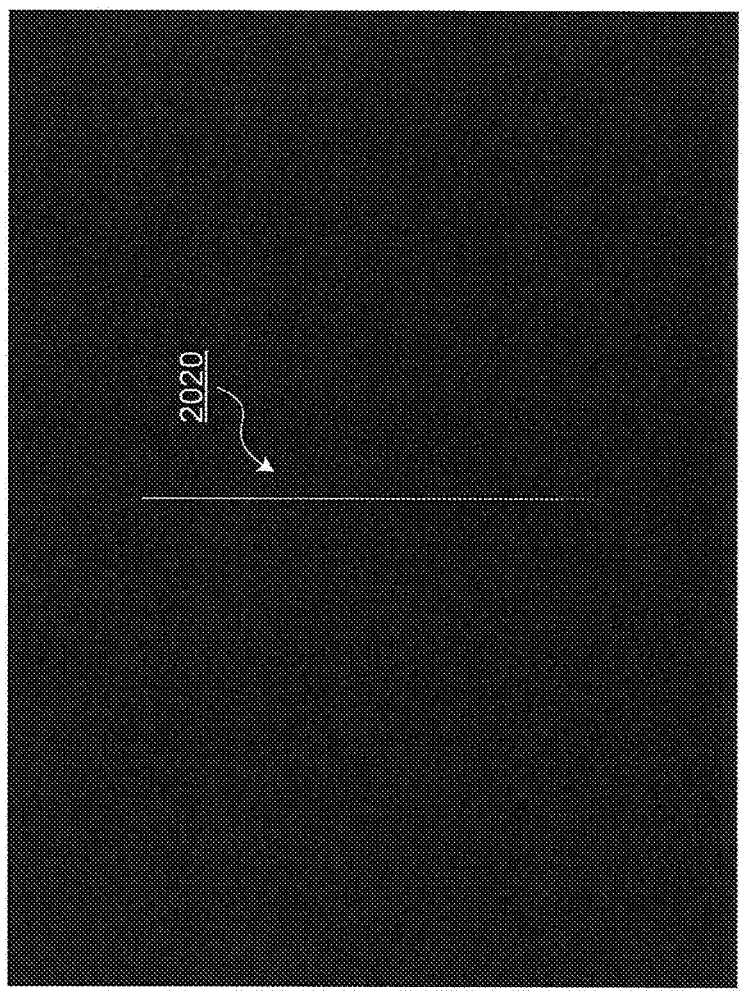
FIG. 14E is a schematic right-side view of the second reference embodiment on a colored photograph according to the present disclosure.
Figure 14F:
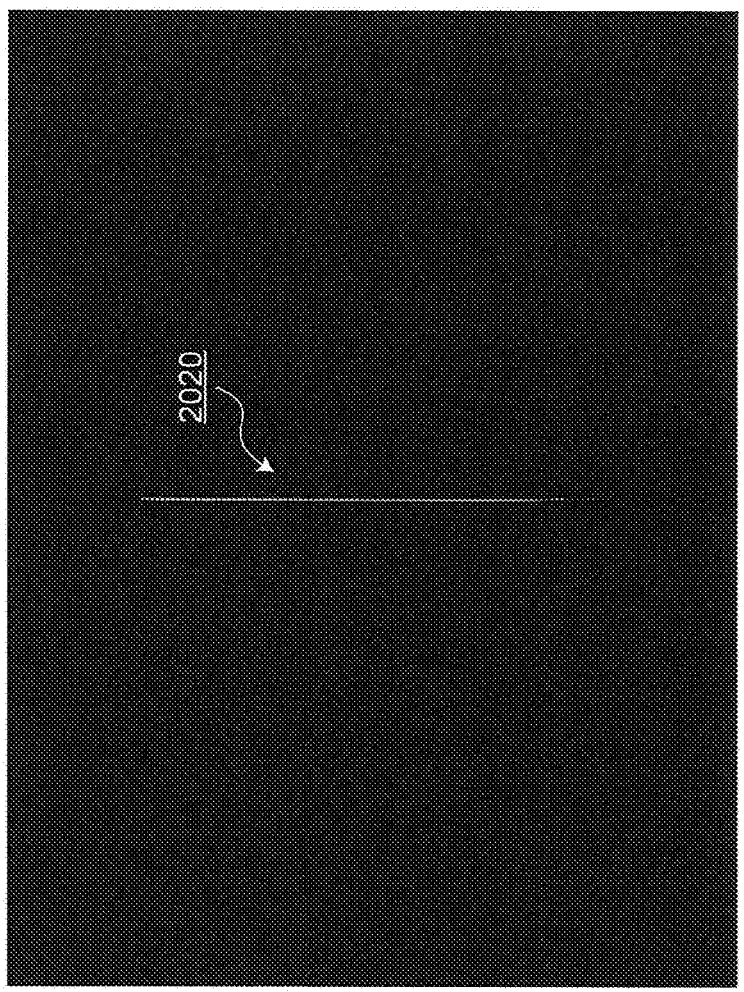
FIG. 14F is a schematic left-side view of the second reference embodiment on a colored photograph according to the present disclosure.
Figure 14G:
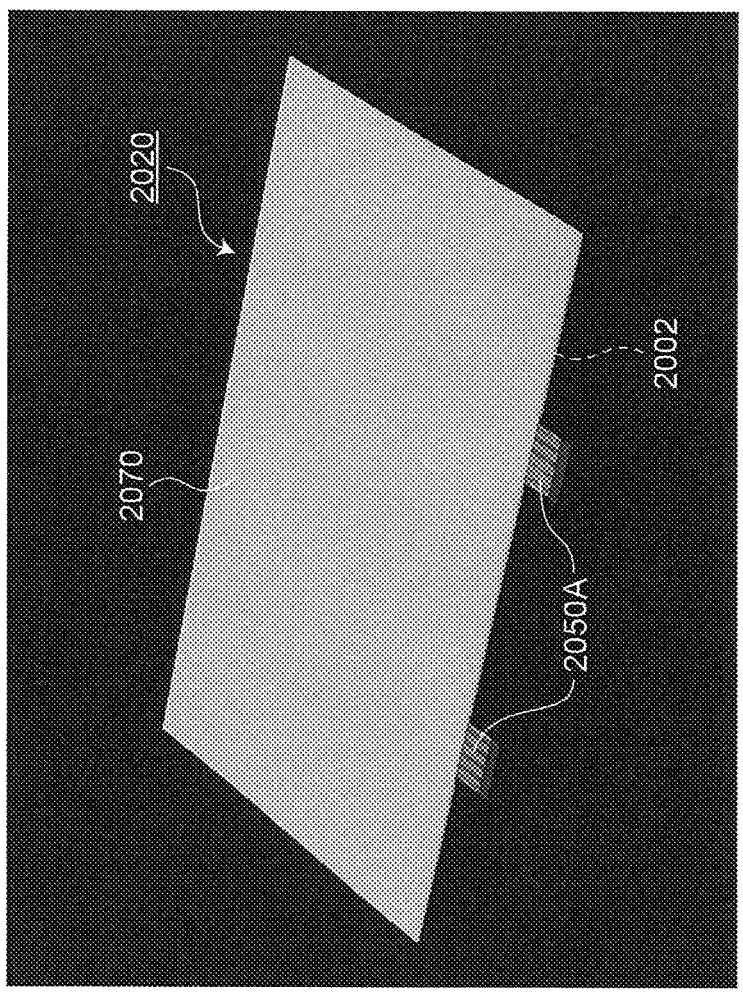
FIG. 14G is a schematic perspective view illustrating a front surface, a bottom surface, and a right-side surface of the second reference embodiment on a colored photograph according to the present disclosure.
Figure 14H:
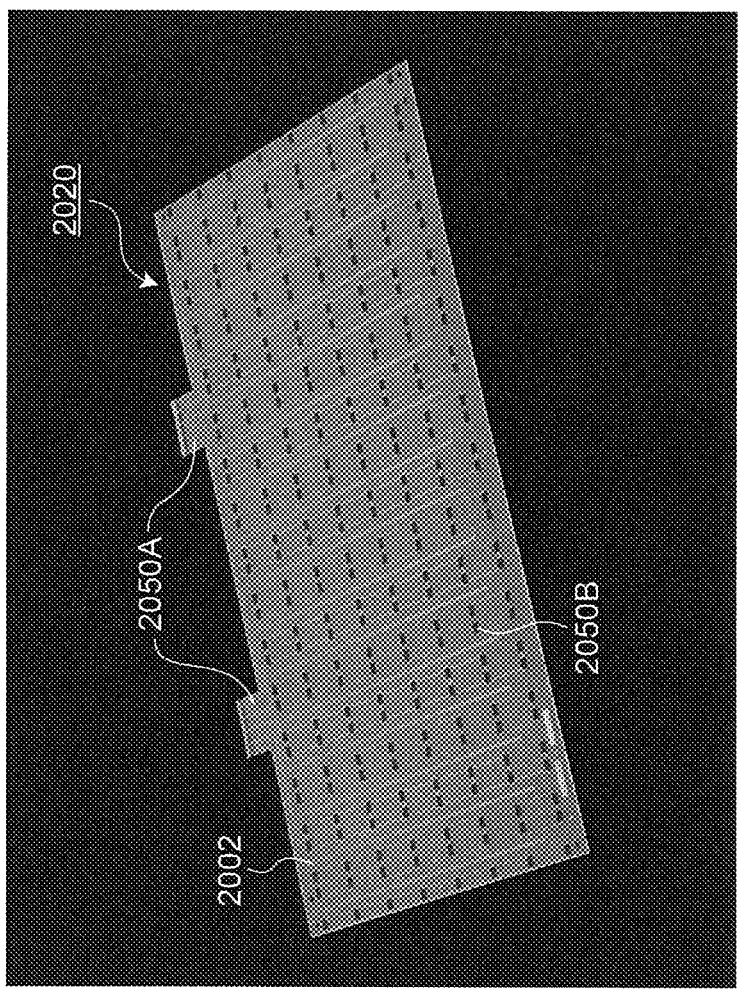
FIG. 14H is a schematic perspective view illustrating a back surface, a plan surface, and a left-side surface of the second reference embodiment on a colored photograph according to the present disclosure.
Figure 14I:
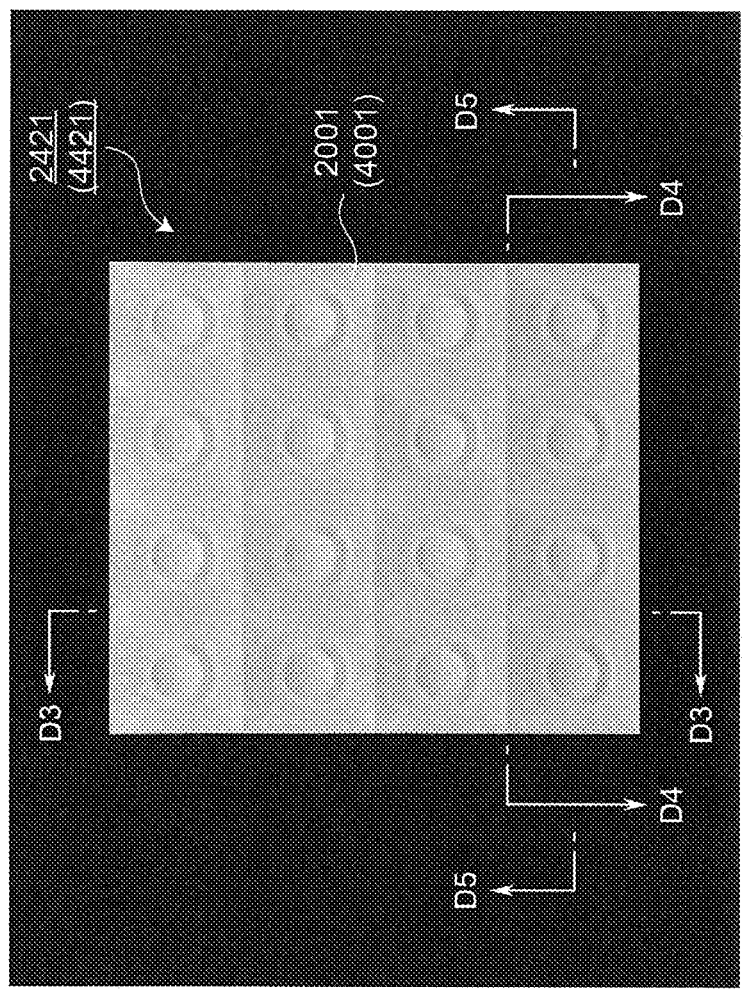
FIG. 14I is a schematic partial enlarged view of a D1-D2 portion in FIG. 14A.
Figure 14J:
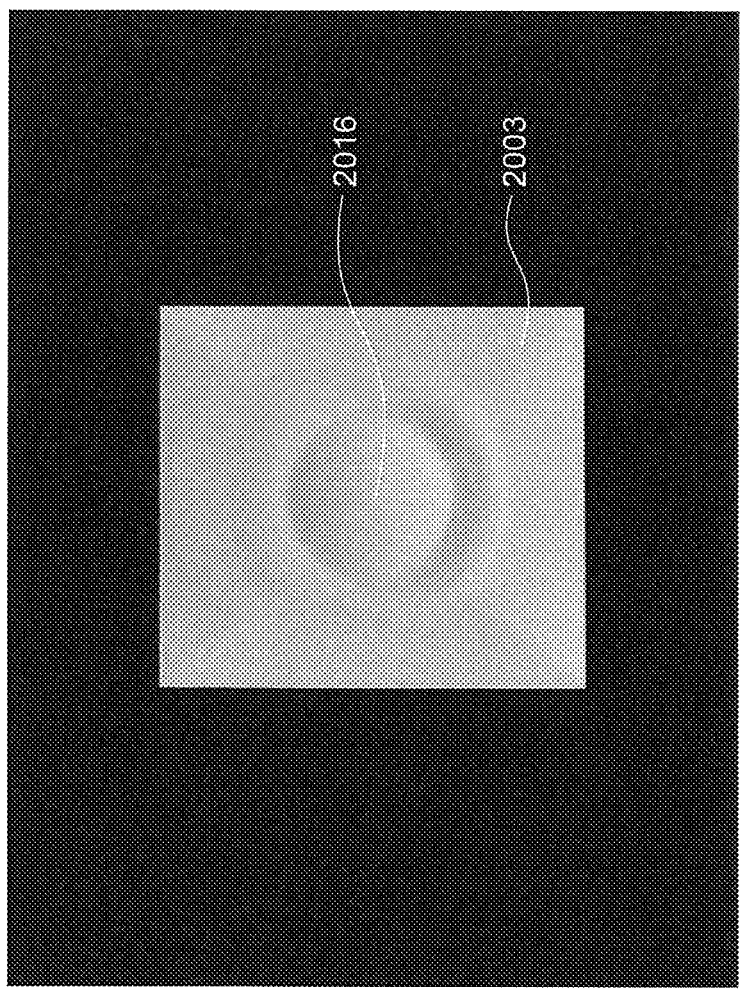
FIG. 14J is a schematic partial enlarged view of a D3-D4 portion in FIG. 14I.
Figure 14K:
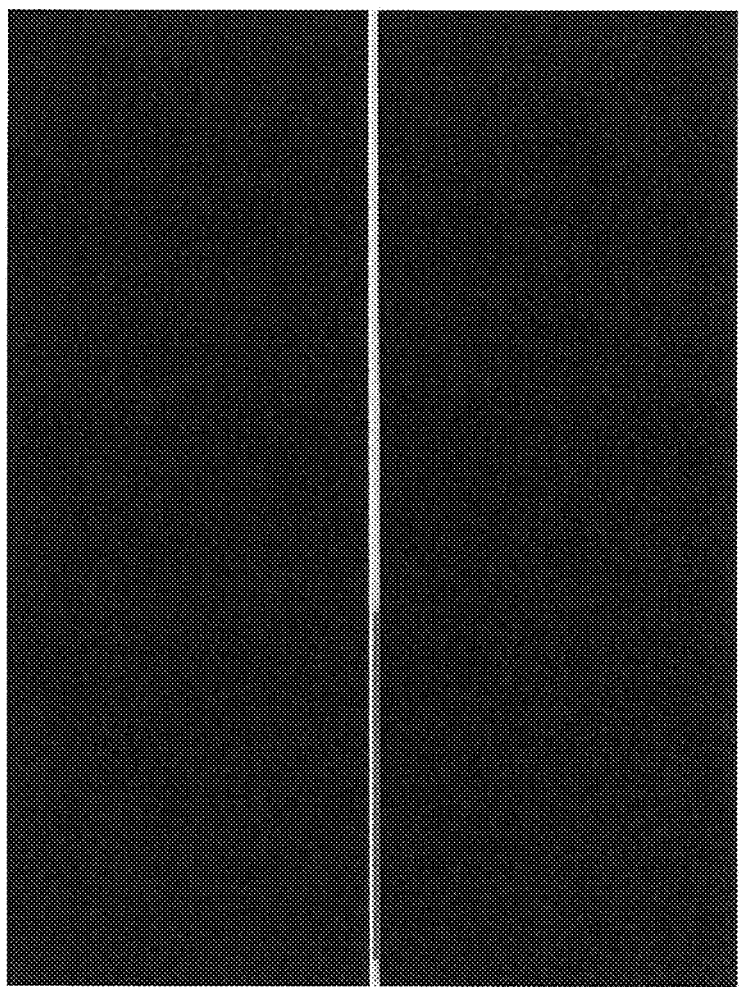
FIG. 14K is a schematic partial enlarged view of a D6-D6 portion in FIG. 14D.
Figure 14L:
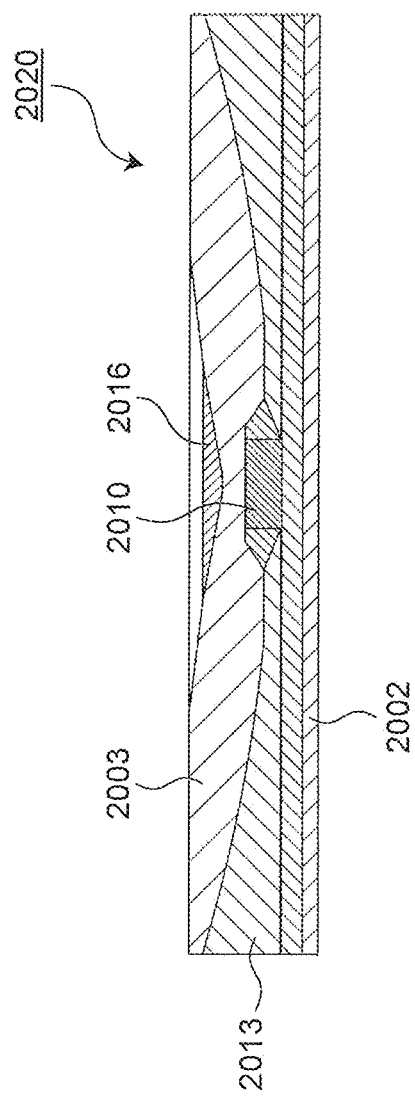
FIG. 14L is a schematic partial enlarged cross-sectional view taken along a line D5-D5 of a D3-D3 portion in FIG. 14I in which internal mechanisms are omitted.
Figure 14M:
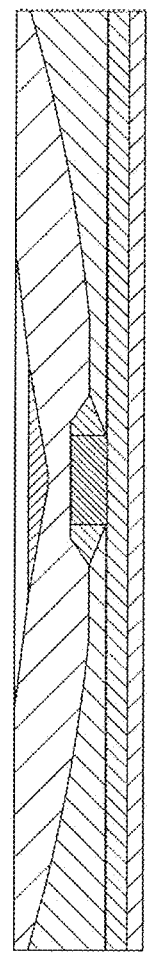
FIG. 14M is a schematic enlarged view shown in FIG. 14L with the reference numerals removed.
Figure 14N:
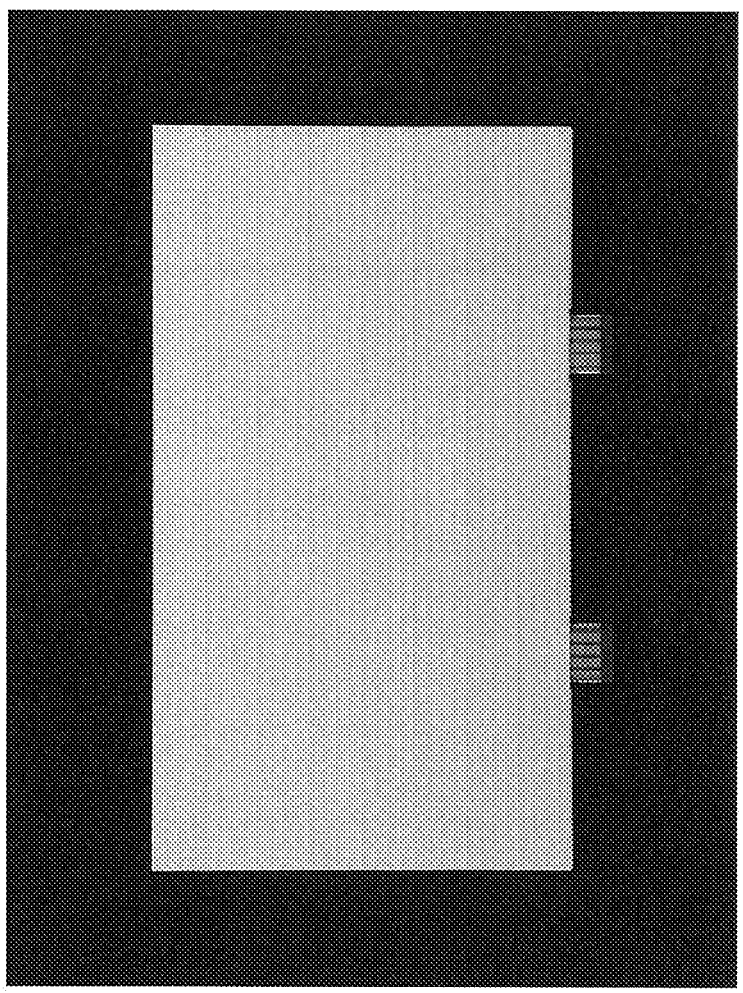
FIG. 14N is a schematic front view shown in FIG. 14A on a colored photograph with the reference numerals removed.
Figure 14O:
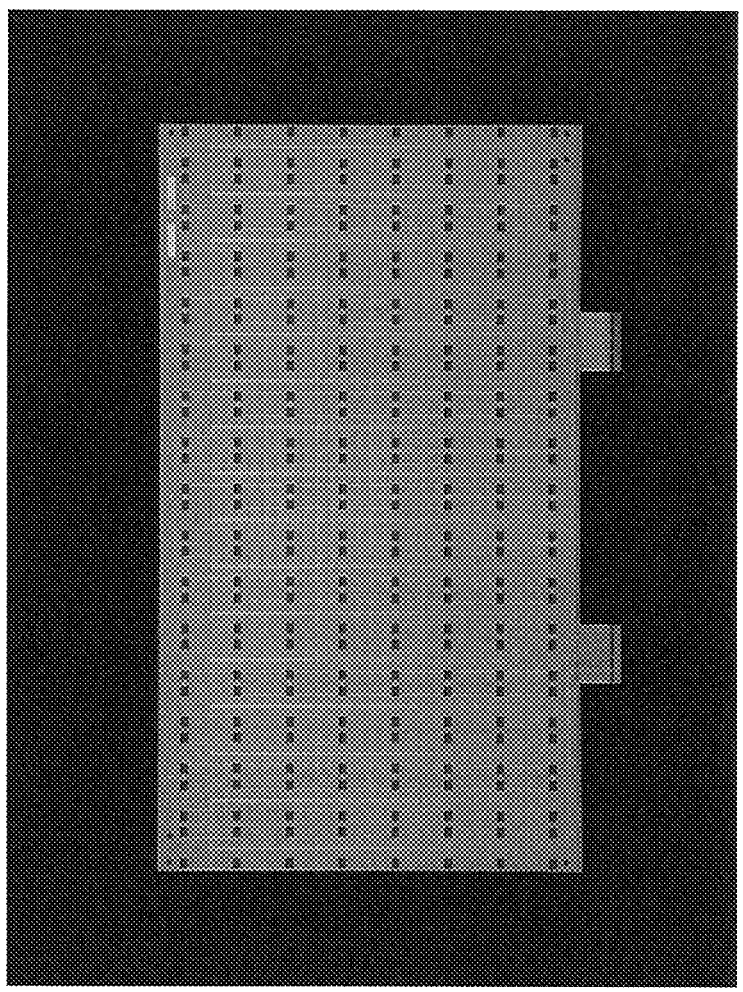
FIG. 14O is a schematic back view shown in FIG. 14B on a colored photograph with the reference numerals removed.
Figure 14P:
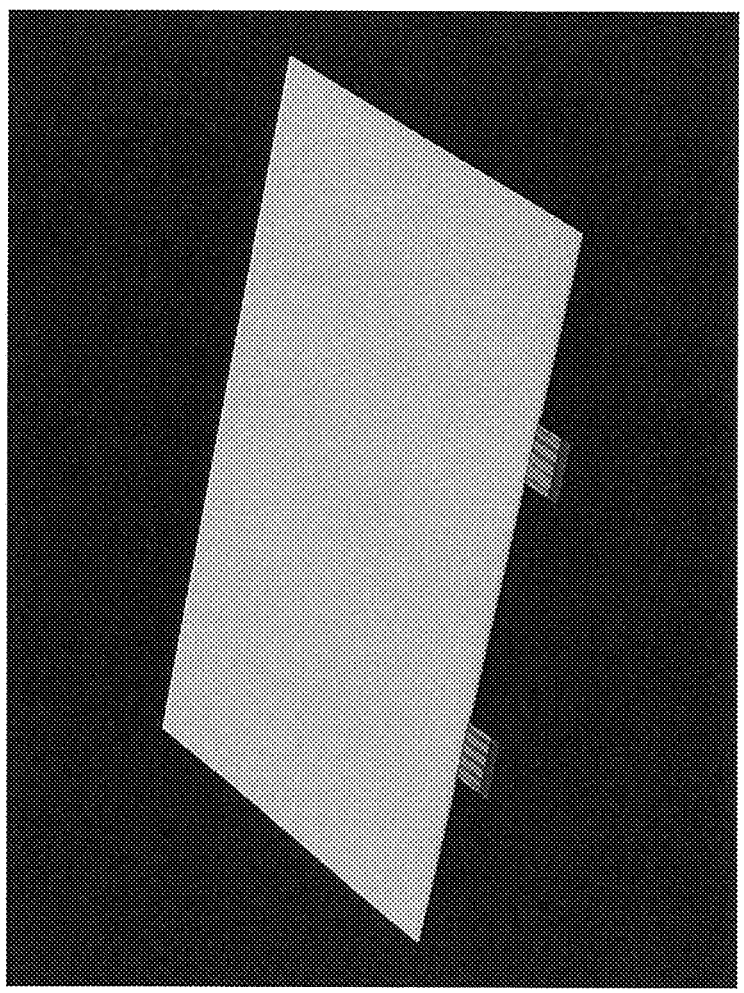
FIG. 14P is a schematic perspective view shown in FIG. 14G on a colored photograph with the reference numerals removed.
Figure 14Q:
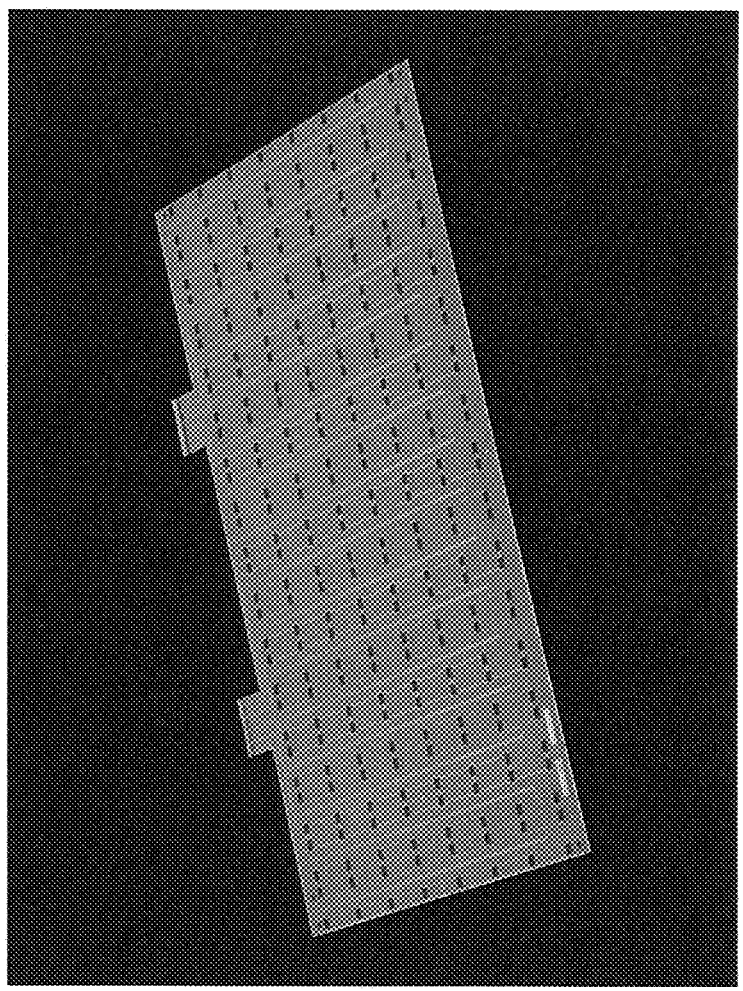
FIG. 14Q is a schematic perspective view shown in FIG. 14H on a colored photograph with the reference numerals removed.
Figure 14R:
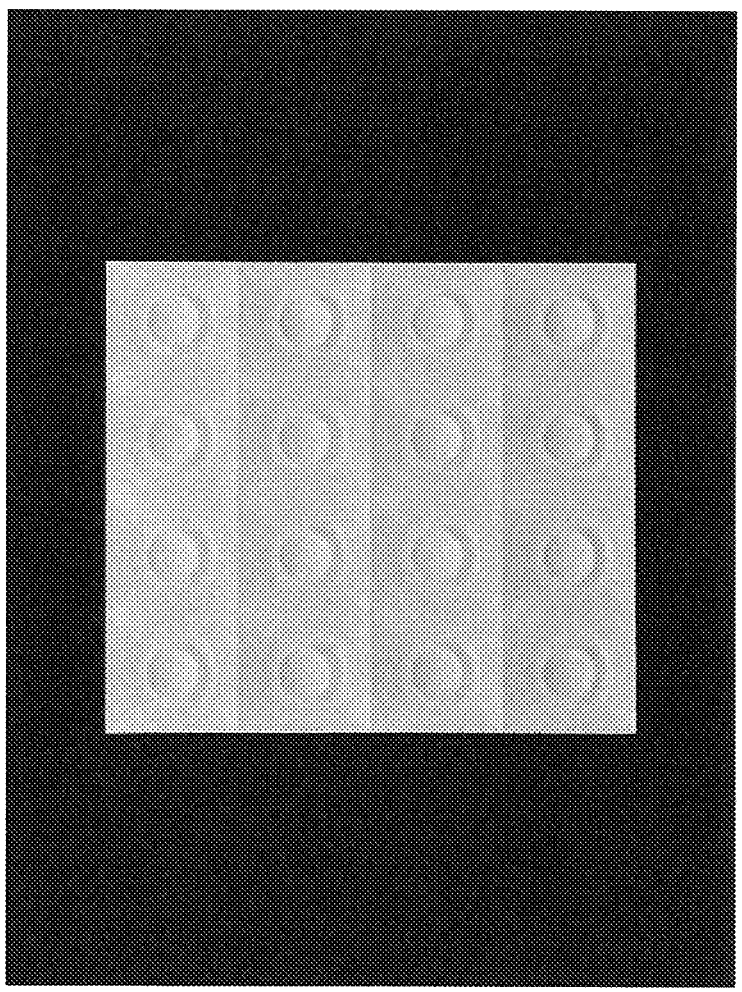
FIG. 14R is a schematic enlarged view shown in FIG. 14I on a colored photograph with the reference numerals removed.
Figure 14S:
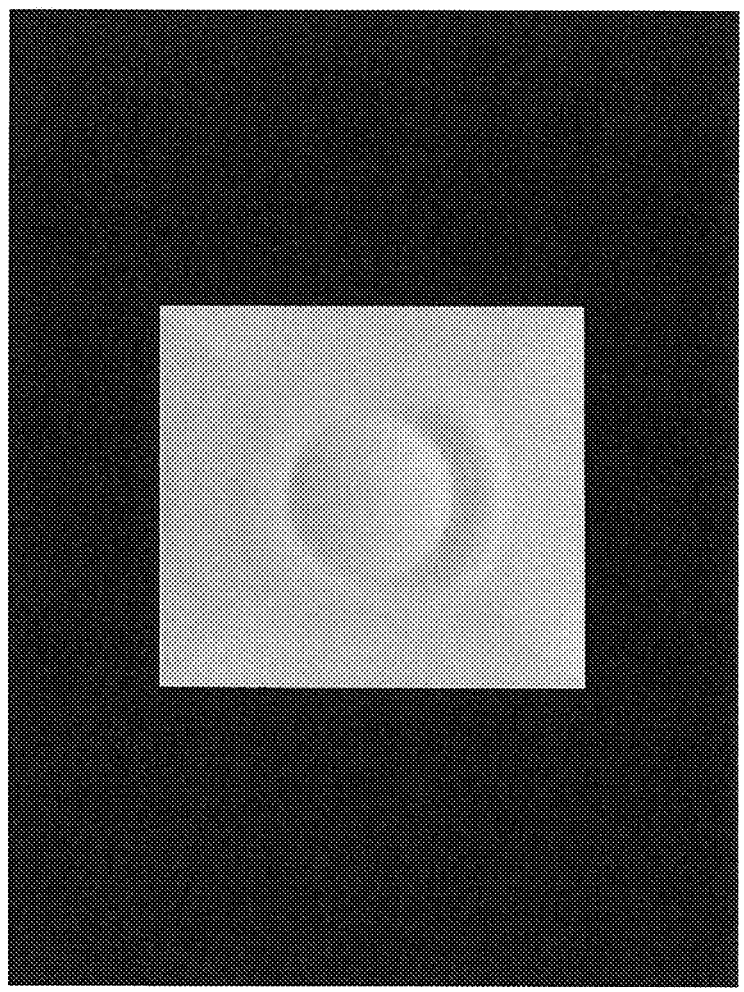
FIG. 14S is a schematic enlarged view shown in FIG. 14J on a colored photograph with the reference numerals removed.

FIGS. 14A to 14S illustrate a backlight 2020 for a liquid crystal display according to a second reference embodiment of the present disclosure (also referred to as an object of the present reference embodiment).

The object includes a plurality of light-emitting diode modules 2421 disposed on a flexible printed board 2002. A plurality of light-emitting regions 2001 are formed on a front surface of the light-emitting diode module 2421, and each of the light-emitting regions 2001 includes a light-adjusting portion 2016 and a light-guide portion 2003. This structure allows for reducing unevenness in luminance within each of the light-emitting regions 2001.

The plurality of light-emitting regions 2001 formed on a front surface (the light-emitting surface) of the object include the light-adjusting portions 2016 constituted of a light-transmissive body and the light-guide portions 2003 constituted of a transparent body.

The backlight 2020 for a liquid crystal display according to the second reference embodiment corresponds to a surface-emitting light source 20 of the embodiment. Electrode terminal portions 2050A of the second reference embodiment, for example shown in FIGS. 14A, 14B, 14G and 14H, correspond to terminals 50 of the embodiment. In FIGS. 14A and 14G; a surface with a reference numeral 2070 is a light-emitting surface of the second reference embodiment. Also, a flexible printed board 2002 of the second reference embodiment, for example shown in FIGS. 14A, 14B, 14G and 14H, corresponds to a wiring board 2 of the embodiment. In FIG. 14I, a region with a reference numeral 2001 is a light-emitting region of the second reference embodiment. In FIG. 14I, the light-emitting diode module 2421 of the second reference embodiment corresponds to a light-emitting module 421 of the embodiment. In FIG. 14L, the light-guide portion 2003 of the second reference embodiment is a light-guide portion 3 of the embodiment. Also, FIG. 14L shows the light-adjusting portion 2016 of the second reference embodiment that corresponds to a light-reflective layer 16 of the embodiment. In FIG. 14L, a light-emitting portion (a light-emitting diode) 2010 of the second reference embodiment corresponds to a light source 10 of the embodiment. Also, a light-reflective portion 2013 of the second reference embodiment shown in FIG. 14L corresponds to a unit first wall portion 13 or a unit second wall portion 15 of the embodiment. Further, the light-guide portion 2003 and the light-adjusting portion 2016 may appropriately contain light-diffusing particles. As shown in FIGS. 14I, 14J, 14R, and 14S, in a front view of the main body (the light-emitting surface) of the object (the backlight 2020 for a liquid crystal display), the inner structures are not visible.

FIGS. 15A to 15K illustrate a light-emitting diode module 3421 according to a third reference embodiment of the present disclosure (also referred to as an object of the present reference embodiment).

In a reference drawing 1 of a schematic front view shown in gray, the gray portion is a light-adjusting portion 3016 constituted of a light-transmissive body. In a reference drawing 2 of a schematic front view shown in gray, the gray portion is a light-guide portion 3003 made of a transparent body.

Figure 15A:
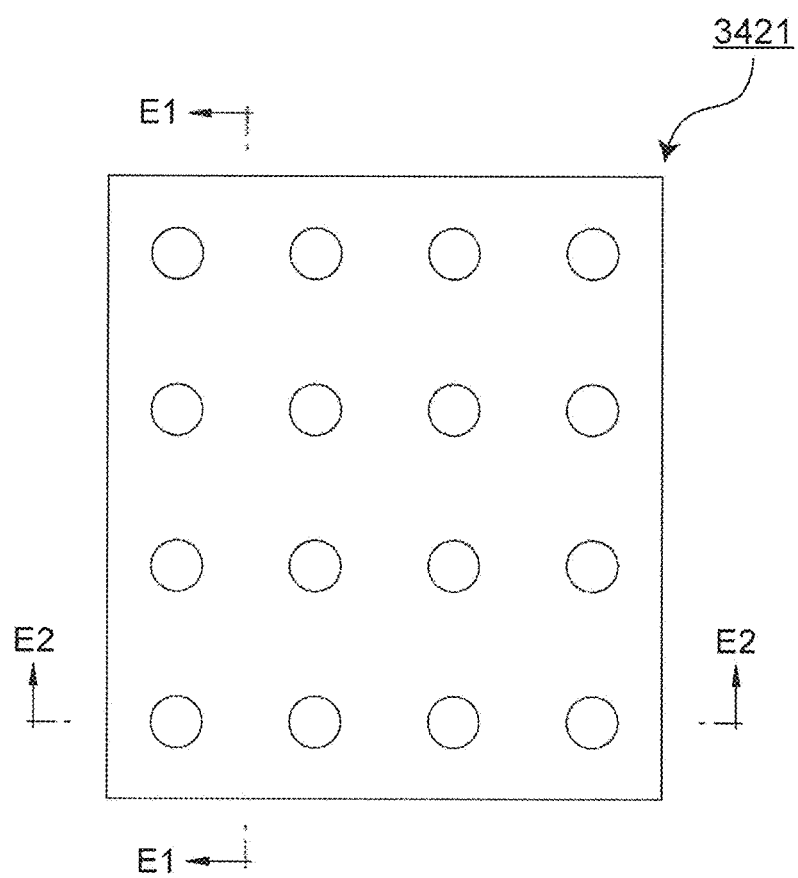
FIG. 15A is a schematic front view of a third reference embodiment according to the present disclosure.
Figure 15B:
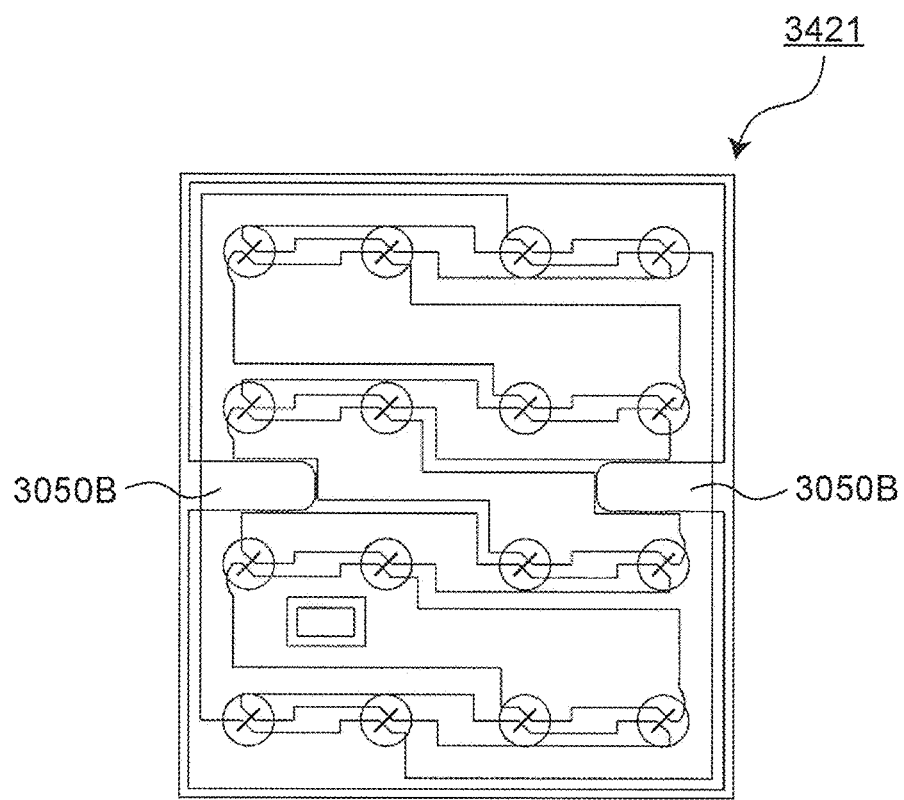
FIG. 15B is a schematic back view of the third reference embodiment according to the present disclosure.
Figure 15C:
FIG. 15C is a schematic plan view of the third reference embodiment according to the present disclosure.
Figure 15D:
FIG. 15D is a schematic bottom view of the third reference embodiment according to the present disclosure.
Figure 15E:
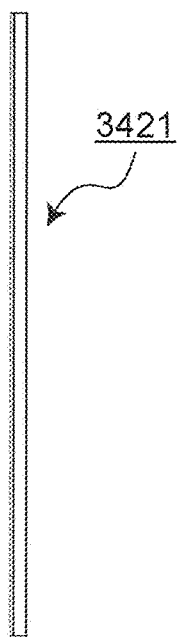
FIG. 15E is a schematic right-side view of the third reference embodiment according to the present disclosure.
Figure 15F:
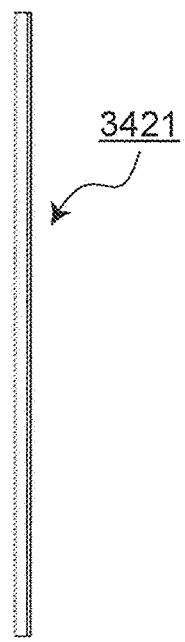
FIG. 15F is a schematic left-side view of the third reference embodiment according to the present disclosure.
Figure 15G:
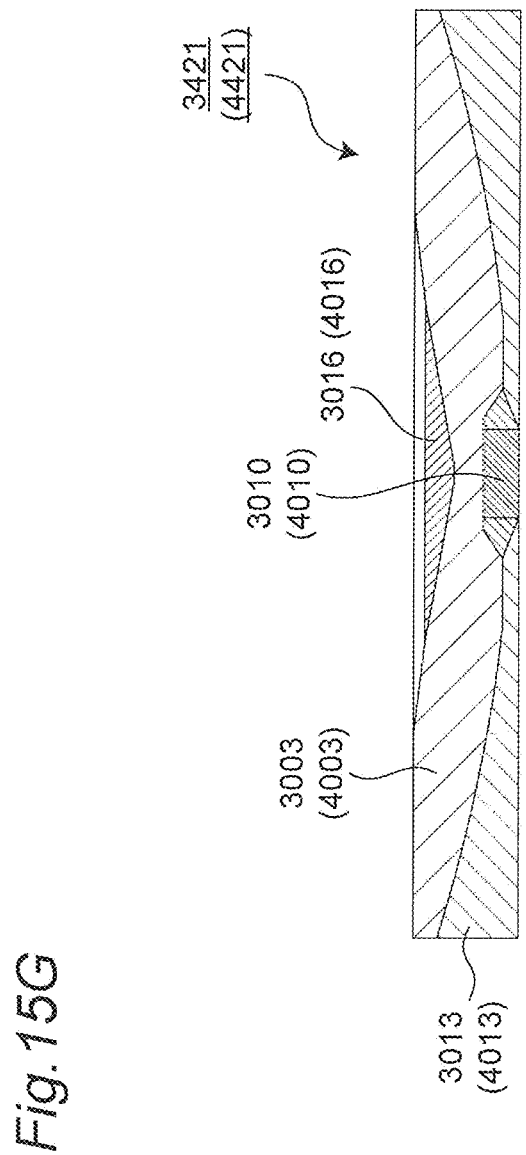
FIG. 15G is a schematic partial enlarged cross-sectional view taken along a line E2-E2 of an E1-E1 portion in FIG. 15A in which internal mechanisms are omitted.
Figure 15H:
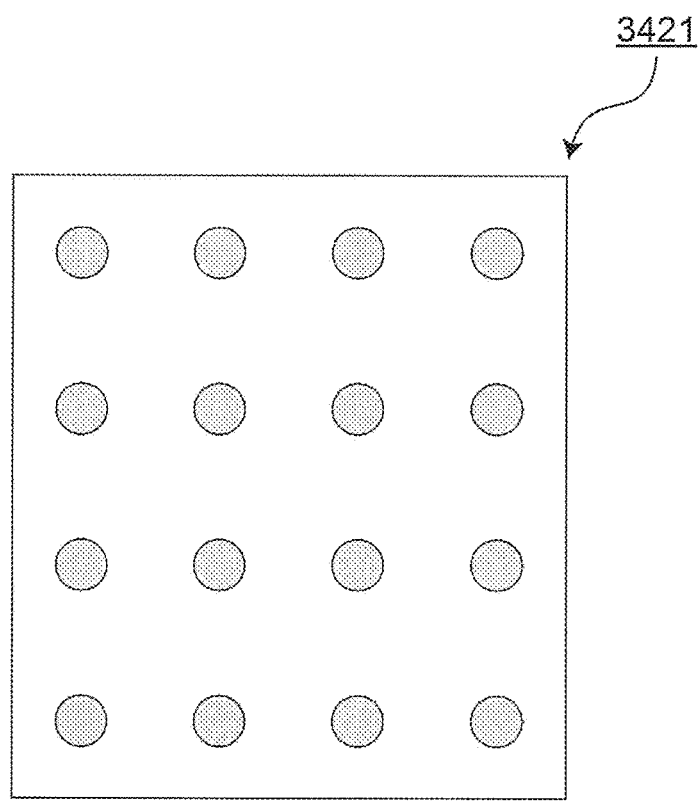
FIG. 15H is a reference drawing 1 of a schematic front view of the third reference embodiment according to the present disclosure, shown in gray.
Figure 15I:
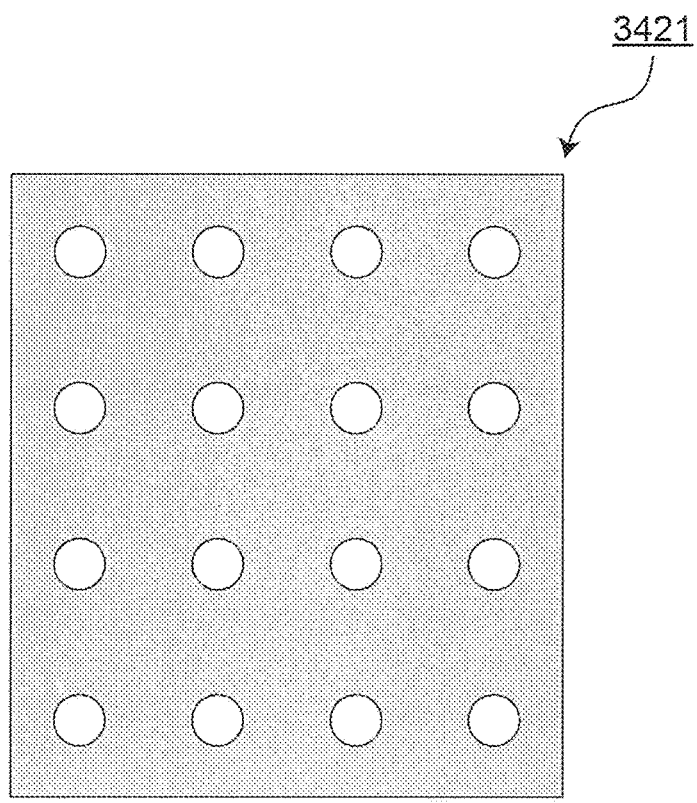
FIG. 15I is a reference drawing 2 of a schematic front view of the third reference embodiment according to the present disclosure, shown in gray.
Figure 15J:
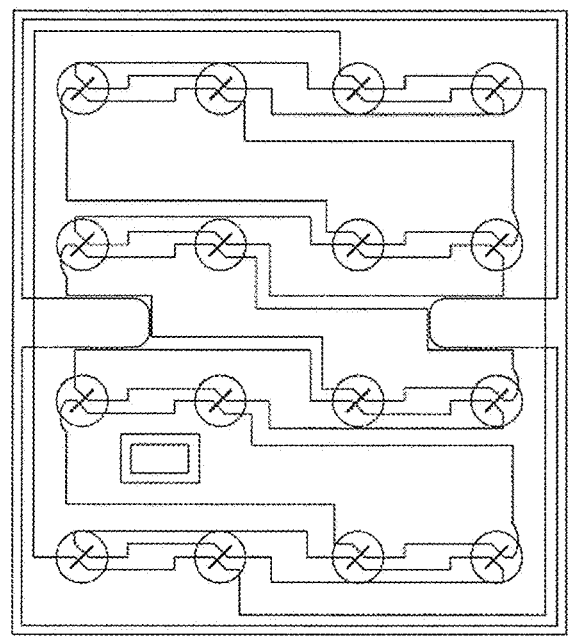
FIG. 15J is a schematic back view shown in FIG. 15B with the reference numerals removed.
Figure 15K:
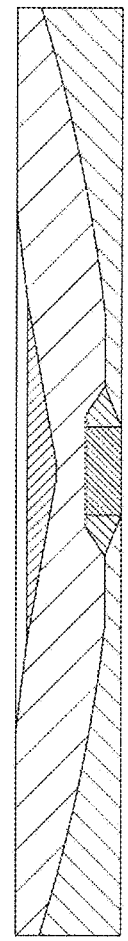
FIG. 15K is a schematic enlarged view shown in FIG. 15G with the reference numerals removed.

The light-emitting diode module 3421 of the third reference embodiment corresponds to a light-emitting module 421 of the embodiment. In FIG. 15B, portions with a reference numeral 3050B represent electrode terminal portions 3050B formed on a back surface of the light-emitting diode module 3421 according to the third reference embodiment. A light-emitting portion (a light-emitting diode) 3010 of the third reference embodiment shown in FIG. 15G corresponds to a light source 10 of the embodiment. Also, the light-guide portion 3003 shown in FIG. 15G corresponds to a light-guide portion 3 of the embodiment. Also, the light-adjusting portion 3016 of the third reference embodiment shown in FIG. 15G corresponds to a light-reflective layer 16 of the embodiment. A light-reflective portion 3013 of the third reference embodiment shown in FIG. 15G corresponds to a unit first wall portion 13 or a unit second wall portion 15 of the embodiment.

FIGS. 16A to 16J illustrate a light-emitting diode module 4421 according to a fourth reference embodiment of the present disclosure (also referred to as an object of the present reference embodiment).

A front view of the light-emitting diode module 4421 of the fourth embodiment on a colored photograph is identical to FIG. 14I. Hence, FIG. 14J also illustrates a schematic enlarged view of the light-emitting diode module 4421 of the fourth embodiment. Also, a schematic enlarged cross-sectional view of the fourth embodiment in which internal mechanisms are omitted is identical to the schematic enlarged cross-sectional view shown in FIG. 15G.

A front surface of the object includes a plurality of light-emitting regions 4001, and the light-emitting regions 4001 include light-adjusting portions 4016 and light-guide portions 4003. This structure allows for reducing unevenness in luminance within each of the light-emitting regions 4001. The object herein is the light-emitting diode module 4421.

The plurality of light-emitting regions 4001 on the front surface of the object 4421 include the light-adjusting portion 4016 constituted of a light-transmissive body and the light-guide portion 4003 constituted of a transparent body.

Figure 16A:
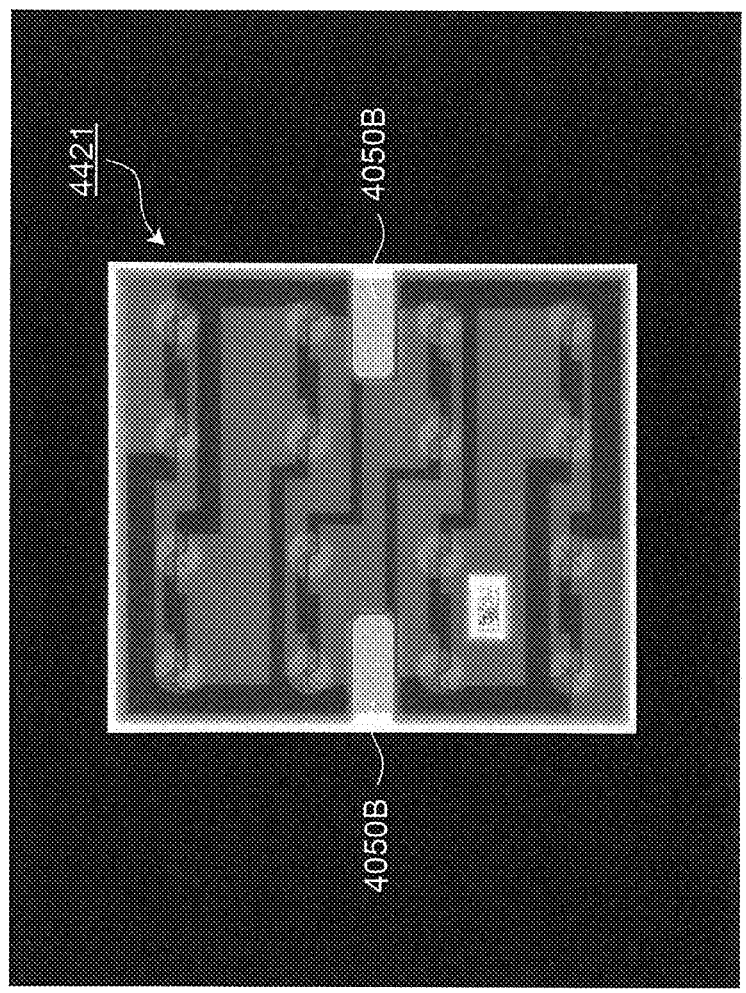
FIG. 16A is a schematic back view of a fourth reference embodiment on a colored photograph according to the present disclosure.
Figure 16B:
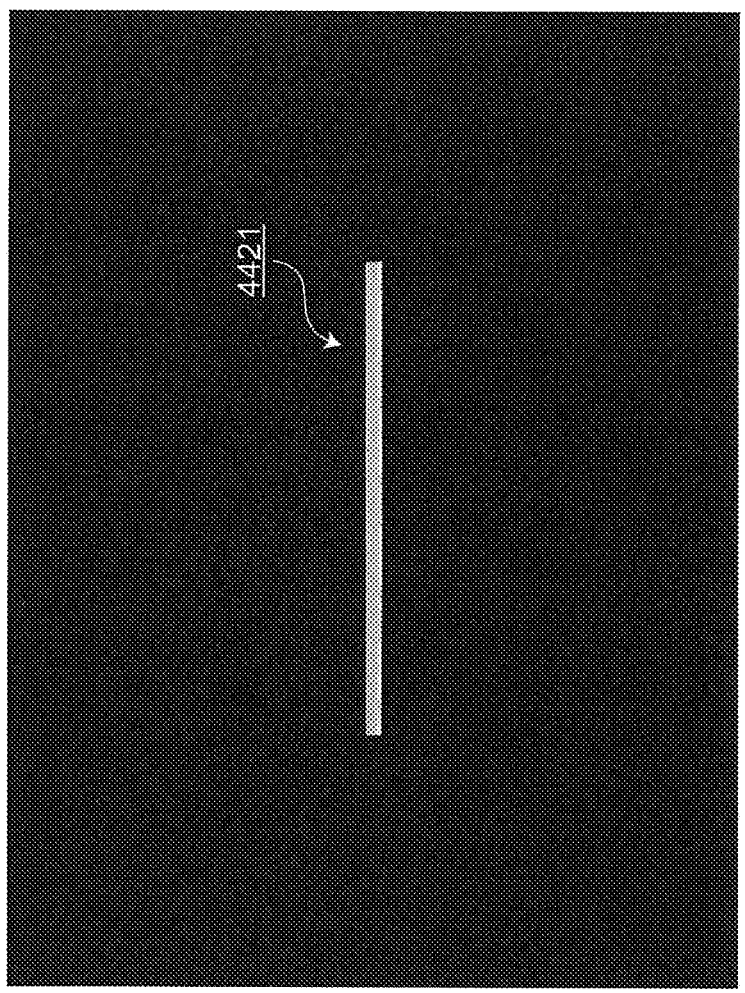
FIG. 16B is a schematic plan view of the fourth reference embodiment on a colored photograph according to the present disclosure.
Figure 16C:
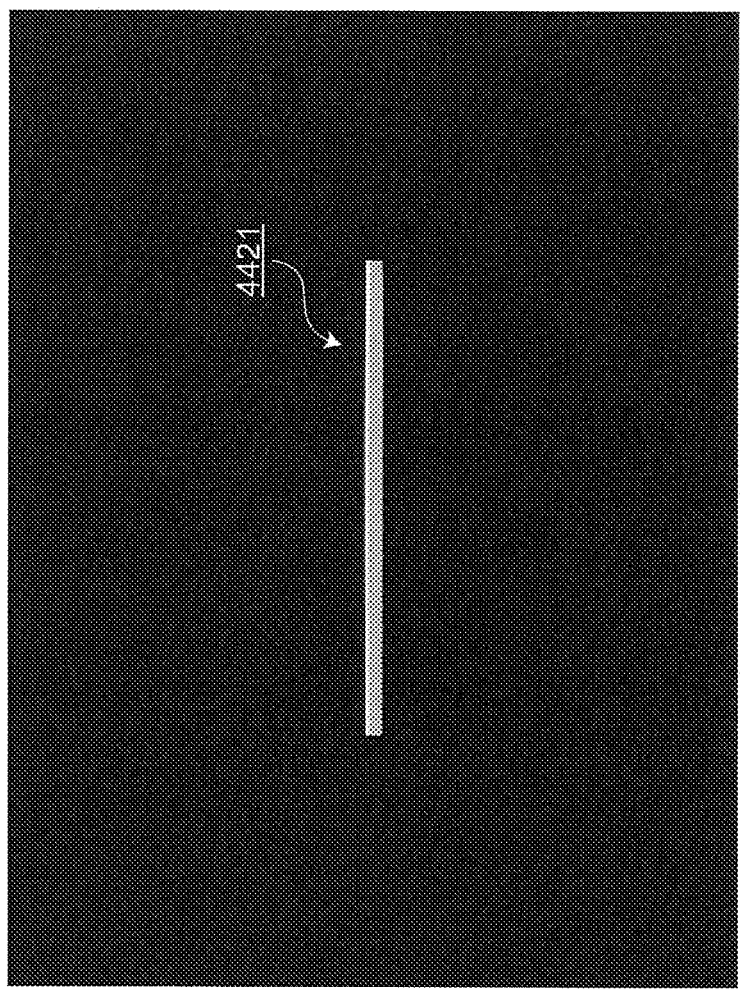
FIG. 16C is a schematic bottom view of the fourth reference embodiment on a colored photograph according to the present disclosure.
Figure 16D:
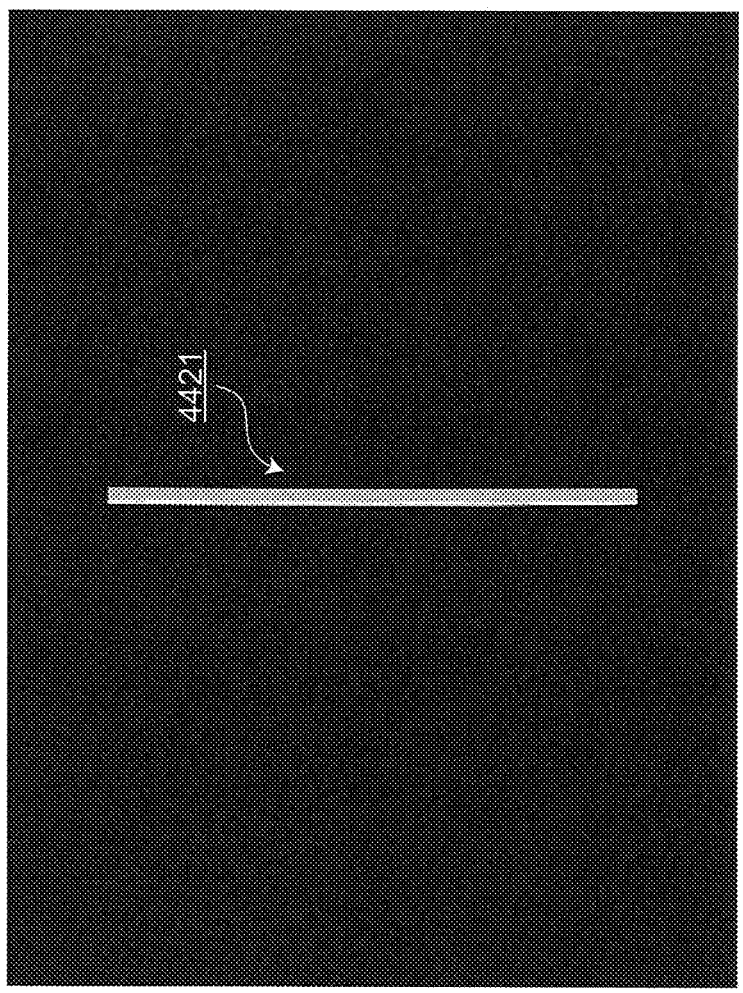
FIG. 16D is a schematic right-side view of the fourth reference embodiment on a colored photograph according to the present disclosure.
Figure 16E:
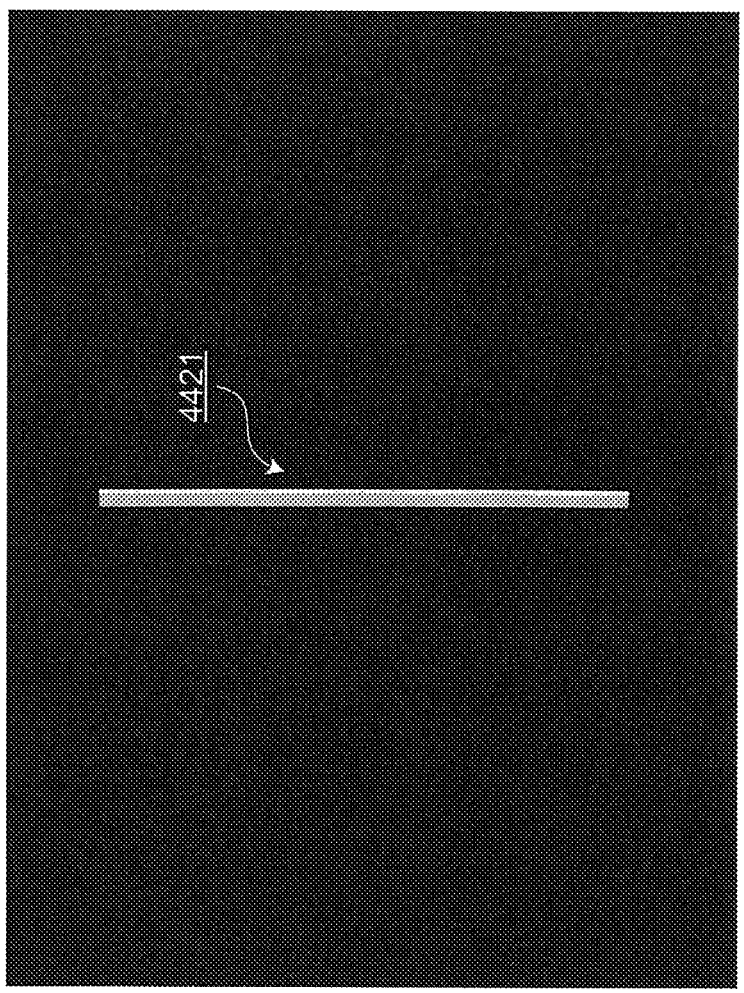
FIG. 16E is a schematic left-side view of the fourth reference embodiment on a colored photograph according to the present disclosure.
Figure 16F:
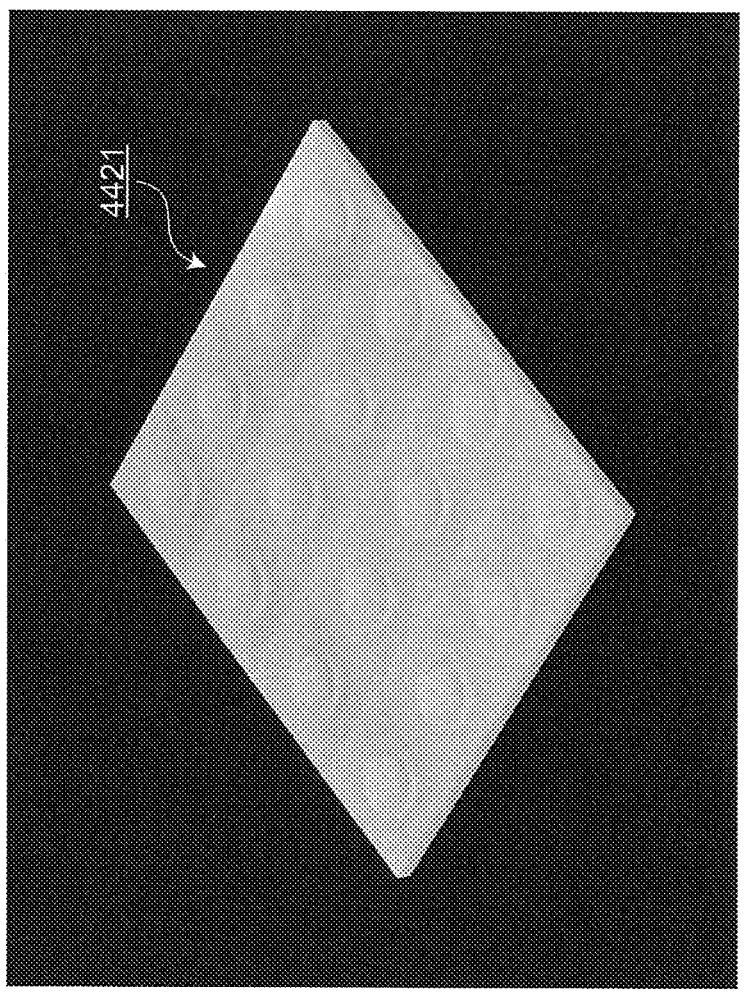
FIG. 16F is a schematic perspective view illustrating a front surface, a bottom surface, and a right-side surface of the fourth reference embodiment on a colored photograph according to the present disclosure.
Figure 16G:
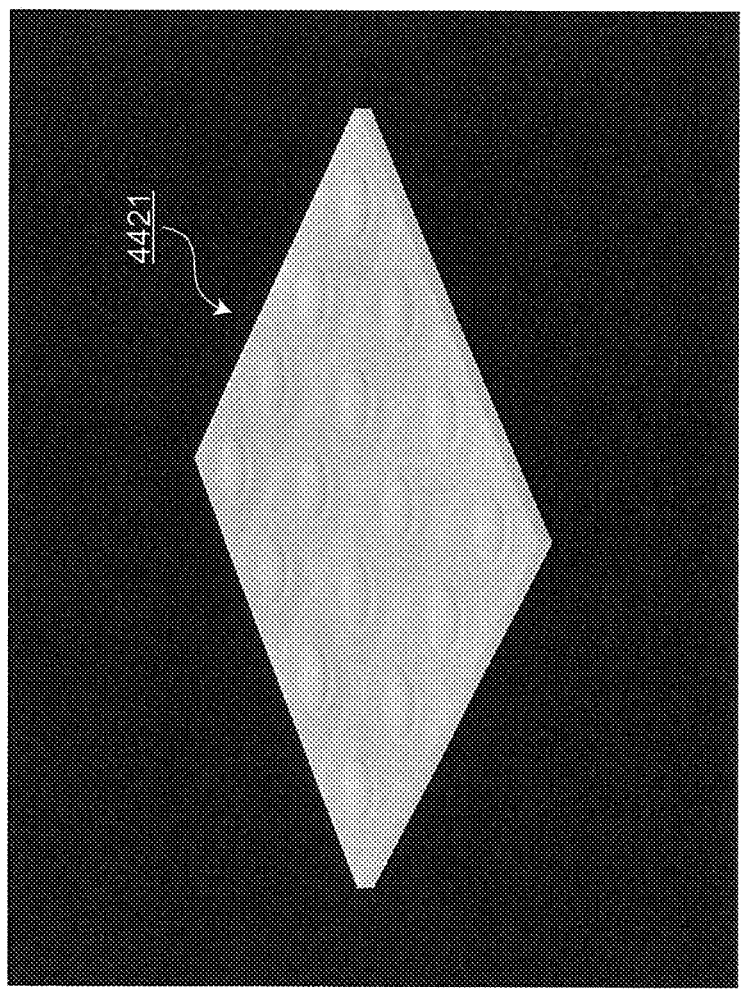
FIG. 16G is a schematic perspective view illustrating a front surface, a bottom surface, and a right-side surface of the fourth reference embodiment on a colored photograph according to the present disclosure.
Figure 16H:
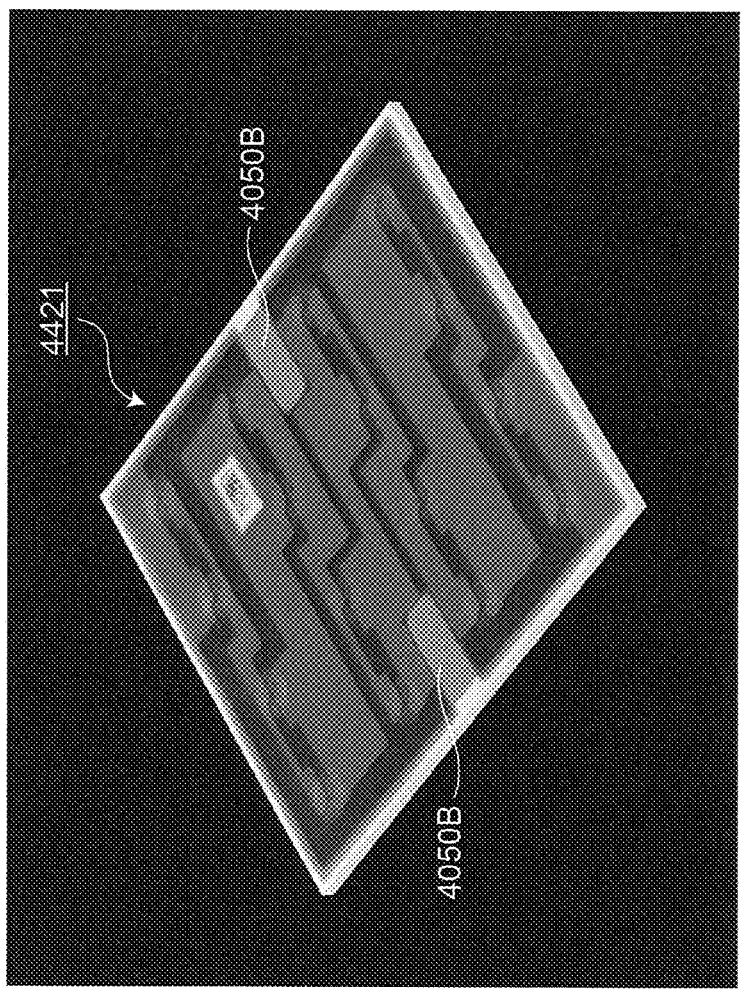
FIG. 16H is a schematic perspective view illustrating a back surface, a plan surface, and a left-side surface of the fourth reference embodiment on a colored photograph according to the present disclosure.
Figure 16I:
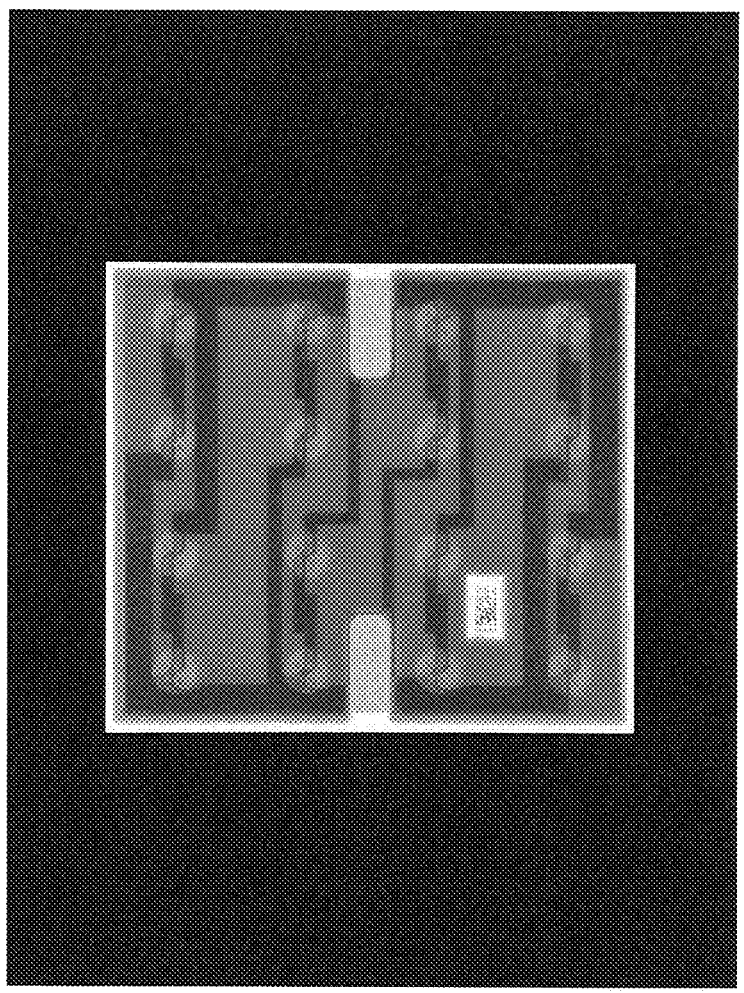
FIG. 16I is a schematic back view shown in FIG. 16A on a colored photograph with the reference numerals removed.
Figure 16J:
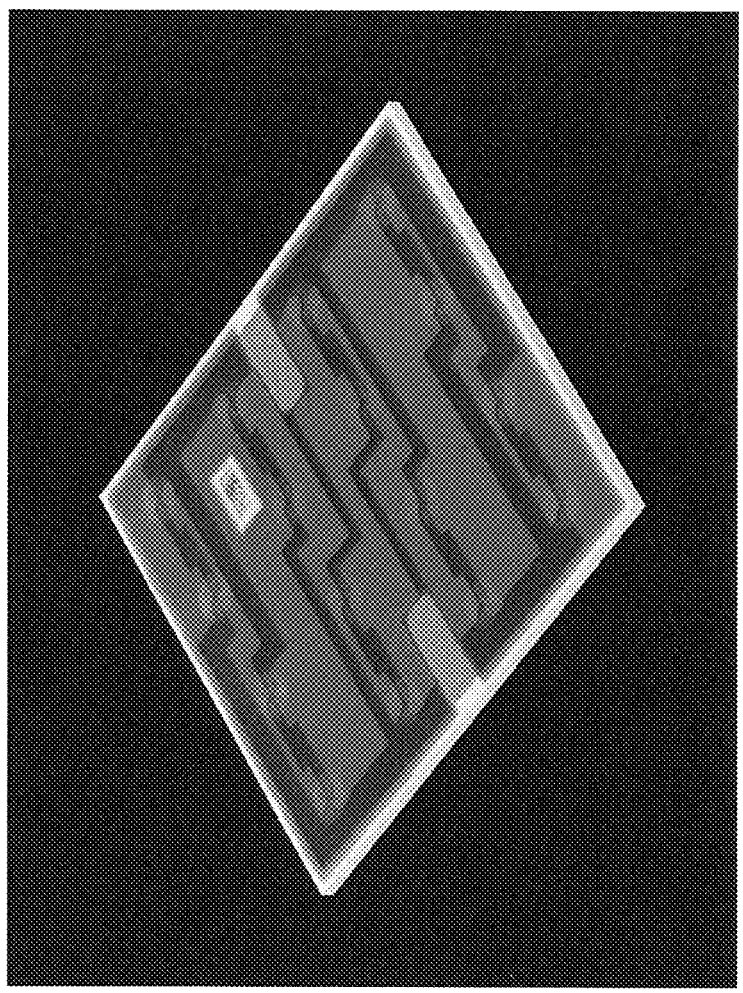
FIG. 16J is a schematic perspective view shown in FIG. 16H on a colored photograph with the reference numerals removed.

The light-emitting diode module 4421 of the fourth reference embodiment corresponds to a light-emitting module of the embodiment. In FIG. 16A, portions with a reference numeral 4050B represents electrode terminal portions 4050B formed on a back surface of the light-emitting diode module 4421 according to the fourth reference embodiment. A light-emitting portion (a light-emitting diode) 4010 of the fourth reference embodiment shown in FIG. 15G corresponds to a light source 10 of the embodiment. Also, the light-guide portion 4003 shown in FIG. 15G corresponds to a light-guide portion 3 of the embodiment. The light-adjusting portion 4016 of the fourth reference embodiment shown in FIG. 15G corresponds to a light-reflective layer 16 of the embodiment. A light-reflective portion 4013 of the fourth reference embodiment shown in FIG. 15G corresponds to a unit first wall portion 13 or a unit second wall portion 15 of the embodiment. Also, FIG. 14A illustrates a backlight 4020 for a liquid crystal display, which is a reference front view showing a use state of a light-emitting diode module 4421 according to the fourth reference embodiment.

Further, in the same manner as the second reference embodiment, the light-guide portion 4003 and the light-adjusting portion 4016 appropriately contain light-diffusing particles. In a front view of the main body (the light-emitting surface) of the object (the backlight 2020 for a liquid crystal display), inner structures are not visible as shown in FIGS. 14I, 14J, 16F, 16G, 14R and 14S.

Example 1

A surface-emitting light source of Example 1 was manufactured as below.

First, the light guide plate 103 having a thickness t1 of 0.74 mm was provided, and the first recesses 4, the second recesses 5, the third recesses 6, and the fourth recesses 7 were formed using metal molds. The depth d1 of the first recess 4 was set to 0.2 mm. The depth d2 of the third recess 6 was set to 0.34 mm. The depth of the second recess 5 was set appropriately according to the height h1 of the central portion 13h and the height h2 of both end portions 13e and 13f of the unit first wall portion 13, which will be described below.

Next, the liquid bonding material 40 was disposed in the first recess 4, and the light source 10 was mounted on the liquid bonding material 40. Further, a portion of the light source 10 is embedded in the bonding material 40, and the bonding material 40 was cured to bond the light source and the light guide plate 103.

Next, the light-reflective member 11 was formed to cover the lower surface 103b of the light guide plate 103 and the plurality of light sources 10. Then, the whole surface of the light-reflective member 11 was removed to expose the electrodes 33 of the light sources 10.

Next, the wiring layer 60 was formed on the electrodes 33 of the light sources 10 and the substantially whole surface of the light-reflective member 11.

Next, patterning was performed using laser abrasion by irradiating the wiring layer 60 with a laser beam 94 from a laser beam source 93 to remove the irradiated region of the wiring layer 60. This allows separate wiring layers 60 to each of which a corresponding one of the electrodes 33 of the light source 10 was electrically connected to be obtained.

Next, the light-reflective layer 16 was disposed in the third recess 6.

Finally, the light guide plate 103 was divided into 16 light-emitting regions 1 each of which includes a respective one of the light sources. The light-emitting region 1 had a rectangular shape in a top view. The upper surface 3a was formed in a square shape with the lengths in the longitudinal direction and the lateral direction of 24.3 mm and 21.5 mm, respectively.

In unit first wall portion 13 of the present example, the height h1 of the central portion 13h was set to 0.59 mm, and the height h2 of each of both end portions 13e and 13f was set to 0.593 mm. The upper surface 13a of the unit first wall portion 13 was formed into a smooth curved surface extending between both end portions 13e and 13f.

Figure 9:
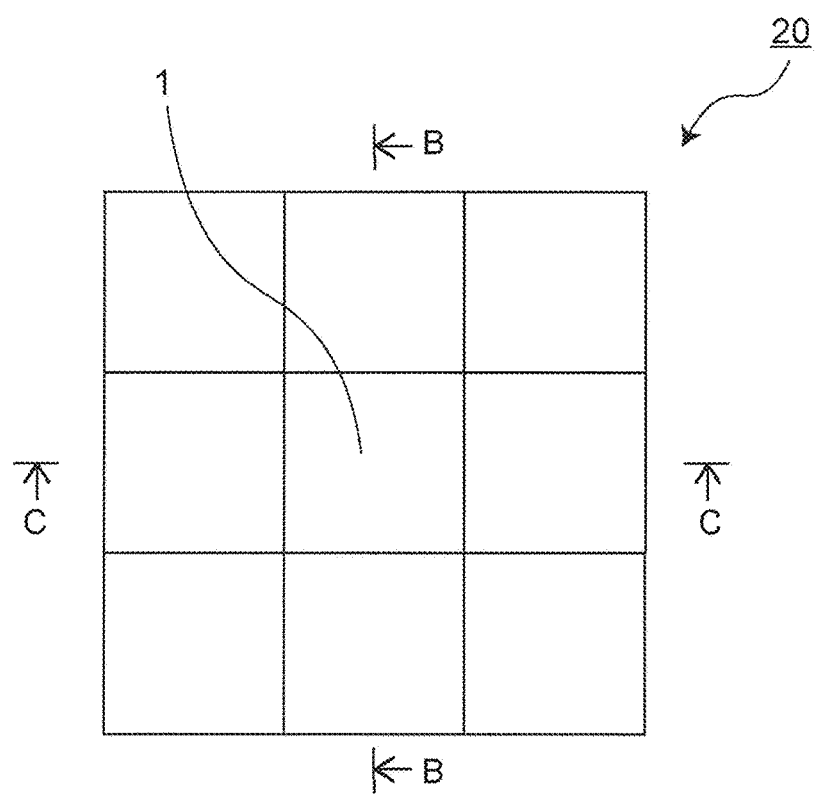
FIG. 9 is a schematic view of a surface-emitting light source according to an example and a reference example.
Figure 10A:
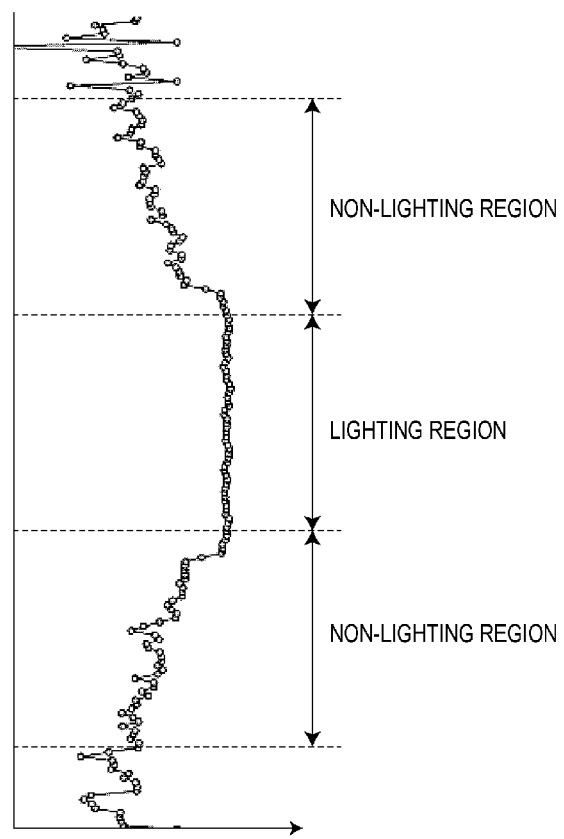
FIG. 10A is a graph illustrating a luminance taken along a line B-B of FIG. 9.
Figure 10B:
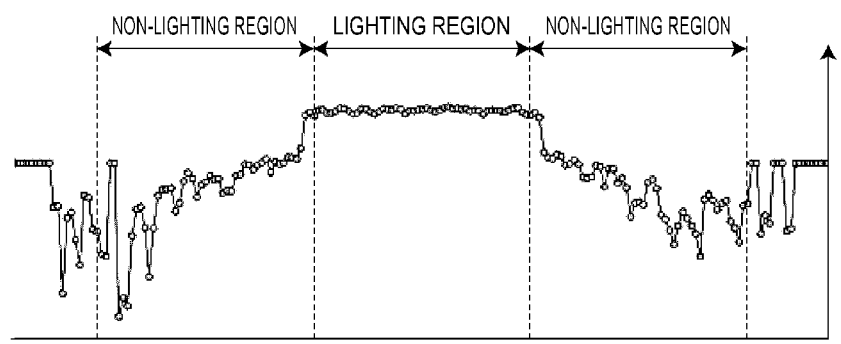
FIG. 10B is a graph illustrating a luminance taken along a line C-C of FIG. 9.

The surface-emitting light source was manufactured with the light-emitting regions 1, which were manufactured as above, disposed in a matrix of three rows and three columns as shown in FIG. 9. In the surface-emitting light source, the central light-emitting region was turned on. At this time, the luminance of the light leakage from the central light-emitting region (the lighting region) toward the adjacent light-emitting regions (the non-lighting regions) was measured. FIG. 10A is a graph illustrating a luminance taken along a line B-B of FIG. 9. FIG. 10B is a graph illustrating a luminance taken along a line C-C of FIG. 9.

Reference Example 1

Figure 11A:
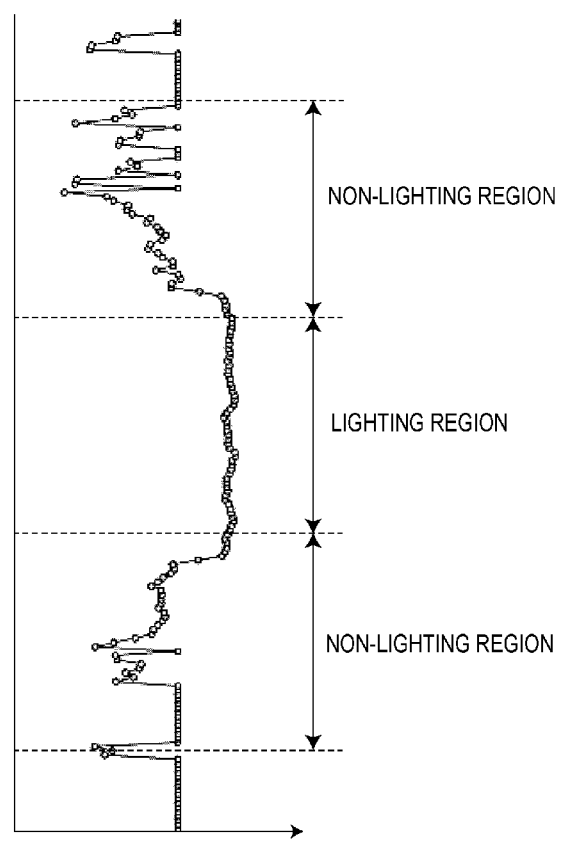
FIG. 11A is a graph illustrating a luminance taken along the line B-B of FIG. 9.
Figure 11B:
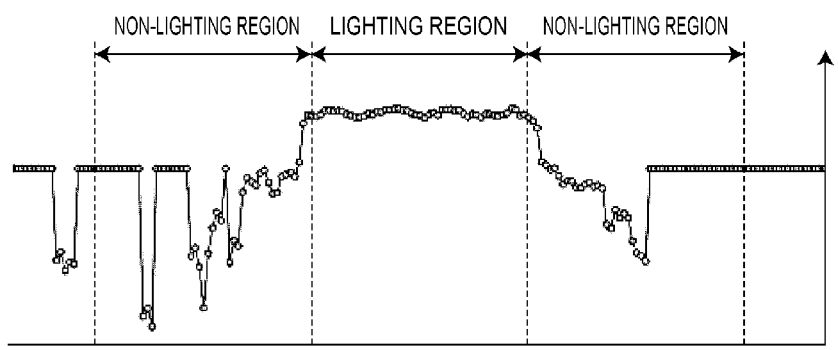
FIG. 11B is a graph illustrating a luminance taken along the line C-C of FIG. 9.

A surface-emitting light source of Reference Example 1 was manufactured in the same manner as the surface-emitting light source of Example 1, except that the height of the first wall portion and the height of the second wall portion were not changed, and both wall portions have a uniform height. In the surface-emitting light source, the central light-emitting region was turned on. The luminance of the light leakage from the central light-emitting region (the lighting region) toward the adjacent light-emitting regions (the non-lighting regions) was measured. FIG. 11A is a graph illustrating a luminance taken along the line B-B of FIG. 9. FIG. 11B is a graph illustrating a luminance taken along the line C-C of FIG. 9.

Reference Example 2

Figure 12A:
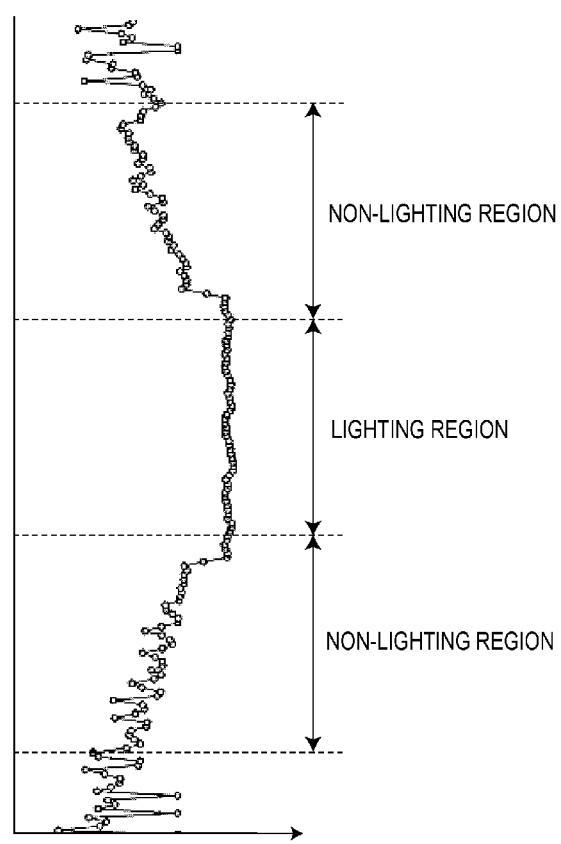
FIG. 12A is a graph illustrating a luminance taken along the line B-B of FIG. 9.
Figure 12B:
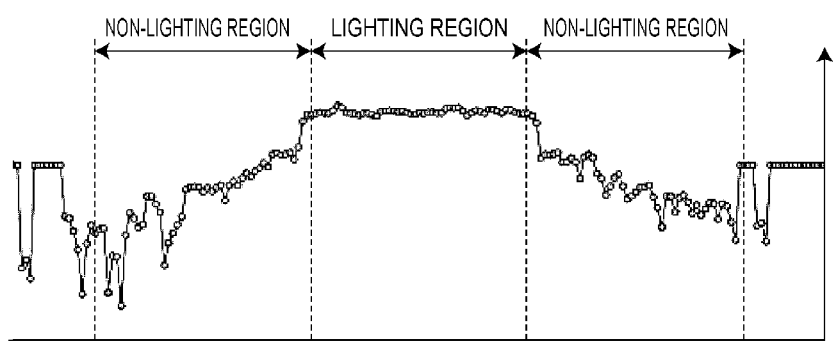
FIG. 12B is a graph illustrating a luminance taken along the line C-C of FIG. 9.

A surface-emitting light source of Reference Example 2 was manufactured in the same manner as the surface-emitting light source of Example 1, except that the second wall portion was formed to have a uniform height. In the surface-emitting light source, the central light-emitting region was turned on. The luminance of the light leakage from the central light-emitting region (the lighting region) toward the adjacent light-emitting regions (the non-lighting regions) was measured. FIG. 12A is a graph illustrating a luminance taken along the line B-B of FIG. 9. FIG. 12B is a graph illustrating a luminance taken along the line C-C of FIG. 9.

The results of Example 1, Reference Example 1, and Reference Example 2 show that when the surface-emitting light source was turned on, the luminance of the light leakage of the surface-emitting light source according to Example 1 was reduced more smoothly than the luminance of the light leakage of the surface-emitting light source according to Reference Example 1 and Reference Example 2.

I claim:

1. A surface-emitting light source comprising:
   a plurality of light-emitting regions each of which includes a plurality of light sources, wherein each of the plurality of light-emitting regions can be turned on individually,
   each of the plurality of light-emitting regions being adjacent to each other,
   each of the plurality of the light-emitting regions including
      a light-guide portion that covers the plurality of light sources, and
      a light-reflective member disposed below the light-guide portion,
   wherein the light-reflective member has a first wall portion disposed at an outer periphery of each of the plurality of light-emitting regions,
   wherein the first wall portion comprises one or more unit first wall portions each of which corresponds to a respective one of the plurality of light sources located at the outer periphery of each of the plurality of light-emitting regions,
   wherein at least one of the one or more unit first wall portions located at two adjacent light-emitting regions has a central portion having a height smaller than a height of both end portions,
   wherein the light-guide portion includes a plurality of light guide plates disposed for each light-emitting region,
   wherein a lower surface of at least one of the plurality of light guide plates includes second recesses each of which identifies a respective one of the plurality of light sources, and wherein the light-reflective member includes a second wall portion made of a light-reflective resin that is supplied in the second recesses.

2. The surface-emitting light source according to claim 1, wherein the at least one of the one or more unit first wall portions has a height reduced from the both end portions toward the central portion.

3. The surface-emitting light source according to claim 1, wherein the second wall portion includes unit second wall portions that correspond to each of the plurality of light sources, and wherein each of the unit second wall portions has a central portion having a height smaller than a height of both end portions.

4. The surface-emitting light source according to claim 1, wherein the first wall portion and the second wall portion are continuously integrated to form a wall portion.

5. The surface-emitting light source according to claim 1, wherein each of the plurality of light sources is disposed in a first recess formed on a lower surface of the light-guide portion.

6. The surface-emitting light source according to claim 5, wherein the at least one of the one or more unit first wall portions has the height at the central portion larger than a depth of the first recess.

7. The surface-emitting light source according to claim 5, wherein the light-guide portion includes, on an upper surface opposite to the lower surface, a third recess that faces the first recess.

8. The surface-emitting light source according to claim 7, wherein the central portion of the at least one of the one or more unit first wall portions has the height smaller than a distance from the lower surface of the light-guide portion to a bottom portion of the third recess.

9. The surface-emitting light source according to claim 1, wherein the plurality of light-emitting regions are disposed in a matrix.

10. The surface-emitting light source according to claim 9, wherein the plurality of light sources are disposed in a matrix.

11. The surface-emitting light source according to claim 1,
wherein the at least one of the one or more unit first wall portions includes an upper surface, and
wherein at least a portion of the upper surface is a curved surface.

12. The surface-emitting light source according to claim 11, wherein a curved surface is formed between the upper surface and a lateral surface of the at least one of the one or more unit first wall portions.

* * * * *